(12) United States Patent
Song et al.

(10) Patent No.: US 12,426,296 B2
(45) Date of Patent: Sep. 23, 2025

(54) HIGH-VOLTAGE SEMICONDUCTOR DEVICES AND METHODS OF FORMATION

(71) Applicant: Taiwan Semiconductor Manufacturing Company, Ltd., Hsinchu (TW)

(72) Inventors: Jhu-Min Song, Nantou (TW); Chien-Chih Chou, New Taipei (TW); Yu-Chang Jong, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 544 days.

(21) Appl. No.: 17/804,438

(22) Filed: May 27, 2022

(65) Prior Publication Data

US 2023/0387308 A1 Nov. 30, 2023

(51) Int. Cl.
*H10D 30/62* (2025.01)
*H10D 30/01* (2025.01)
*H10D 62/10* (2025.01)
*H10D 84/01* (2025.01)
*H10D 84/03* (2025.01)

(52) U.S. Cl.
CPC ....... *H10D 30/6211* (2025.01); *H10D 30/024* (2025.01); *H10D 30/6219* (2025.01); *H10D 62/116* (2025.01); *H10D 84/013* (2025.01); *H10D 84/0151* (2025.01); *H10D 84/0158* (2025.01); *H10D 84/038* (2025.01)

(58) Field of Classification Search
CPC ......... H01L 29/7851; H01L 21/823418; H01L 21/823431; H01L 21/823481; H01L 29/0653; H01L 29/41791; H01L 29/66795; H01L 2029/7858; H10D 84/0158; H10D 84/834; H10D 62/116; H10D 64/514; H10D 30/024; H10D 30/62; H10D 30/6211; H10D 30/6757; H10D 30/608
See application file for complete search history.

(56) References Cited

U.S. PATENT DOCUMENTS

| | | | | |
|---|---|---|---|---|
| 8,476,700 B2 * | 7/2013 | Kim | .................... | H10D 84/0142 257/330 |
| 8,552,492 B2 * | 10/2013 | Sanada | ................ | H10D 64/027 257/330 |
| 8,614,143 B2 * | 12/2013 | Kulkarni | ........... | H01L 21/76816 438/618 |
| 8,883,624 B1 | 11/2014 | Ramkumar | | |

(Continued)

FOREIGN PATENT DOCUMENTS

CN 107689372 A 2/2018
CN 114551562 A 5/2022

(Continued)

*Primary Examiner* — Eduardo A Rodela
(74) *Attorney, Agent, or Firm* — Harrity & Harrity, LLP

(57) ABSTRACT

Interlayer dielectric (ILD) layer(s) of a semiconductor device may be configured as a gate oxide for high-voltage transistors, and therefore additional process operations to deposit dedicated gate oxide layers are not needed. Moreover, additional processing operations to form the gate structures of the high-voltage fin-based PMOS transistors and high-voltage fin-based NMOS transistors are not needed in that middle end of line (MEOL process and back end of line (BEOL) processes can be used as the gate formation process of the high-voltage transistors.

19 Claims, 32 Drawing Sheets

(56) References Cited

U.S. PATENT DOCUMENTS

| | | | | |
|---|---|---|---|---|
| 9,589,954 | B2* | 3/2017 | Mitsuiki | H10D 62/116 |
| 9,960,264 | B1* | 5/2018 | Chen | H10D 30/015 |
| 10,418,459 | B2* | 9/2019 | Chen | H10D 62/307 |
| 11,271,000 | B2* | 3/2022 | Cheng | H01L 21/76227 |
| 11,950,423 | B2 | 4/2024 | Lee et al. | |
| 12,015,084 | B2* | 6/2024 | Togo | H10D 30/0227 |
| 12,068,309 | B2* | 8/2024 | Hsu | H10D 84/834 |
| 12,132,106 | B2* | 10/2024 | Li | H10D 64/516 |
| 2014/0110777 | A1* | 4/2014 | Peng | H01L 21/32115 |
| | | | | 257/330 |
| 2017/0194320 | A1* | 7/2017 | Chen | H10D 84/856 |
| 2022/0068721 | A1 | 3/2022 | Yang et al. | |
| 2022/0085011 | A1* | 3/2022 | Lee | H01L 21/76897 |

FOREIGN PATENT DOCUMENTS

| | | |
|---|---|---|
| TW | 201843812 A | 12/2018 |
| TW | 202211370 A | 3/2022 |
| TW | 202213743 A | 4/2022 |

* cited by examiner

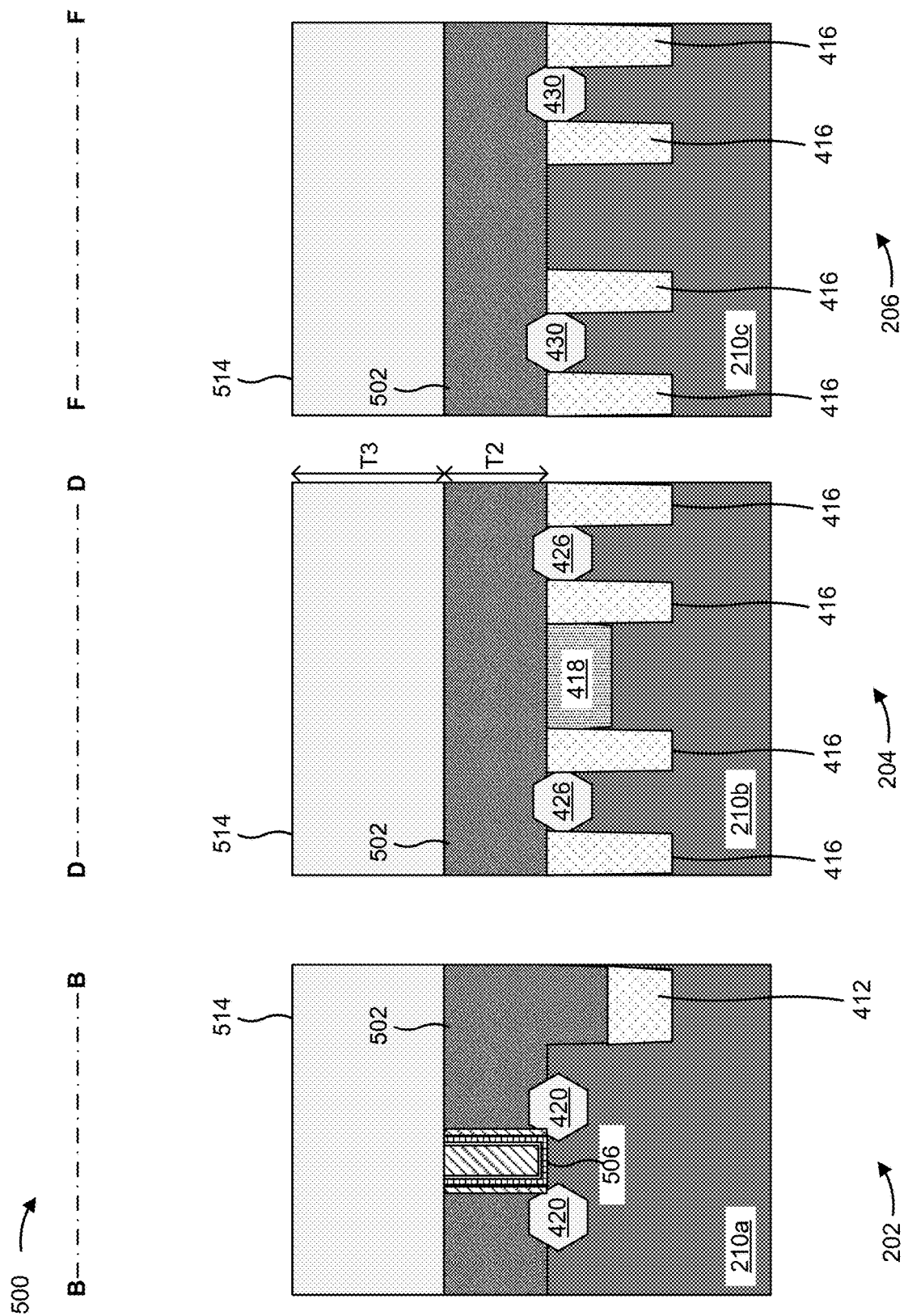

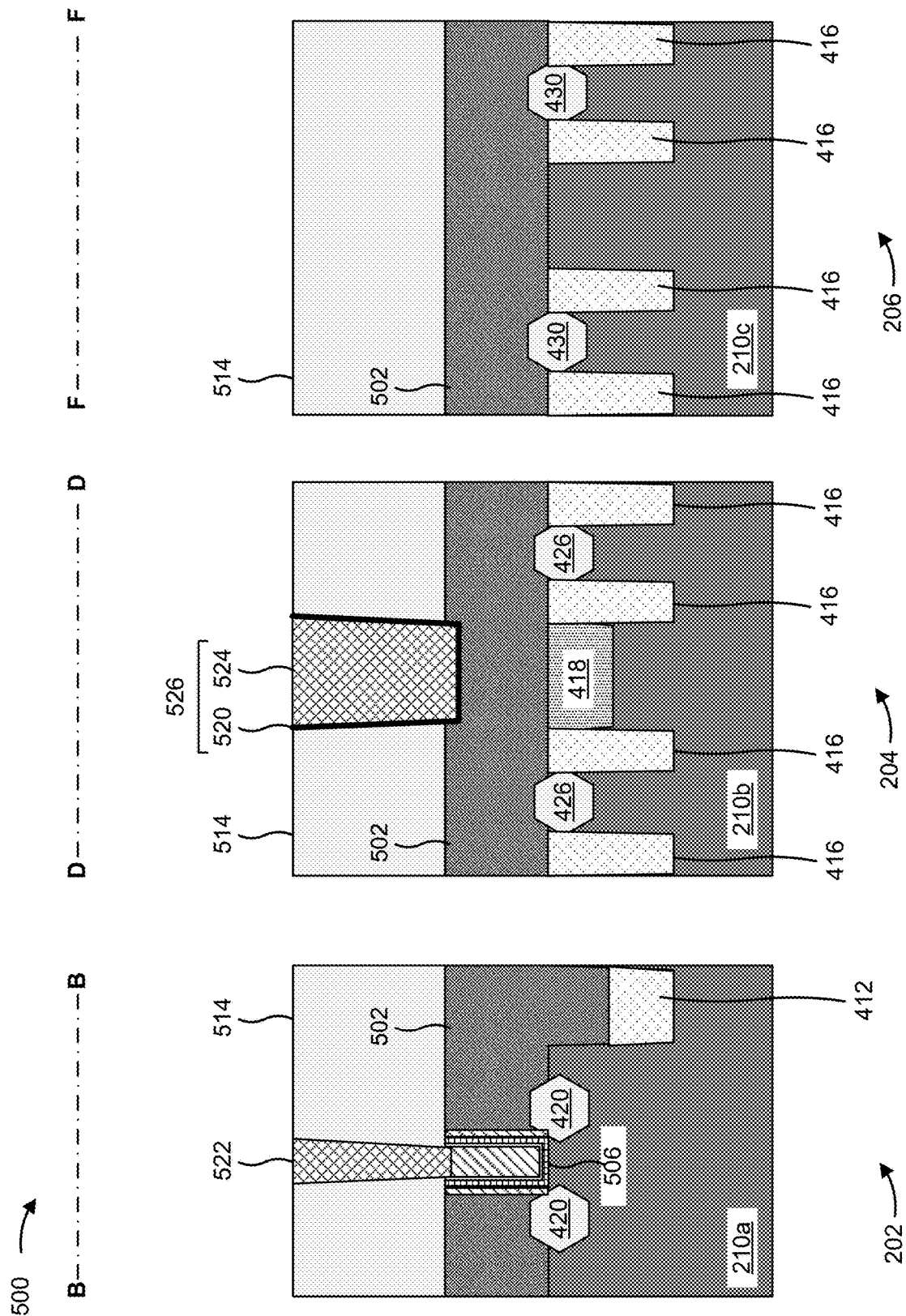

HIGH-VOLTAGE SEMICONDUCTOR DEVICES AND METHODS OF FORMATION

BACKGROUND

Fin-based transistors, such as fin field effect transistors (finFETs) and nanostructure transistors (e.g., nanowire transistors, nanosheet transistors, gate-all-around (GAA) transistors, multi-bridge channel transistors, nanoribbon transistors), are three-dimensional structures that include a channel region in a fin (or a portion thereof) that extends above a semiconductor substrate as a three-dimensional structure. A gate structure, configured to control a flow of charge carriers within the channel region, wraps around the fin of semiconductor material. As an example, in a finFET, the gate structure wraps around three sides of the fin (and thus the channel region), thereby enabling increased control over the channel region (and therefore switching of the finFET). As another example, in a nanostructure transistor, the gate structure wraps around a plurality of channel regions in a fin structure such that the gate structure surrounds each of the plurality of channel regions. Source/drain regions (e.g., epitaxial regions) are located on opposing sides of the gate structure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3E, 4A-4E, 5A-5I, and 6A-6E are diagrams of one or more example implementations described herein.

DETAILED DESCRIPTION

Figure 1:
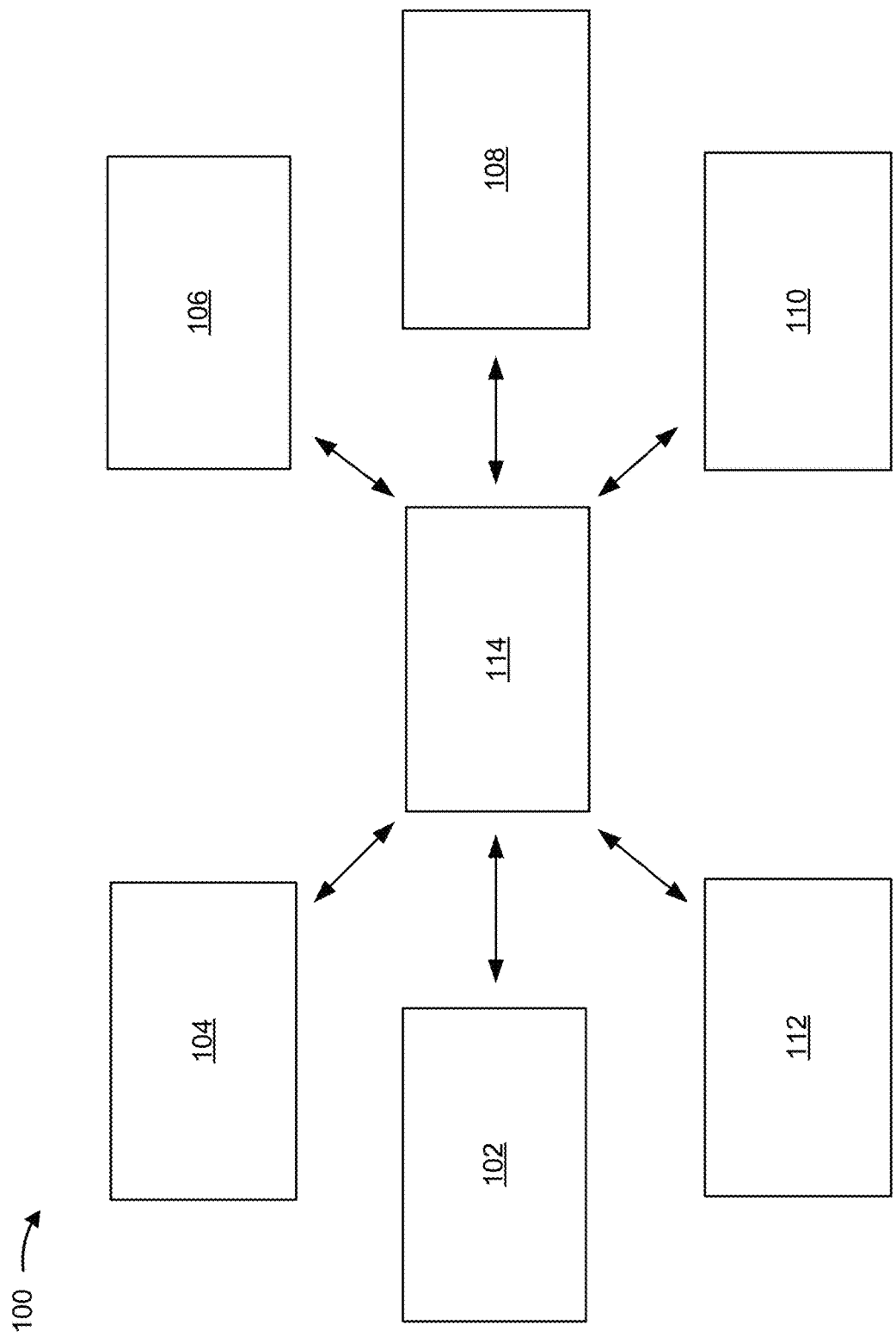
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A gate structure of a transistor (e.g., a planar transistor, a fin field effect transistor (finFET), a nanostructure transistor) may control the flow of electrons through a channel between the source/drain regions of the transistor. Source/drain region(s) may refer to a source or a drain, individually or collectively dependent upon the context. The gate voltage that is needed to selectively form the channel (which enables the transistor to be selectively turned on or off) may be referred to as a threshold voltage ($V_t$). The threshold voltage of a transistor may depend on the work function of the semiconductor material(s) in which the channel is to be selectively formed. The work function of a semiconductor material may refer to the energy difference between the Fermi energy ($E_F$) of the semiconductor material and the vacuum level of the semiconductor material. The work function may correspond to the minimum amount of energy that is needed to remove an electron from the semiconductor material to another material.

Dopants may change the work function of a semiconductor material by changing the Fermi energy level of the semiconductor material. For example, the Fermi energy level for p-doped silicon (Si) may be closer to the valence band of p-doped silicon relative to the Fermi energy level of intrinsic silicon. As another example, the Fermi energy level for n-doped silicon may be closer to the conductive band of n-doped silicon relative to the Fermi energy level of intrinsic silicon. Thus, as work function is dependent upon Fermi energy level, the different Fermi energy levels for p-doped silicon and n-doped silicon may result in different work functions for p-doped silicon and n-doped silicon.

The gate structure of a transistor may be configured to tune the work function for a transistor for a particular type of dopant that is used to dope the substrate in which the transistor is formed. This may be referred to as work function tuning. Work function tuning involves the use of particular types of materials (referred to as work function metals or work function materials) and/or material configurations for the gate structure of a transistor to achieve a desired threshold voltage for the transistor. Work function tuning may be performed for different types of transistors, where different work function materials and/or work function material configurations may be used for p-type metal oxide semiconductor (PMOS) transistors and n-type metal oxide semiconductor (NMOS) transistors to achieve appropriate and/or desirable work functions for these types of transistors.

For high-voltage devices, a larger gate oxide layer may be included to provide increased dielectric insulation between the gate structure and a channel region in a substrate of a transistor. The increased size of the gate oxide layer may result in reduced area between the gate oxide layer and the back end of line (BEOL) layer above the transistor for formation of work function materials and for the gate of the transistor. The reduced area between the gate oxide layer and the BEOL layer may result in a reduced break down voltage for the gate structure, which may increase the likelihood of gate leakage and/or failure of the transistor.

Some implementations described herein provide gate structures for high-voltage PMOS transistors and NMOS transistors (e.g., high-voltage fin-based PMOS transistors and high-voltage fin-based NMOS transistors). In some implementations, portions of one or more interlayer dielectric (ILD) layers between a channel region of a fin-based transistor in a substrate and gate contact of the fin-based transistor or a BEOL layer above the substrate are configured as the gate oxide for the fin-based transistor. For a high-voltage fin-based PMOS transistor, a gate contact (referred to as a metal on poly or MP) may include one or more liners that are configured as work function layers for the high-voltage fin-based PMOS transistor. The gate contact functions as the gate structure for the fin-based PMOS transistor, and the work function layers are included to tune the work function of the high-voltage fin-based PMOS transistor. For a high-voltage fin-based NMOS transistor, a BEOL layer (e.g., an Ml BEOL layer) may include one or more liners that are configured as work function layers for the high-voltage fin-based NMOS transistor. The BEOL layer functions as the gate structure for the high-voltage fin-based NMOS transistor, and the work function layers are included to tune the work function for the high-voltage fin-based NMOS transistor.

In this way, ILD layer(s) of a semiconductor device are configured as the gate oxide for high-voltage fin-based PMOS transistors and high-voltage fin-based NMOS transistors, and therefore additional process operations to deposit dedicated gate oxide layers are not needed. Moreover, additional processing operations to form the gate structures of the high-voltage fin-based PMOS transistors and high-voltage fin-based NMOS transistors are not needed in that the gate contact (MP) process and BEOL processes can be used as the gate formation process of the high-voltage fin-based PMOS transistors and high-voltage fin-based NMOS transistors. These process optimizations reduce semiconductor device processing complexity and cost in that fewer processing steps are needed to form the high-voltage fin-based PMOS transistors and high-voltage fin-based NMOS transistors of the semiconductor device. Moreover, using the ILD layer(s) as the gate oxide enables the gate oxide to be formed to a greater thickness without thinning the ILD layer(s). This provides ILD layer(s) of sufficient thickness, which provides sufficient gate isolation with minimal impact to breakdown voltage. This may reduce gate leakage and/or may increase yield for high-voltage fin-based PMOS transistors and high-voltage fin-based NMOS transistors, among other examples.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epitaxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semiconductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unexposed portions of a photoresist layer through the use of a chemical developer.

The etch tool 108 is a semiconductor processing tool that is capable of etching various types of materials of a substrate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planarization tool 110 may include a chemical mechanical planarization (CMP) tool and/or another type of planarization tool that polishes or planarizes a layer or surface of deposited or plated material. The planarization tool 110 may polish or planarize a surface of a semiconductor device with a combination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a fin structure extending above a substrate; may form a first source/drain region and a second source/drain region, both disposed on the fin structure; may form a gate shallow trench isolation (STI) region in the fin structure between the first source/drain region and the second source/drain region; may form an ILD layer over the fin structure where a portion of the ILD layer is on the gate STI region; and/or may form a metal gate structure over the portion of the ILD layer that is on the gate STI region, among other examples.

As another example, one or more of the semiconductor processing tools 102-112 and/or the wafer/die transport tool 114 may form a fin structure extending above a substrate; may form a first source/drain region and a second source/drain region, both disposed on the fin structure; may form a first ILD layer over the fin structure; may form a second portion of a second ILD layer, where a first portion of the first ILD layer is between a second portion of the second ILD layer and a third portion of the fin structure that is between the first source/drain region and the second source/drain region, and where the first portion is directly on the third portion of the fin structure; and/or may form a metal gate structure on the second portion of the second ILD layer, among other examples.

As another example, one or more of the semiconductor processing tools 102-112 and/or the wafer/die transport tool 114 may form a first fin structure in a PMOS region of a semiconductor device; may form a second fin structure in an NMOS region of the semiconductor device; may form a first plurality of source/drain regions on the first fin structure in the PMOS region; may form a second plurality of source/drain regions on the second fin structure in the NMOS region; may form a gate STI region in the first fin structure between the first plurality of source/drain regions in the PMOS region; may form a first ILD layer on the first fin structure, on the gate STI region, and on the second fin structure; may form a second ILD layer on the first ILD layer; may form, in the PMOS region, a first metal gate structure above the gate STI region and in the second ILD layer; and/or may form, in the NMOS region, a second metal gate structure (626) on the second ILD layer, among other examples.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
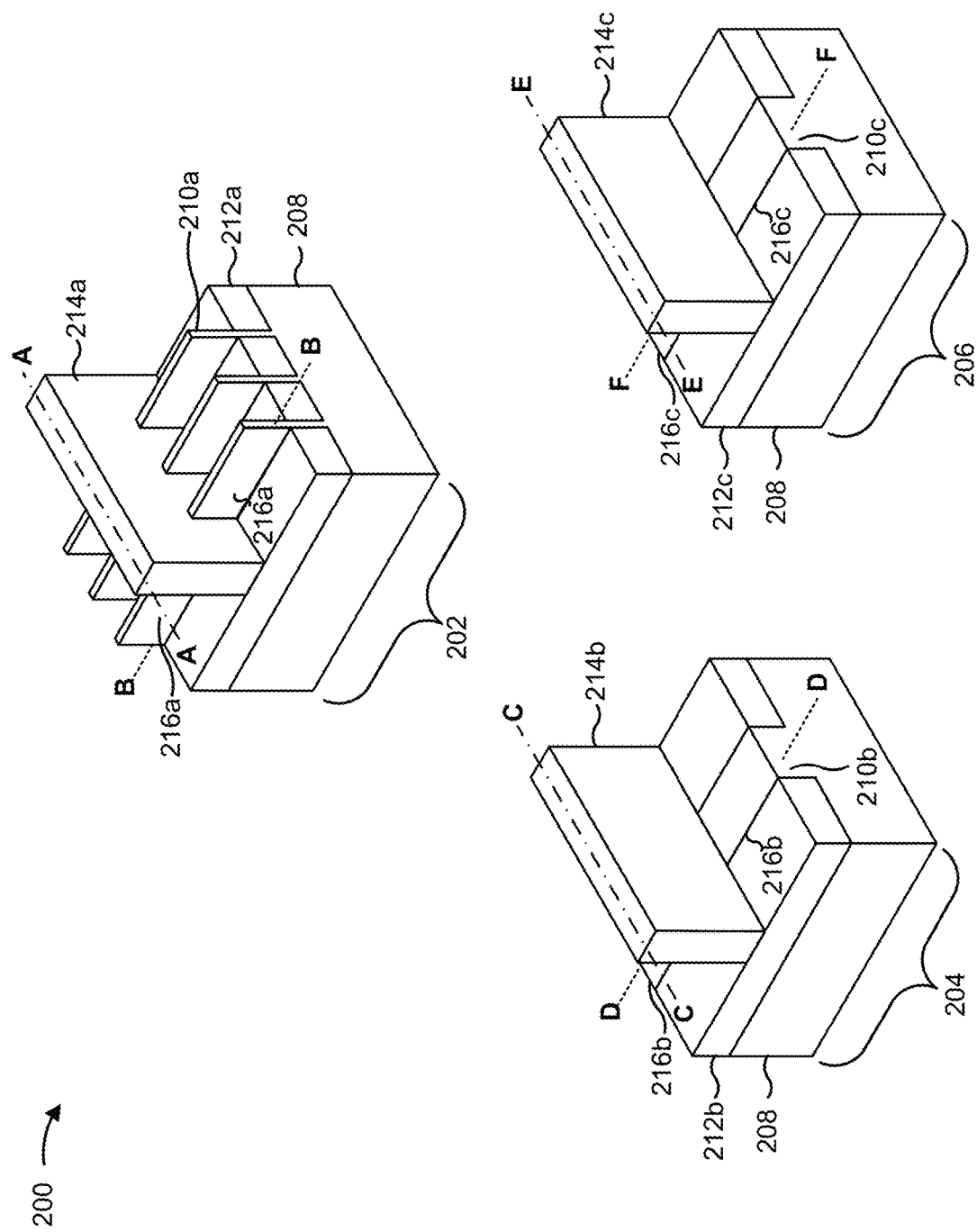
FIG. 2 is a diagram of example regions of a semiconductor device described herein.

FIG. 2 is a diagram of example regions of a semiconductor device 200 described herein. The semiconductor device 200 may include a semiconductor wafer, a semiconductor die, a semiconductor chip, and/or another type of electronic semiconductor device. The example regions of the semiconductor device 200 illustrated in FIG. 2 include a low-voltage region 202, a high-voltage PMOS region 204, and a high-voltage NMOS region 206. While the example regions of the semiconductor device 200 illustrated in FIG. 2 may be formed in different regions on a same substrate 208, other examples may include two or more of the example regions of the semiconductor device 200 in different substrates 208. Additionally and/or alternatively, the semiconductor device 200 may include fewer types of regions than illustrated in FIG. 2. For example, the semiconductor device 200 may include only the high-voltage PMOS region 204 and the high-voltage NMOS region 206, only the high-voltage PMOS region 204, or only the high-voltage NMOS region 206, among other examples. FIGS. 3A-8B are schematic cross-sectional views of various portions of the example regions of the semiconductor device 200 illustrated in FIG. 2, and correspond to various processing stages of forming fin-based transistors in example regions of the semiconductor device 200.

A high-voltage fin-based transistor (e.g., formed in the high-voltage PMOS region 204 and the high-voltage NMOS region 206) may include a fin-based transistor that is configured to operate based on a relatively gate voltage (e.g., relative to a fin-based transistor in the low-voltage region 202). As an example, the high-voltage fin-based transistors in the high-voltage PMOS region 204 and the high-voltage NMOS region 206 may operate based on a gate voltage that is included in a range of approximately 20 volts to approximately 35 volts. However, other values for the range are within the scope of the present disclosure. Accordingly, the high-voltage fin-based transistors in the high-voltage PMOS region 204 and the high-voltage NMOS region 206 may be referred to as high gate voltage fin-based transistors. In some implementations, the high-voltage fin-based transistors in the high-voltage PMOS region 204 and the high-voltage NMOS region 206 may also operate based on a relatively high drain voltage, in which case these high-voltage fin-based transistors may be referred to as high drain voltage fin-based transistors.

Low-voltage fin-based transistors may be used in applications such as logic circuits (e.g., processors), memory (e.g., static random access memory (SRAM), and/or input/output (I/O) circuits, among other examples. High-voltage fin-based transistors may be used in applications such as integrated circuit (IC) drivers, power ICs, image sensors, power management, display driver ICs (DDICs), bipolar complementary metal oxide semiconductor (CMOS) diffused metal oxide semiconductor (DMOS) (BCD) ICs, and/or image signal processing (ISP) ICs, among other examples.

The substrate 208 includes a silicon (Si) substrate, a substrate formed of a material including silicon, a III-V compound semiconductor material substrate such as gallium arsenide (GaAs), a silicon on insulator (SOI) substrate, a germanium substrate (Ge), a silicon germanium (SiGe) substrate, or another type of semiconductor substrate. The substrate 208 may be formed from a wafer or round/circular substrate having an approximately 200 mm diameter, an approximately 300 mm diameter, or another diameter, such as 450 mm, among other examples. The wafer may be cut or diced into individual dies such that the resulting substrate 208 of the semiconductor device 200 may be any polygonal, square, rectangular, curved, or otherwise non-circular.

Fin structures are included above (and extend above) the substrate 208 in the low-voltage region 202, in the high-voltage PMOS region 204, and in the high-voltage NMOS region 206. In particular, fin structures 210a are included above substrate 208 in the low-voltage region 202, fin structures 210b are included above substrate 208 in the high-voltage PMOS region 204, and fin structures 210c are included above the substrate 208 in the high-voltage NMOS region 206. One or more of the fin structures 210a-210c may provide an active region where one or more devices (e.g., fin-based transistors) are formed. In some implementations, one or more of the fin structures 210a-210c include silicon materials or another elementary semiconductor material, such as germanium, or a compound semiconductor material such as silicon carbide, gallium arsenic, gallium phosphide, indium phosphide, indium arsenide, and/or indium antimonide. In some implementations, one or more of the fin structures 210a-210c may include an alloy semiconductor material such as silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or a combination thereof.

In some implementations, one or more of the fin structures 210a-210c may be doped using n-type and/or p-type dopants. For example, one or more of the fin structures 210b may be doped using one or more types of dopants to enable the formation of high-voltage fin-based PMOS transistors in the high-voltage PMOS region 204. As another example, one or more of the fin structures 210c may be doped using one or more types of dopants to enable the formation of high-voltage fin-based NMOS transistors in the high-voltage NMOS region 206.

The fin structures 210a-210c are fabricated by suitable semiconductor process techniques, such as masking, photolithography, and/or etch processes, among other examples. As an example, the fin structures 210a-210c may be formed by etching a portion of the substrate 208 away to form recesses in the substrate 208. The recesses may then be filled with isolating material that is recessed or etched back to form STI regions 212a above the substrate 208 and between adjacent fin structures 210a, STI regions 212b above the substrate 208 and between adjacent fin structures 210b, and STI regions 212c above the substrate 208 and between adjacent fin structures 210c. Other fabrication techniques for the STI regions 212a-212c and/or the fin structures 210a-210c may be used.

The STI regions 212a-212c may electrically isolate adjacent active areas in the fin structures 210a-210c. The STI regions 212a-212c may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The STI regions 212a-212c may include a multi-layer structure, for example, having one or more liner layers.

In the low-voltage region 202, the fin structures 210a may extend above the top surfaces of the STI regions 212a such that the tops of the fin structures 210a and at least a portion of the sidewalls of the fin structures 210a are exposed above the STI regions 212a. In the high-voltage PMOS region 204, the tops of the fin structures 210b and the top surfaces of the STI regions 212b may be at an approximately equal height in the semiconductor device 200. Similarly, the tops of the fin structures 210c and the top surfaces of the STI regions 212c may be at an approximately equal height in the high-voltage NMOS region 206 of the semiconductor device 200.

Gate structures 214a are included in the low-voltage region 202, gate structures 214b are included in the high-voltage PMOS region 204, and gate structures 214c are included in the high-voltage NMOS region 206. In the low-voltage region 202, gate structures 214a may be included over the fin structures 210a and may be positioned approximately perpendicular to the fin structures 210a. The gate structures 214a may wrap around the fin structures 210a on at least three sides (e.g., the top and two sidewalls) of the fin structures 210a, as shown in FIG. 2. In some implementations, the gate structures 214a in the low-voltage region 202 may be formed as dummy gate structures or holder gate structures, and final metal gate structures may be subsequently formed in the place of the gate structures 214a after one or more processing operations in the low-voltage region 202. The term, "dummy", as described here, refers to a sacrificial structure which will be removed in a later stage and will be replaced with another structure, such as a high dielectric constant (high-k) dielectric and metal gate structure in a replacement gate process. The replacement gate process refers to manufacturing a gate structure at a later stage of the overall gate manufacturing process.

In the high-voltage PMOS region 204, the gate structures 214b may be included above the fin structures 210b. Here, the gate structures 214b may not wrap around the fin structures 210b and instead may be located over only the tops of the fin structures 210b (e.g., and not over the sidewalls of the fin structures 210b). As described herein, dedicated structures in the high-voltage PMOS region 204 may be omitted for the gate structures 214b. Instead, one or more middle end of line (MEOL) structures (e.g., gate contacts) may be configured as the gate structures 214b for the high-voltage fin-based PMOS transistors in the high-voltage PMOS region 204. This enables one or more ILD layers between the gate structures 214b and the fin structures 210b to be used as the gate oxide layer(s) for the high-voltage fin-based PMOS transistors in the high-voltage PMOS region 204. This reduces process complexity for forming the high-voltage fin-based PMOS transistors in the high-voltage PMOS region 204 and provides increased gate oxide isolation without negatively affecting the thickness of the ILD layer(s).

In the high-voltage NMOS region 206, the gate structures 214c may be included above the fin structures 210c. Here, the gate structures 214c may not wrap around the fin structures 210c and instead may be located over only the tops of the fin structures 210c (e.g., and not over the sidewalls of the fin structures 210c). As described herein, dedicated structures in the high-voltage NMOS region 206 may be omitted for the gate structures 214c. Instead, one or more BEOL structures (e.g., BEOL vias and/or BEOL metallization layers) may be configured as the gate structures 214c for the high-voltage fin-based NMOS transistors in the high-voltage NMOS region 206. This enables one or more ILD layers between the gate structures 214c and the fin structures 210c to be used as the gate oxide layer(s) for the high-voltage fin-based NMOS transistors in the high-voltage NMOS region 206. This reduces process complexity for forming the high-voltage fin-based NMOS transistors in the high-voltage NMOS region 206 and provides increased gate oxide isolation without negatively affecting the thickness of the ILD layer(s).

Source/drain areas are disposed in opposing regions of one or more of the fin structures 210a-210c with respect to one or more of the gate structures 214a-214c. For example, source/drain areas 216a may be disposed in a fin structure 210a on opposing sides of a gate structure 214a in the low-voltage region 202. As another example, source/drain areas 216b may be disposed in a fin structure 210b on opposing sides of a gate structure 214b in the high-voltage PMOS region 204. As another example, source/drain areas 216c may be disposed in a fin structure 210c on opposing sides of a gate structure 214c in the high-voltage NMOS region 206.

The source/drain areas 216a-216c include areas in which source/drain regions of the fin-based transistors of the semiconductor device 200 are formed. The source/drain regions may include areas of epitaxially grown silicon (Si). In the high-voltage PMOS region 204, the source/drain regions may be doped with a p-type material such as boron (B) or germanium (Ge), among other examples. Accordingly, the high-voltage PMOS region 204 includes high-voltage fin-based PMOS transistors that include p-type source/drain regions. In the high-voltage NMOS region 206, The source/drain regions may be doped with an n-type material such as phosphorous (P) or arsenic (As), among other examples. Accordingly, the high-voltage NMOS region 206 includes high-voltage fin-based NMOS transistors that include n-type source/drain regions.

Some source/drain regions may be shared between various transistors in one or more of the low-voltage region 202, the high-voltage PMOS region 204, and/or the high-voltage NMOS region 206. In some implementations, various ones of the source/drain regions may be connected or coupled together such that fin-based transistors in the semiconductor device 200 are implemented as two functional transistors. For example, if neighboring (e.g., as opposed to opposing) source/drain regions are electrically connected, such as through coalescing the regions by epitaxial growth (e.g., neighboring source/drain regions, as opposed to on opposing sides of a gate structure, being coalesced), two functional transistors may be implemented. Other configurations in other examples may implement other numbers of functional transistors.

FIG. 2 further illustrates reference cross-sections that are used in later figures, including FIGS. 3A-8B. Cross-section A-A is in a plane along a gate structure 214a in the low-voltage region 202, and is perpendicular to the fin structures 210a. Cross-section B-B is in a plane perpendicular to cross-section A-A, and is along a fin structure 210a. Cross-section C-C is in a plane along a gate structure 214b in the high-voltage PMOS region 204, and is perpendicular to the fin structures 210b. Cross-section D-D is in a plane perpendicular to cross-section C-C, and is along a fin structure 210b. Cross-section E-E is in a plane along a gate structure 214c in the high-voltage NMOS region 206, and is perpendicular to the fin structures 210c. Cross-section F-F is in a plane perpendicular to cross-section E-E, and is along a fin structure 210c. Subsequent figures refer to these reference cross-sections for clarity. In some figures, some reference numbers of components or features illustrated therein may be omitted to avoid obscuring other components or features for ease of depicting the figures.

As indicated above, FIG. 2 is provided as an example. Other examples may differ from what is described with regard to FIG. 2.

FIGS. 3A-3E are diagrams of an example implementation 300 described herein. The example implementation 300 includes an example of forming fin structures 210a for low-voltage fin-based transistors in the low-voltage region 202, fin structures 210b for high-voltage fin-based PMOS transistors in the high-voltage PMOS region 204, and fin structures 210c for high-voltage fin-based NMOS transistors in the high-voltage NMOS region 206 of the semiconductor device 200. FIGS. 3A-3D are illustrated from the perspective of the cross-sectional plane A-A in FIG. 2 for the low-voltage region 202, from the perspective of the cross-sectional plane C-C in FIG. 2 for the high-voltage PMOS region 204, and from the perspective of the cross-sectional plane E-E in FIG. 2 for the high-voltage NMOS region 206.

Figure 3A:
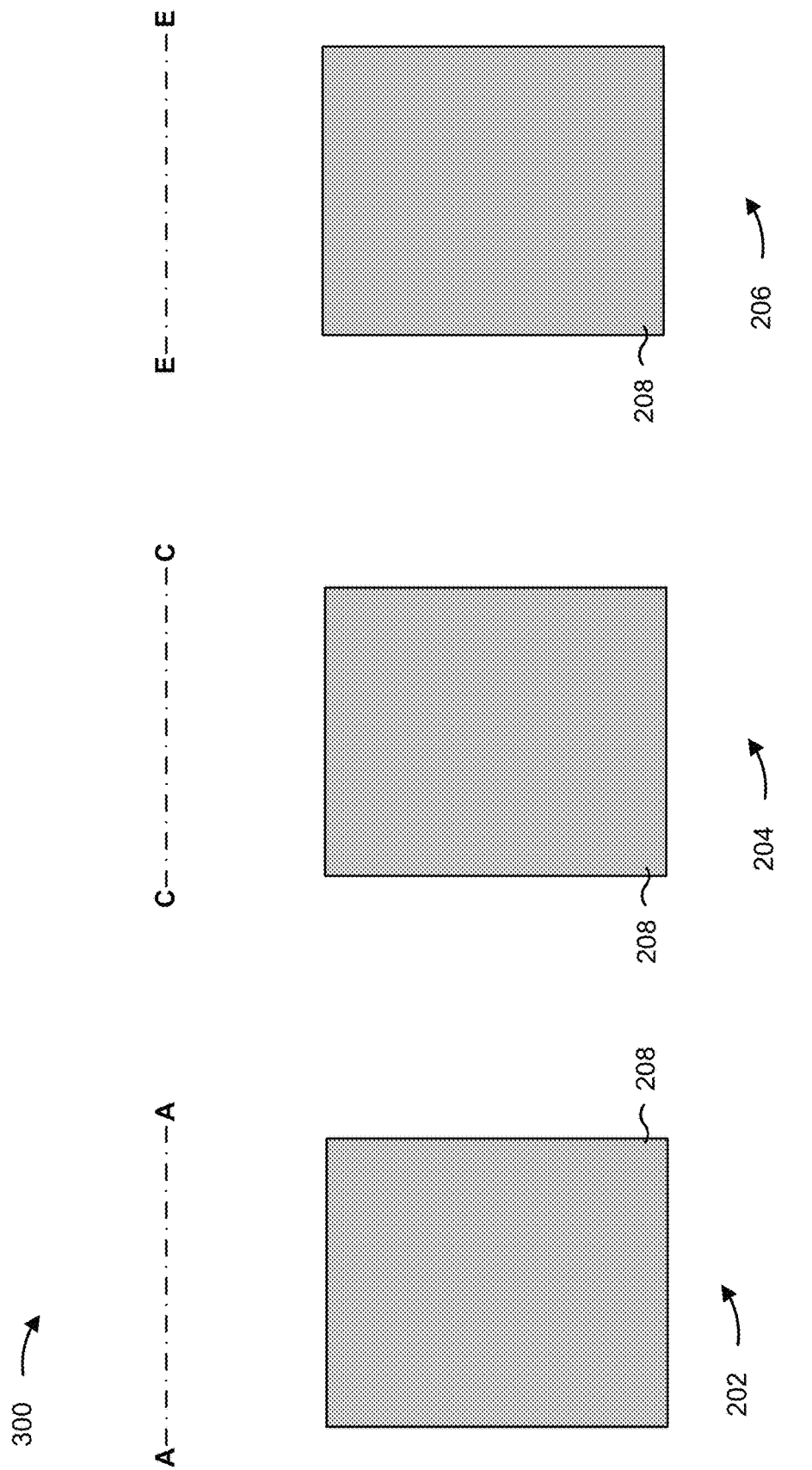

Turning to FIG. 3A, the example implementation 300 includes semiconductor processing operations relating to the substrate 208 in and/or on which low-voltage fin-based transistors are formed in the low-voltage region 202, high-voltage fin-based PMOS transistors are formed in the high-voltage PMOS region 204, and high-voltage fin-based NMOS transistors are formed in the high-voltage NMOS region 206.

Figure 3B:
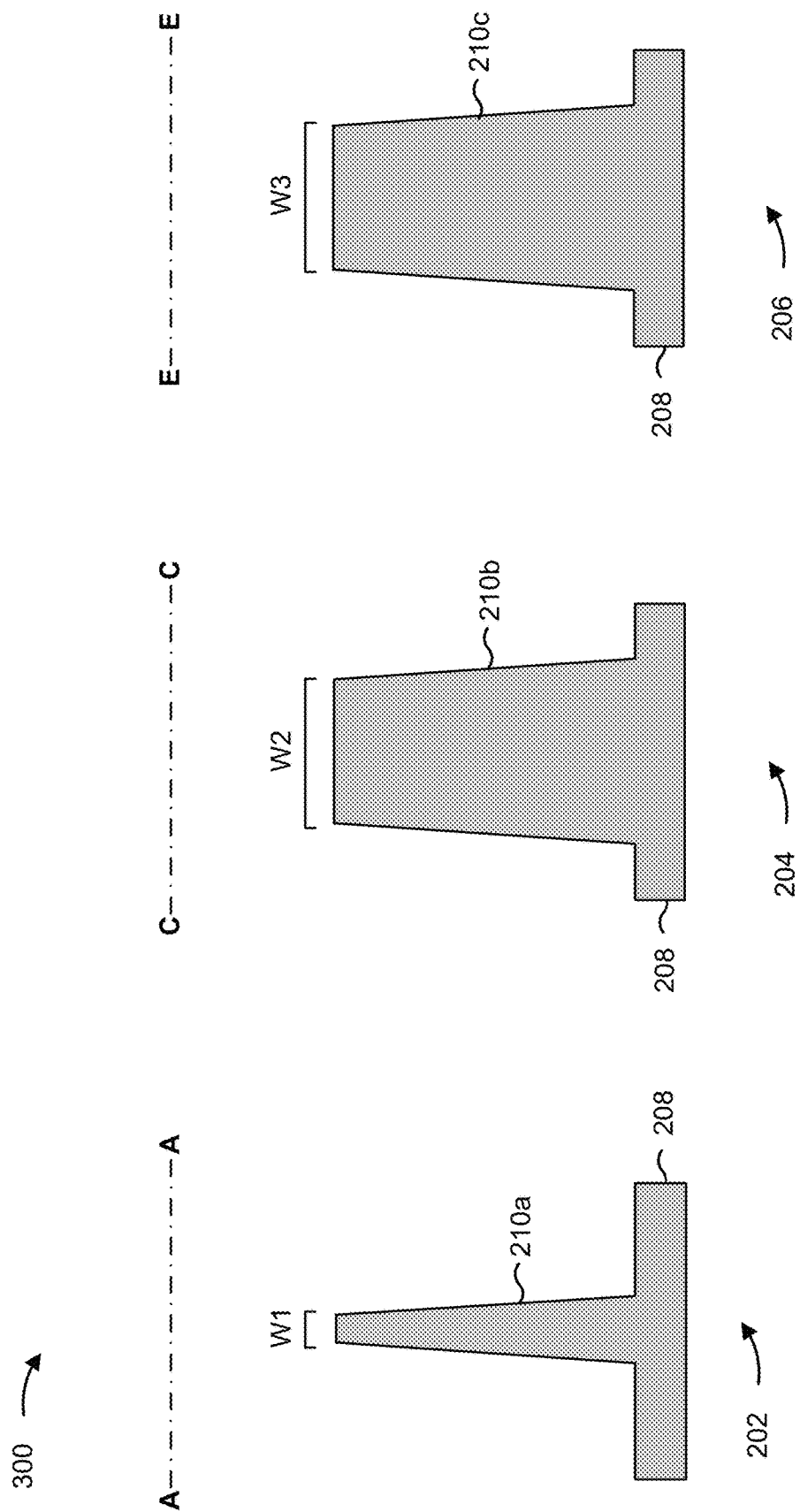

As shown in FIG. 3B, fin structures 210a-210c are formed in the substrate 208 in the low-voltage region 202, in the high-voltage PMOS region 204, and in the high-voltage NMOS region 206. In particular, one or more fin structures 210a are formed in the substrate 208 in low-voltage region 202, one or more fin structures 210b are formed in the substrate 208 in the high-voltage PMOS region 204, and one or more fin structures 210c are formed in the high-voltage NMOS region 206 in the substrate 208.

In some implementations, a pattern in a photoresist layer is used to form the fin structures 210a-210c. In these implementations, the deposition tool 102 forms the photoresist layer on the substrate 208. The exposure tool 104 exposes the photoresist layer to a radiation source to pattern the photoresist layer. The developer tool 106 develops and removes portions of the photoresist layer to expose the pattern. The etch tool 108 etches into the substrate 208 to form the fin structures 210a-210c. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the fin structures 210a-210c based on a pattern. In some implementations, multiple patterning is used to form the fin structures 210, which may include double pattering, quadruple patterning, self-aligned double patterning (SADP), self-aligned quadruple pattering (SAQP), and/or another multiple pattering technique.

As further shown in FIG. 3B, the fin structures 210a may be formed to a width W1 at or near the tops of the fin structures 210a, the fin structures 210b may be formed to a width W2 at or near the tops of the fin structures 210b, and the fin structures 210c may be formed to a width W3 at or near the tops of the fin structures 210c. The widths W2 and W3 may be greater relative to the width W1 to enable the high-voltage fin-based PMOS transistors in the high-voltage PMOS region 204 and to enable the high-voltage fin-based NMOS transistors in the high-voltage NMOS region 206 to operate a greater gate voltage relative to the gate voltage of the low-voltage fin-based transistors in the low-voltage region 202. In some implementations, the width W2 and the width W3 are approximately equal. In some implementations, the width W3 is greater relative to the width W2. In some implementations, the width W2 is greater relative to the width W3.

Figure 3C:
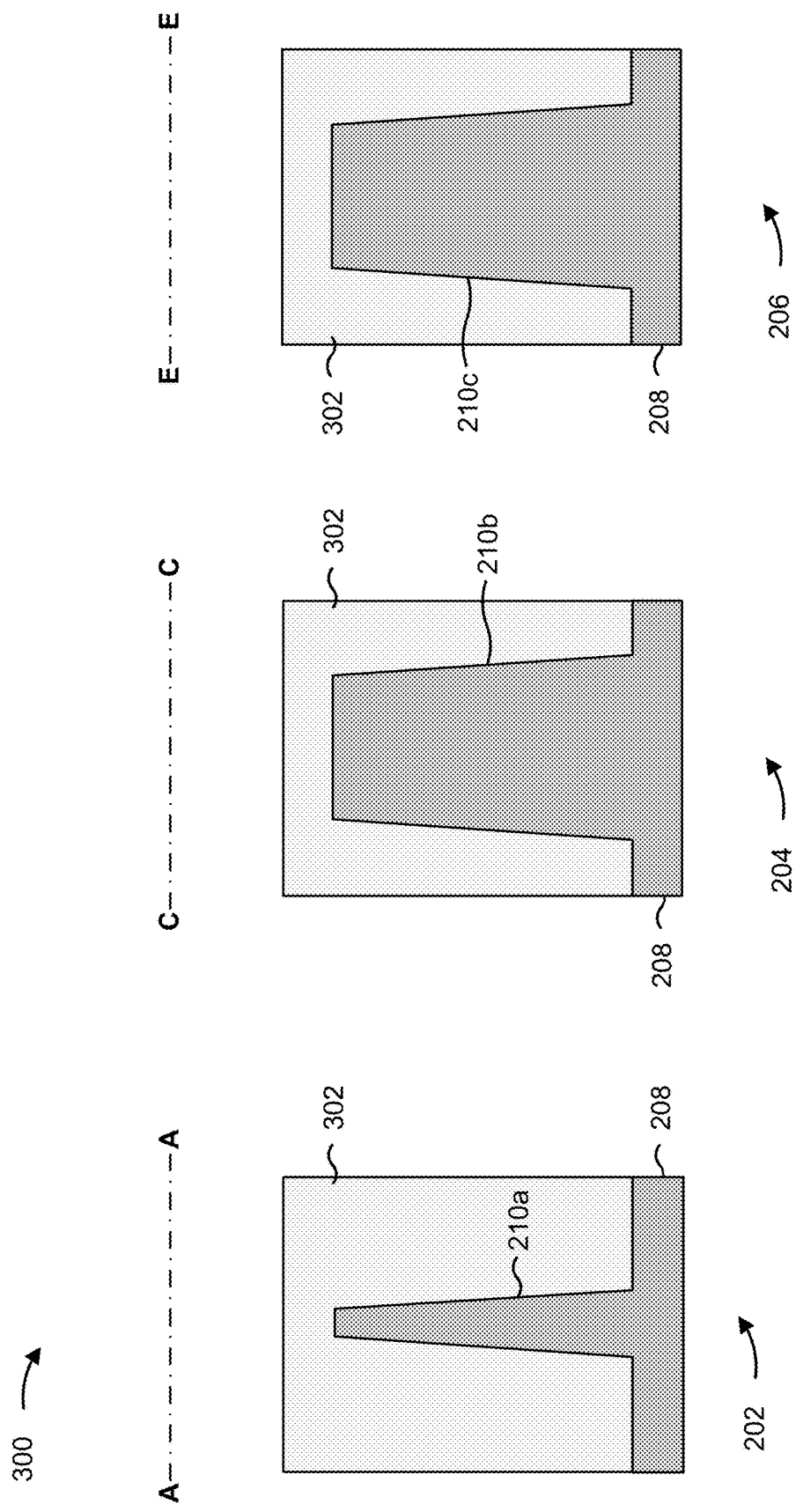

As shown in FIG. 3C, an STI layer 302 is formed over the fin structures 210a-210c and in between the fin structures 210a-210c. In particular, the STI layer 302 may be formed over the fin structures 210a and in between the fin structures 210a in the low-voltage region 202, the STI layer 302 may be formed over the fin structures 210b and in between the fin structures 210b in the high-voltage PMOS region 204, and the STI layer 302 may be formed over the fin structures 210c and in between the fin structures 210c in the high-voltage NMOS region 206. The deposition tool 102 may deposit the STI layer 302 using a CVD technique, a PVD technique, an ALD technique, a deposition technique described above in connection with FIG. 1, and/or another deposition technique. As shown in FIG. 3C, the STI layer 302 may be formed by blanked deposition to a height that is greater than the height of the fin structures 210a-210c. This increased the likelihood of fully filling the spaces between the fin structures 210a-210c to minimize void formation in the STI layer 302.

Figure 3D:
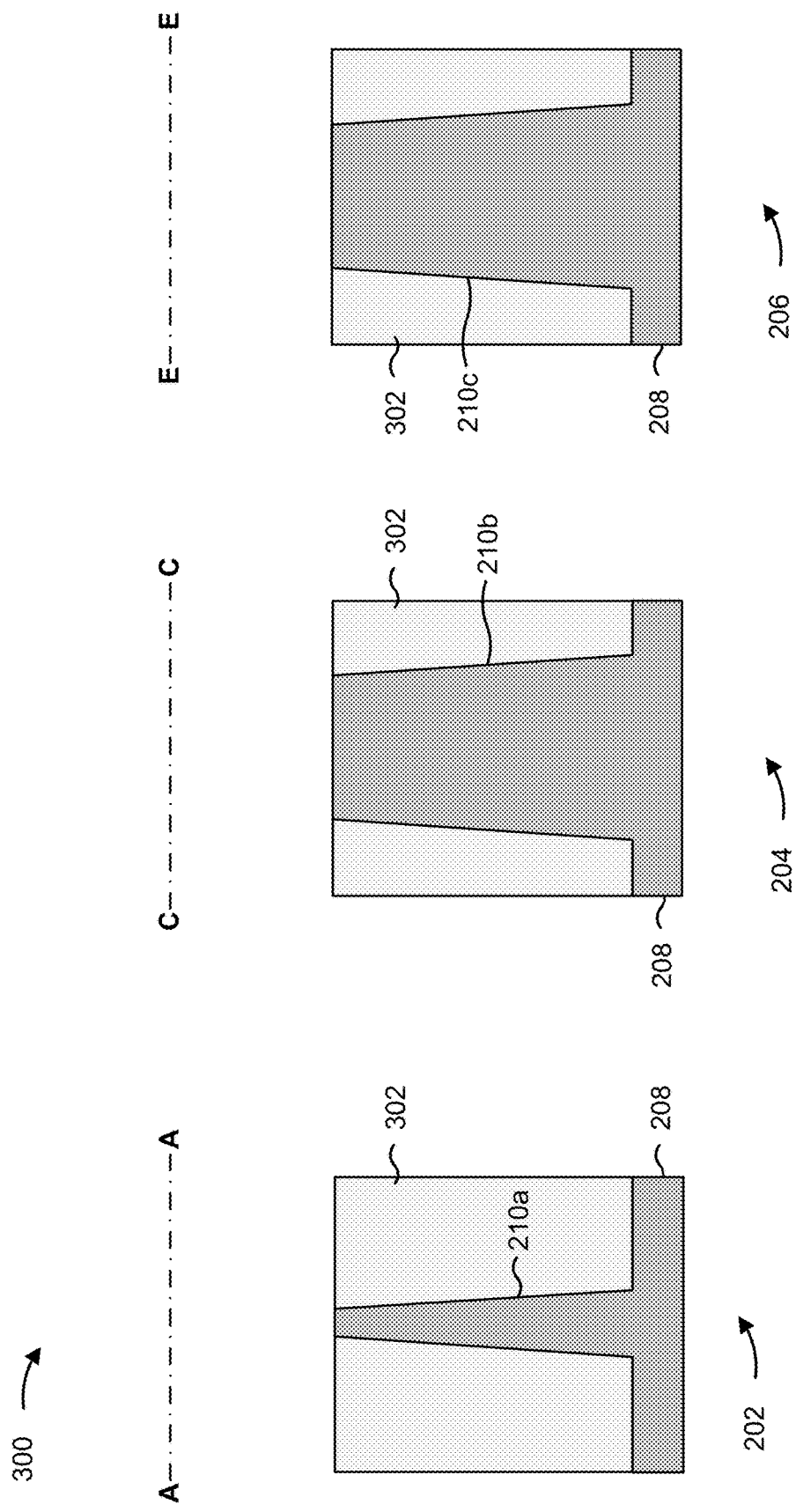

As shown in FIG. 3D, the planarization tool 110 may perform a planarization (or polishing) operation to planarize the STI layer 302 such that the top surface of the STI layer 302 is substantially flat and smooth. Moreover, the STI layer 302 may be planarized such that the top surface of the STI layer 302 and the tops of the fin structures 210a-210b are approximately the same height in the semiconductor device 200.

Figure 3E:
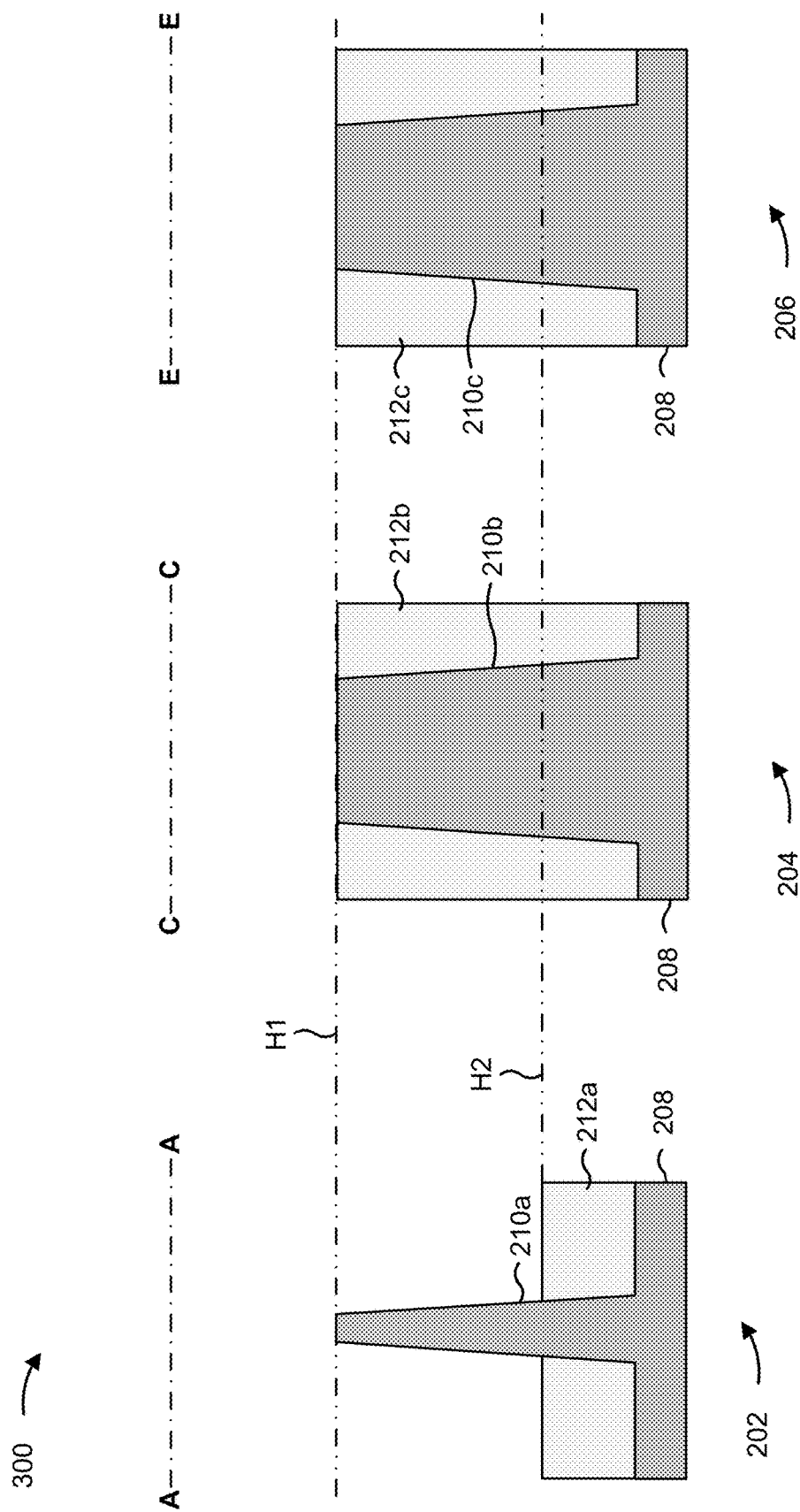

As shown in FIG. 3E, the STI layer 302 is etched in an etch back operation to expose portions of the fin structures 210a in the low-voltage region 202 to form the STI regions 212a. In the etch back operation, the etch tool 108 etches a portion of the STI layer 302 in the low-voltage region 202 using a plasma etch technique, a wet chemical etch technique, and/or another type of etch technique. The remaining portions of the STI layer 302 between the fin structures 210a include the STI regions 212a.

The STI regions 212b in the high-voltage PMOS region 204 and the STI regions 212c in the high-voltage NMOS region 206 may be masked to prevent etching of the STI regions 212b and the STI regions 212c. In this way, the STI regions 212b may remain at approximately the same height H1 as the fin structures 210b, and the STI regions 212c may remain at approximately the same height H1 as the fin structures 210b. The height H2 of the STI regions 212a, on the other hand, may lesser relative to the height H1 of the STI regions 212b and the STI regions 212c as a result of the etch back operation.

As indicated above, FIGS. 3A-3E are provided as an example. Other examples may differ from what is described with regard to FIGS. 3A-3E.

FIGS. 4A-4E are diagrams of an example implementation 400 described herein. The example implementation 400 includes an example of forming source/drain regions in the source/drain areas 216b and 216c in the high-voltage PMOS region 204 and in the high-voltage NMOS region 206, respectively, of the semiconductor device 200. FIGS. 4A-4E are illustrated from the perspective of the cross-sectional plane B-B in FIG. 2 for the low-voltage region 202, from the perspective of the cross-sectional plane D-D in FIG. 2 for the high-voltage PMOS region 204, and from the perspective of the cross-sectional plane F-F in FIG. 2 for the high-voltage NMOS region 206. In some implementations, the operations described in connection with the example implementation 400 are performed after the fin formation process described in connection with FIGS. 3A-3E.

Figure 4A:
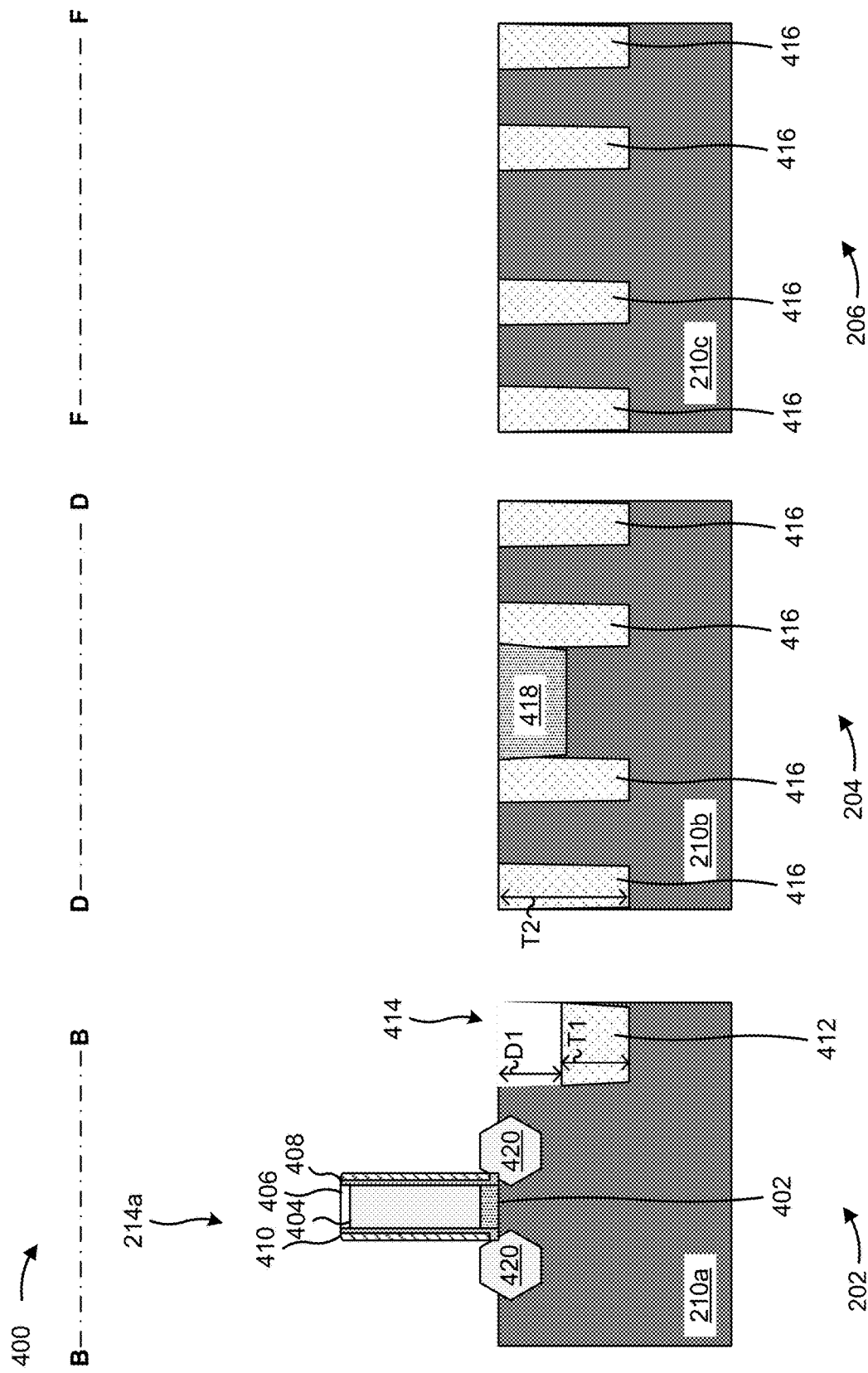

As shown in FIG. 4A, gate structures 214a are formed in the low-voltage region 202. The gate structures 214a are formed and included over the fin structures 210a, and around the sides of the fin structures 210a such that the gate structures 214a surround the fin structure 210a on at least three sides of the fin structure 210a. As described above, the gate structures 214a may be formed as dummy gate structures or as placeholders for the actual gate structures (e.g., replacement high-k gate or metal gate) that are to be formed for the low-voltage fin-based transistors included in the low-voltage region 202. The gate structures 214a may be formed as part of a replacement gate process, which enables other layers and/or structures to be formed prior to formation of the replacement gate structures.

The gate structures 214a include a gate dielectric layer 402, a gate electrode layer 404, and a hard mask layer 406. The gate dielectric layer 402 may include a gate oxide layer or a layer containing an oxide material. As an example, the gate dielectric layer 402 may be formed (e.g., by the deposition tool 102) by chemical oxidation, thermal oxidation, ALD, CVD, and/or other suitable methods. The gate electrode layer 404 may include a poly-silicon layer or other suitable materials. For example, the gate electrode layer 404 may be formed (e.g., by the deposition tool 102) by suitable deposition processes such as LPCVD or PECVD, among other examples. The hard mask layer 406 may include any material suitable to pattern the gate electrode layer 404 with particular dimensions and/or attributes. Examples include silicon nitride, silicon oxynitride, silicon carbon nitride, or a combination thereof, among other examples. The hard mask layer 406 may be deposited (e.g., by the deposition tool 102) by CVD, PVD, ALD, or another deposition technique.

As further shown in FIG. 4A, seal spacer layers 408 are included on the sidewalls of the gate structure 214a. The seal spacer layers 408 may be conformally deposited (e.g., by the deposition tool 102) and may include a silicon oxycarbide (SiOC), a nitrogen free SiOC, or another suitable material. The seal spacer layers 408 may be formed in an ALD operation in which various types of precursor gasses including silicon (Si) and carbon (C) are sequentially supplied in a plurality of alternating cycles to form the seal spacer layers 408, among other example deposition techniques.

As further shown in FIG. 4A, bulk spacer layers 410 may be formed on the seal spacer layers 408. The bulk spacer layers 410 may be formed of similar materials as the seal spacer layers 408. However, the bulk spacer layers 410 may be formed without plasma surface treatment that is used for the seal spacer layers 408. Moreover, the bulk spacer layers 410 may be formed to a greater thickness relative to the thickness of the seal spacer layers 408.

In some implementations, the seal spacer layers 408 and the bulk spacer layers 410 are conformally deposited (e.g., by the deposition tool 102) on the gate structure 214a, and on the fin structures 210a. The seal spacer layers 408 and the bulk spacer layers 410 are then patterned (e.g., by the deposition tool 102, the exposure tool 104, and the developer tool 106) and etched (e.g., by the etch tool 108) to remove the seal spacer layers 408 and the bulk spacer layers 410 from the tops of the gate structure 214a and from the fin structure 210a.

As further shown in 4A, a low-voltage STI region 412 may be formed in the low-voltage region 202. The low-voltage STI region 412 may be formed in a recess 414 in the fin structure 210a. The low-voltage STI region 412 may configured to provide electrical isolation between low-voltage fin-based transistors in the low-voltage region 202. Additionally and/or alternatively, the low-voltage STI region 412 may be configured to provide electrically isolation between the low-voltage region 202 and one or more other regions of the semiconductor device 200, such as the high-voltage PMOS region 204 and/or the high-voltage NMOS region 206.

The low-voltage STI region 412 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The low-voltage STI region 412 may include a multi-layer structure, for example, having one or more liner layers.

In some implementations, a pattern in a photoresist layer is used to form the recess 414 in the fin structure 210a. In these implementations, the deposition tool 102 forms the photoresist layer on the fin structure 210a. The exposure tool 104 exposes the photoresist layer to a radiation source to pattern the photoresist layer. The developer tool 106 develops and removes portions of the photoresist layer to expose the pattern. The etch tool 108 etches into the fin structure 210a to form the recess 414. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recess 414 in the fin structure 210a based on a pattern. In some implementations, the high-voltage PMOS region 204 and/or the high-voltage NMOS region 206 are masked during processing of the low-voltage region 202 to protect the structures and/or layers in the high-voltage PMOS region 204 and/or in the high-voltage NMOS region 206 from damage.

The deposition tool 102 may then deposit the low-voltage STI region 412 in the recess 414. The deposition tool 102 may deposit the low-voltage STI region 412 using a CVD technique, a PVD technique, an ALD technique, a deposition technique described above in connection with FIG. 1, and/or another deposition technique. The deposition tool 102 may form the low-voltage STI region 412 to a thickness T1 such that a top surface of the low-voltage STI region 412 is at a lower position in the semiconductor device 200 relative to the top of the fin structure 210a. Accordingly, the top surface of the low-voltage STI region 412 and the top of the fin structure 210a may be spaced apart by a distance D1. In some implementations, the distance D1 may be referred to as the fin height of the fin structure 210a. In some implementations, the thickness T1 may be approximately 700 angstroms. However, other values for the thickness T1 are within the scope of the present disclosure. In some implementations, the distance D1 is approximately 45 angstroms. However, other values for the distance D1 are within the scope of the present disclosure.

As further shown in 4A, high-voltage STI regions 416 may be formed in the high-voltage PMOS region 204 and in the high-voltage NMOS region 206. The high-voltage STI regions 416 may be formed in recesses in the fin structure 210b in the high-voltage PMOS region 204. The high-voltage STI regions 416 in the high-voltage PMOS region 204 may be configured to provide electrical isolation for the high-voltage PMOS region 204 and/or may be configured to provide electrical isolation between the source/drain regions in the high-voltage PMOS region 204. The high-voltage STI regions 416 may enable the high-voltage fin-based PMOS transistors in the high-voltage PMOS region 204 to operate a greater gate voltage relative to the gate voltage of the low-voltage fin-based transistors in the low-voltage region 202.

Similarly, the high-voltage STI regions 416 may be formed in recesses in the fin structure 210c in the high-voltage NMOS region 206. The high-voltage STI regions 416 in the high-voltage NMOS region 206 may be configured to provide electrical isolation for the high-voltage NMOS region 206 and/or may be configured to provide increased electrical isolation between the source/drain regions in the high-voltage NMOS region 206. The high-voltage STI regions 416 may enable the high-voltage fin-based NMOS transistors in the high-voltage NMOS region 206 to operate a greater gate voltage relative to the gate voltage of the low-voltage fin-based transistors in the low-voltage region 202.

In some implementations, a pattern in a photoresist layer is used to form the recesses in the fin structure 210b and in the fin structure 210c. In these implementations, the deposition tool 102 forms the photoresist layer on the fin structure 210b and on the fin structure 210c. The exposure tool 104 exposes the photoresist layer to a radiation source to pattern the photoresist layer. The developer tool 106 develops and removes portions of the photoresist layer to expose the pattern. The etch tool 108 etches into the fin structure 210b and etches into the fin structure 210c to form the recesses. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses in the fin structure 210b and in the fin structure 210c based on a pattern. In some implementations, the low-voltage region 202 is masked during processing of the high-voltage PMOS region 204 and/or the high-voltage NMOS region 206 to protect the structures and/or layers in the low-voltage region 202 from damage.

The deposition tool 102 may then deposit the high-voltage STI regions 416 in the recesses in the fin structures 210b and in the recesses in the fin structures 210c. The deposition tool 102 may deposit the high-voltage STI regions 416 using a CVD technique, a PVD technique, an ALD technique, a deposition technique described above in connection with FIG. 1, and/or another deposition technique. The high-voltage STI regions 416 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The high-voltage STI regions 416 may include a multi-layer structure, for example, having one or more liner layers.

In some implementations, the low-voltage STI region 412 and the high-voltage STI regions 416 may be formed such that the bottom surface of the low-voltage STI region 412 and bottom surfaces of the high-voltage STI regions 416 are at approximately a same height in the semiconductor device 200. In some implementations, the low-voltage STI region 412 and the high-voltage STI regions 416 may be formed such that the bottom surfaces of the high-voltage STI regions 416 are at a lower height in the semiconductor device 200 relative to the height of the bottom surface of the low-voltage STI region 412. In some implementations, the high-voltage STI regions 416 are formed such that the top surfaces of the high voltage STI regions 416 and the tops of the fin structures 210b and 210c are at approximately a same height in the semiconductor device 200.

As further shown in FIG. 4A, a gate STI region 418 may be formed in a recess in the fin structure 210b in the high-voltage PMOS region 204. The gate STI region 418 may be included in a region of the fin structure 210b above which a gate structure of a high-voltage fin-based PMOS transistor is to be formed in the high-voltage PMOS region 204. The gate STI region 418 enables a gate oxide region of the high-voltage fin-based PMOS transistor to extend into a portion of the fin structure 210b to increase the height of the gate oxide region for the high-voltage fin-based PMOS transistor. The gate STI region 418 may be included in the fin structure 210b between two or more high-voltage STI regions 416. Accordingly, high-voltage STI regions 416 may be positioned between the gate STI region 418 and the source/drain regions that are to be formed in the fin structure 210 for the high-voltage fin-based PMOS transistor. A gate STI region may be omitted from (e.g., not included in) the high-voltage NMOS region 206. Alternatively, the high-voltage NMOS region 206 may also include gate STI regions in the high-voltage fin-based NMOS transistors in the high-voltage NMOS region 206.

In some implementations, a pattern in a photoresist layer is used to form the recess in the fin structure 210b. In these implementations, the deposition tool 102 forms the photoresist layer on the fin structure 210b. The exposure tool 104 exposes the photoresist layer to a radiation source to pattern the photoresist layer. The developer tool 106 develops and removes portions of the photoresist layer to expose the pattern. The etch tool 108 etches into the fin structure 210b to form the recess. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses in the fin structure 210b based on a pattern. In some implementations, the low-voltage region 202 and/or the high-voltage NMOS region 206 are masked during processing of the high-voltage PMOS region 204 to protect the structures and/or layers in the low-voltage region 202 and/or in the high-voltage NMOS region 206 from damage.

The deposition tool 102 may then deposit the gate STI region 418 in the recess in the fin structures 210b. The deposition tool 102 may deposit the gate STI region 418 using a CVD technique, a PVD technique, an ALD technique, a deposition technique described above in connection with FIG. 1, and/or another deposition technique. The gate STI region 418 may include a dielectric material such as a silicon oxide ($SiO_x$), a silicon nitride ($Si_xN_y$), a silicon oxynitride (SiON), fluoride-doped silicate glass (FSG), a low-k dielectric material, and/or other suitable insulating material. The gate STI region 418 may include a multi-layer structure, for example, having one or more liner layers.

In some implementations, the gate STI region 418 and the high-voltage STI regions 416 may be formed such that bottom surface of the gate STI region 418 and bottom surfaces of the high-voltage STI regions 416 are at approximately a same height in the semiconductor device 200. In some implementations, the gate STI region 418 and the high-voltage STI regions 416 may be formed such that the bottom surfaces of the high-voltage STI regions 416 are at a lower height in the semiconductor device 200 relative to the height of the bottom surface of the gate STI region 418. In some implementations, the gate STI region 418 is formed such that the top surfaces of the gate STI region 418 and the top of the fin structure 210b are at approximately a same height in the semiconductor device 200.

As further shown in FIG. 4A, source/drain regions 420 are formed in the fin structure 210a in the low-voltage region 202 at opposing sides of the gate structure 214a. The etch tool 108 may form recesses in the fin structure 210a. In some implementations, the etch tool 108 may perform an etch operation that includes a plasma etch technique, a wet chemical etch technique, and/or another type of etch technique to etch the fin structure 210a. The deposition tool 102 may form the source/drain regions 420 in the recesses by epitaxially growing the source/drain regions 420 in the recesses.

Figure 4B:
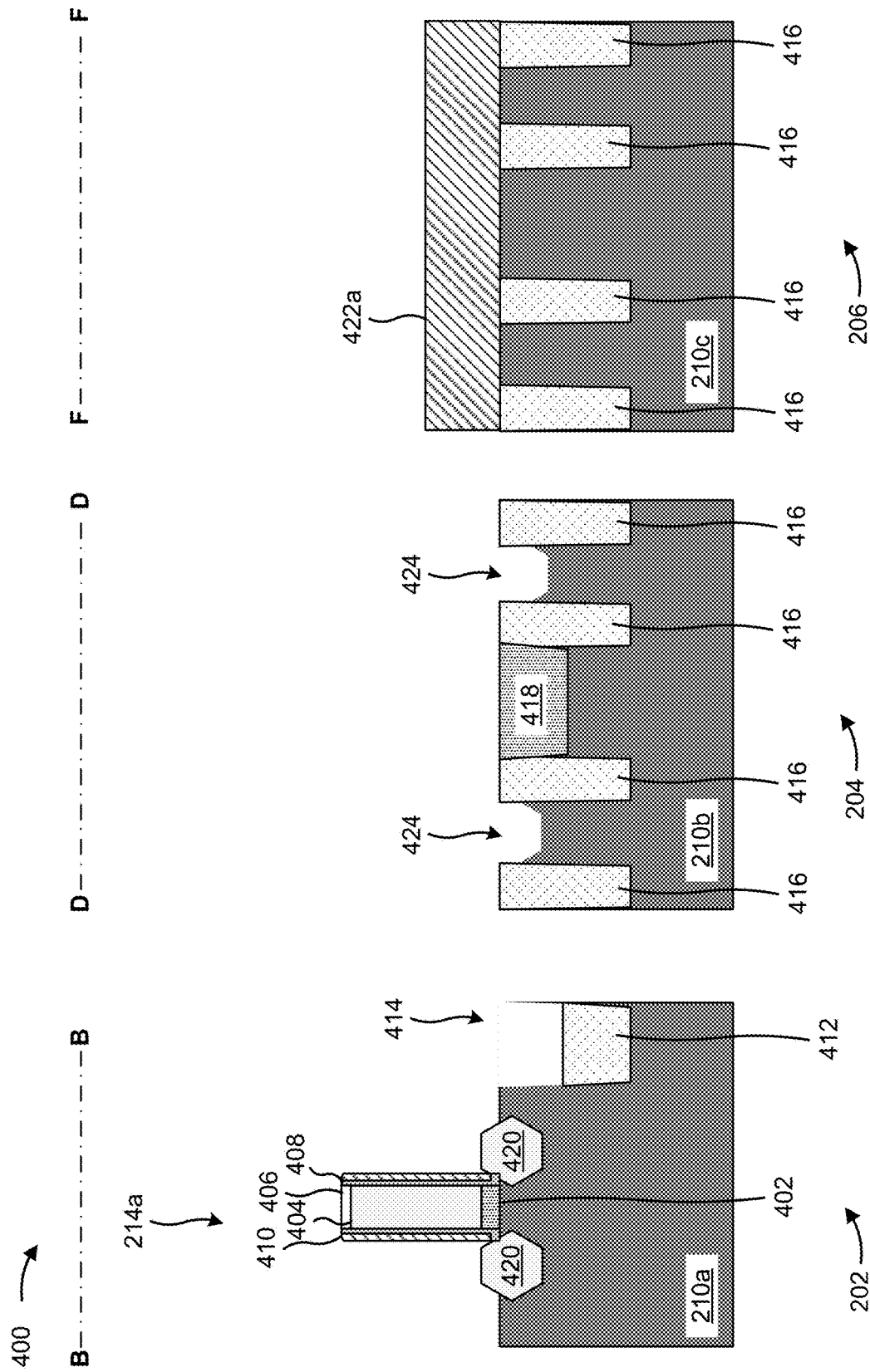

As shown in FIG. 4B, a photoresist layer 422a is formed over and/or on the fin structures 210c, and over and/or on the high-voltage STI region 416 in the high-voltage NMOS region 206. The deposition tool 102 may form the photoresist layer 422a using a spin-coating technique or another deposition technique. The photoresist layer 422a is formed to protect the fin structure 210c, the high-voltage STI regions 416, and/or other structures in the high-voltage NMOS region 206 in a subsequent etch operation in which recesses for the source/drain regions of the high-voltage PMOS region 204 are formed. Moreover, the photoresist layer 422a is formed to protect the fin structure 210c, the high-voltage STI regions 416, and/or other structures in the high-voltage NMOS region 206 in a subsequent epitaxial growth operation in which the source/drain regions are formed in the recesses in the high-voltage PMOS region 204. In some implementations, the photoresist layer 422a is also formed over the low-voltage region 202 to protect the low-voltage region 202 during processing of the high-voltage PMOS region 204.

As further shown in FIG. 4B, recesses 424 are formed in a fin structure 210b in the high-voltage PMOS region 204 between adjacent high-voltage STI regions 416 in the fin structure 210b. This etch operation may be referred to a strained source/drain (SSD) etch operation, and the recesses 424 may be referred to as strained source/drain recesses. The etch tool 108 forms the recesses 424 after the photoresist layer 422a is formed. In this way, the photoresist layer 422a protects the structures and/or layers in the high-voltage NMOS region 206 (and, in some cases, structures and/or layers in the low-voltage region 202) from being etched during formation of the recesses 424. In some implementations, the etch tool 108 may use a plasma etch technique, a wet chemical etch technique, and/or another type of etch technique to form the recesses 424 in the fin structure 210b.

Figure 4C:
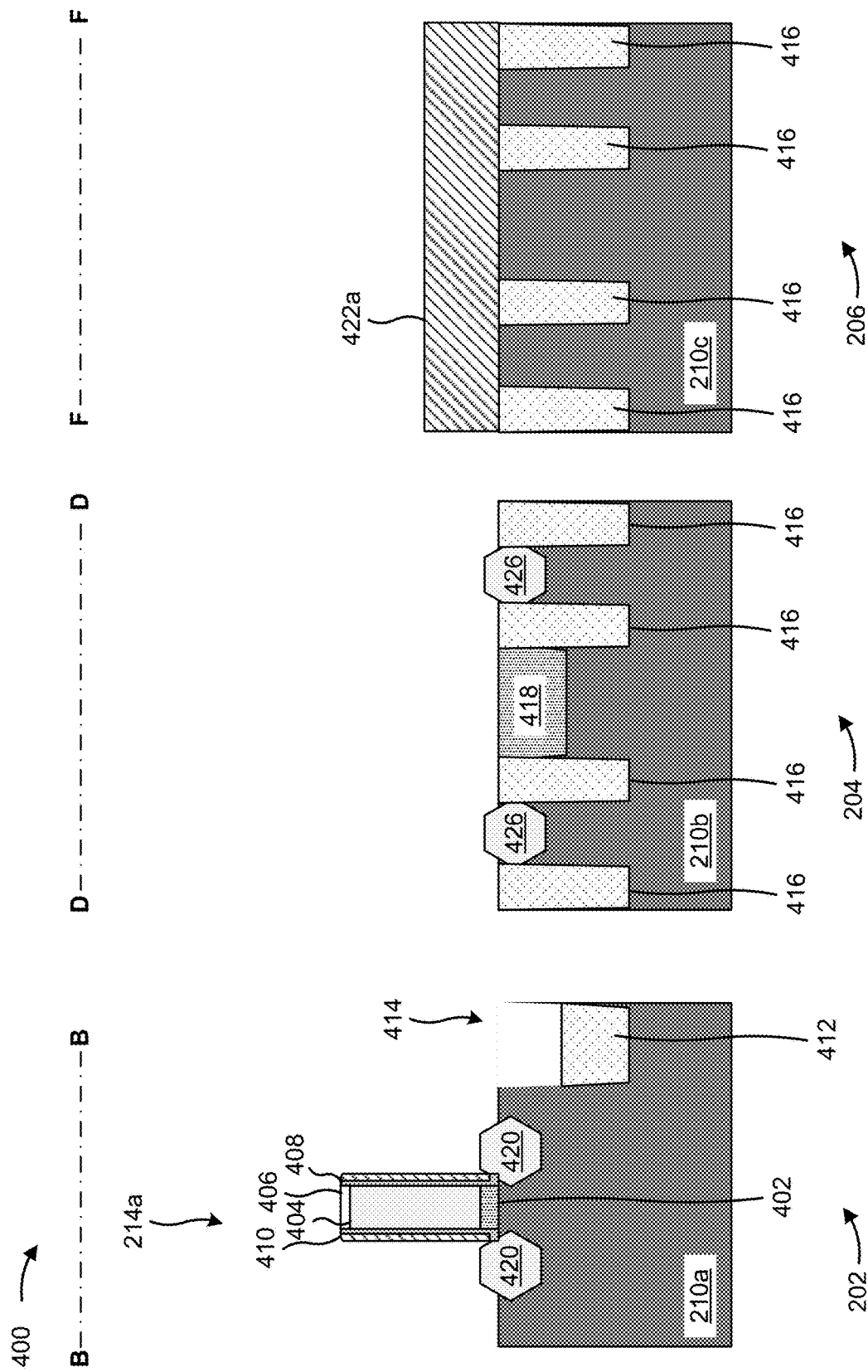

As shown in FIG. 4C, p-type source/drain regions 426 are formed in the recesses 424 in the fin structure 210b in the high-voltage PMOS region 204 of the semiconductor device 200. The p-type source/drain regions 426 may be formed between adjacent high-voltage STI regions 416 and on opposing sides of the gate STI region 418. The deposition tool 102 forms the p-type source/drain regions 426 in an epitaxial operation, in which layers of epitaxial material are deposited in the recesses 424 such that the layers of the p-type source/drain regions 426 are formed by epitaxial growth in a particular crystalline orientation. The p-type source/drain regions 426 are formed as the source/drain regions for the high-voltage fin-based PMOS transistors (e.g., high-voltage PMOS finFETs, high-voltage PMOS nanostructure transistors) included in the high-voltage PMOS region 204. In some implementations, the p-type source/drain regions 426 partially extend above the top surface of the fin structure 210b. In some implementations, the height of the top surfaces of the p-type source/drain regions 426 and the height of the top surface of the fin structure 210b are approximately equal.

The material (e.g., silicon (Si), gallium (Ga), or another type of semiconductor material) that is used to form the p-type source/drain regions 426 may be doped with a p-type dopant, which is a type of dopant that includes electron acceptor atoms that create holes in the material. The material may be doped by adding impurities (e.g., the p-type dopant) to a source gas that is used during the epitaxial operation. Examples of p-type dopants that may be used in the epitaxial operation include boron (B) or germanium (Ge), among other examples. The resulting material of the p-type source/drain regions 426 include silicon germanium ($Si_xGe_{1-x}$, where x can be in a range from approximately 0 to approximately 100) or another type of p-doped semiconductor material.

Figure 4D:
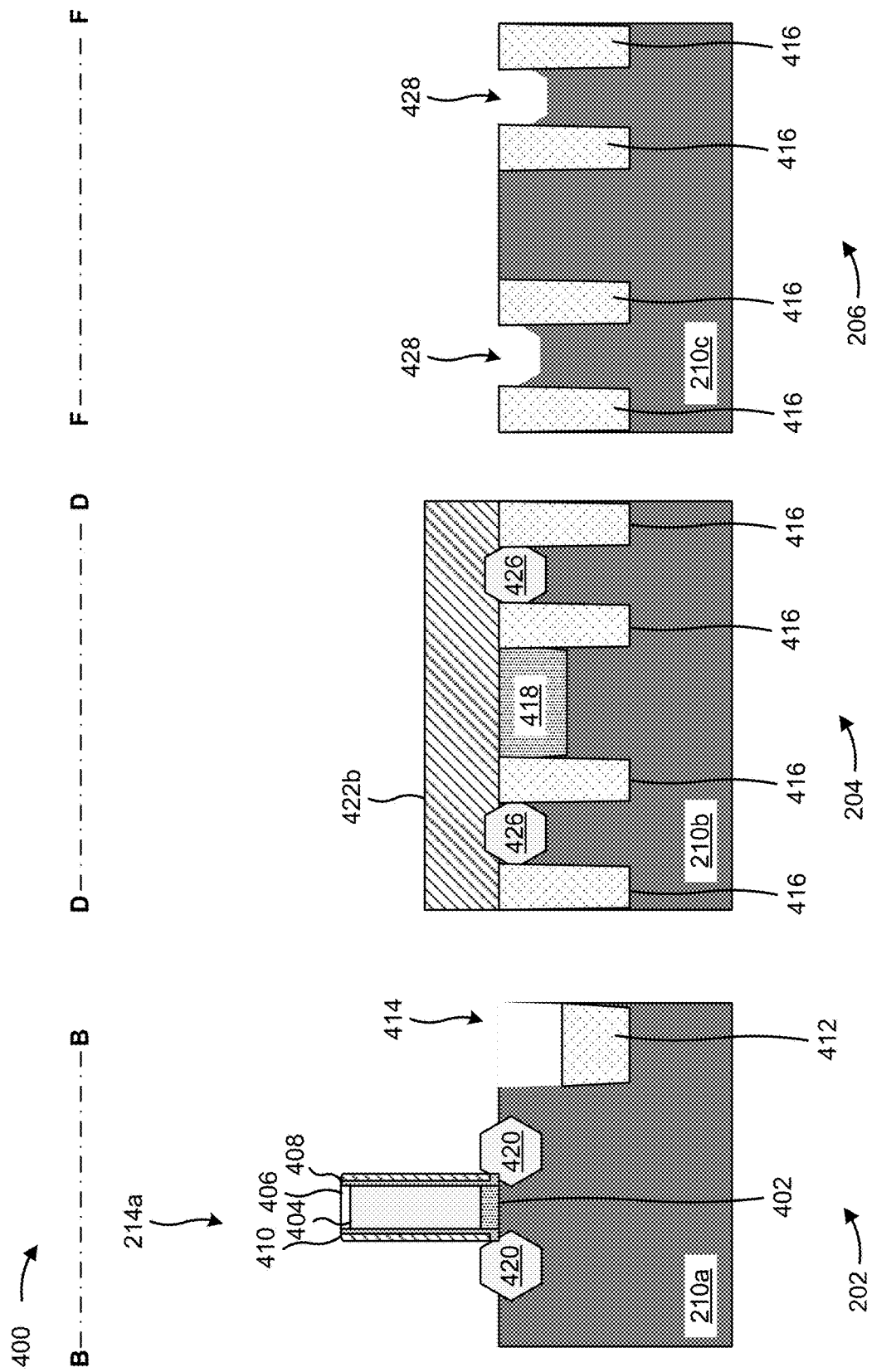

As shown in FIG. 4D, the photoresist layer 422a may be removed from the high-voltage NMOS region 206 after the p-type source/drain regions 426 are formed in the fin structure 210b in the high-voltage PMOS region 204. In some implementations, the photoresist layer 422a is also removed from the low-voltage region 202. Alternatively, the photoresist layer 422a may remain on the low-voltage region 202.

Subsequently, a photoresist layer 422b is formed over and/or on the fin structures 210b, and over and/or on the high-voltage STI region 416 in the high-voltage PMOS region 204. The deposition tool 102 may form the photoresist layer 422b using a spin-coating technique or another deposition technique. The photoresist layer 422b is formed to protect the fin structure 210b, the high-voltage STI regions 416, and/or other structures in the high-voltage PMOS region 204 in a subsequent etch operation in which recesses for the source/drain regions of the high-voltage NMOS region 206 are formed. Moreover, the photoresist layer 422b is formed to protect the fin structure 210b, the high-voltage STI regions 416, and/or other structures in the high-voltage PMOS region 204 in a subsequent epitaxial growth operation in which the source/drain regions are formed in the recesses in the high-voltage NMOS region 206. In some implementations, the photoresist layer 422b is also formed over the low-voltage region 202 to protect the low-voltage region 202 during processing of the high-voltage NMOS region 206.

As further shown in FIG. 4D, recesses 428 are formed in a fin structure 210c in the high-voltage NMOS region 206 between adjacent high-voltage STI regions 416 in the fin structure 210c. This etch operation may be referred to an SSD etch operation, and the recesses 428 may be referred to as strained source/drain recesses. The etch tool 108 forms the recesses 428 after the photoresist layer 422b is formed. In this way, the photoresist layer 422b protects the structures and/or layers in the high-voltage PMOS region 204 (and, in some cases, structures and/or layers in the low-voltage region 202) from being etched during formation of the recesses 428. In some implementations, the etch tool 108 may use a plasma etch technique, a wet chemical etch technique, and/or another type of etch technique to form the recesses 428 in the fin structure 210c.

Figure 4E:
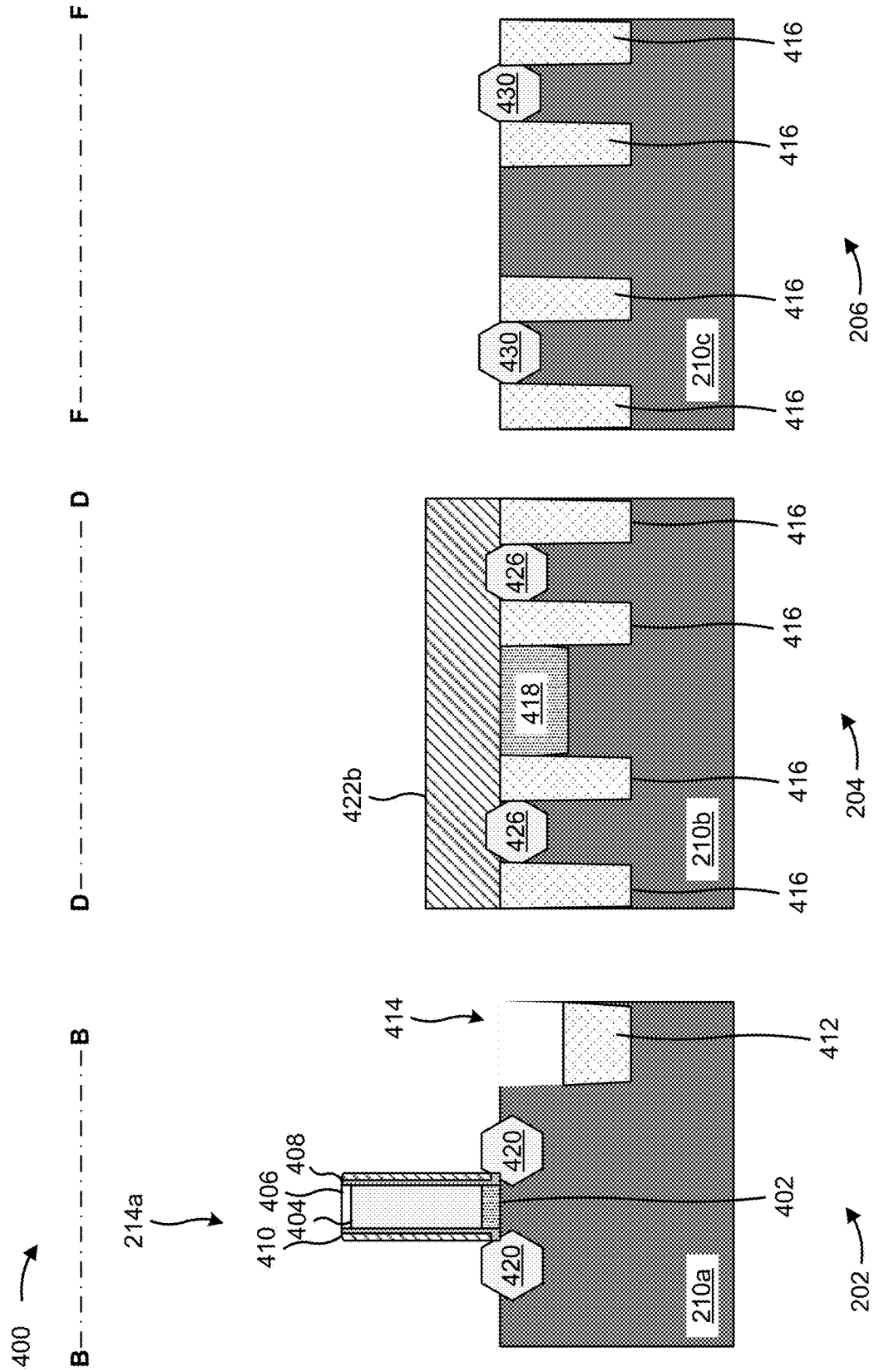

As shown in FIG. 4E, n-type source/drain regions 430 are formed in the recesses 428 in the fin structure 210c in the high-voltage NMOS region 206 of the semiconductor device 200. The n-type source/drain regions 430 may be formed between adjacent high-voltage STI regions 416 in the fin structure 210c. The deposition tool 102 forms the n-type source/drain regions 430 in an epitaxial operation, in which layers of epitaxial material are deposited in the recesses 428 such that the layers of the n-type source/drain regions 430 are formed by epitaxial growth in a particular crystalline orientation. The n-type source/drain regions 430 are formed as the source/drain regions for the high-voltage fin-based NMOS transistors (e.g., high-voltage NMOS finFETs, high-voltage NMOS nanostructure transistors) included in the high-voltage NMOS region 206. In some implementations, the n-type source/drain regions 430 partially extend above the top surface of the fin structure 210c. In some implementations, the height of the top surfaces of the n-type source/drain regions 430 and the height of the top surface of the fin structure 210b are approximately equal.

The material (e.g., silicon (Si), gallium (Ga), or another type of semiconductor material) that is used to form the n-type source/drain regions 430 is doped with an n-type dopant, which is a type of dopant that includes electron donor atoms that create mobile electrons in the material. The material may be doped by adding impurities (e.g., the n-type dopant) to a source gas that is used during the epitaxial operation. Examples of n-type dopants that may be used in the epitaxial operation include phosphorous (P) or arsenic (As), among other examples. The resulting material of the p-type source/drain regions 430 includes silicon phosphide ($Si_xP_y$) or another type of n-doped semiconductor material. The photoresist layer 422b may be removed from the high-voltage PMOS region 204 (and, in some cases, from the low-voltage region 202) after the n-type source/drain regions 430 are formed.

As indicated above, FIGS. 4A-4E are provided as an example. Other examples may differ from what is described with regard to FIGS. 4A-4E. For example, while the p-type source/drain regions 426 are formed prior to formation of the n-type source/drain regions 430 in the example implementation 400, the process may be reversed such that the n-type source/drain regions 430 are formed prior to formation of the p-type source/drain regions 426.

FIGS. 5A-5I are diagrams of an example implementation 500 described herein. The example implementation 500 includes an example dummy gate replacement process, in which the gate structure 214a in the low-voltage region 202 is replaced with a replacement gate structure that includes high- and/or metal materials. Moreover, the example implementation 500 includes an example of forming MEOL structures for a high-voltage fin-based PMOS transistor in the high-voltage PMOS region 204, such as a gate contact (MP) and source/drain contacts (MD). The gate contact and an associated metal liner may function as the gate structure for the high-voltage fin-based PMOS transistor. In this way, the functions of a gate contact and a gate structure are performed by the same structure, and a dedicated gate structure does not need to be formed for the high-voltage fin-based PMOS transistor. This reduces the complexity of the high-voltage fin-based PMOS transistor and reduces the complexity of the process for forming the high-voltage fin-based PMOS transistor. The use of the gate contact as the gate structure for the high-voltage fin-based PMOS transistor enables ILD layers in the high-voltage PMOS region 204 to function as the gate oxide for the high-voltage fin-based PMOS transistor, which enables the gate oxide for the high-voltage fin-based PMOS transistor to be formed sufficiently tall or thick while providing sufficient ILD layer thickness to provide sufficient breakdown voltage performance for the high-voltage fin-based PMOS transistor.

FIGS. 5A-5I are illustrated from the perspective of the cross-sectional plane B-B in FIG. 2 for the low-voltage region 202, from the perspective of the cross-sectional plane D-D in FIG. 2 for the high-voltage PMOS region 204, and from the perspective of the cross-sectional plane F-F in FIG. 2 for the high-voltage NMOS region 206. In some implementations, the operations described in connection with the example implementation 500 are performed after the fin formation process described in connection with FIGS. 3A-3E and/or FIGS. 4A-4E.

Figure 5A:
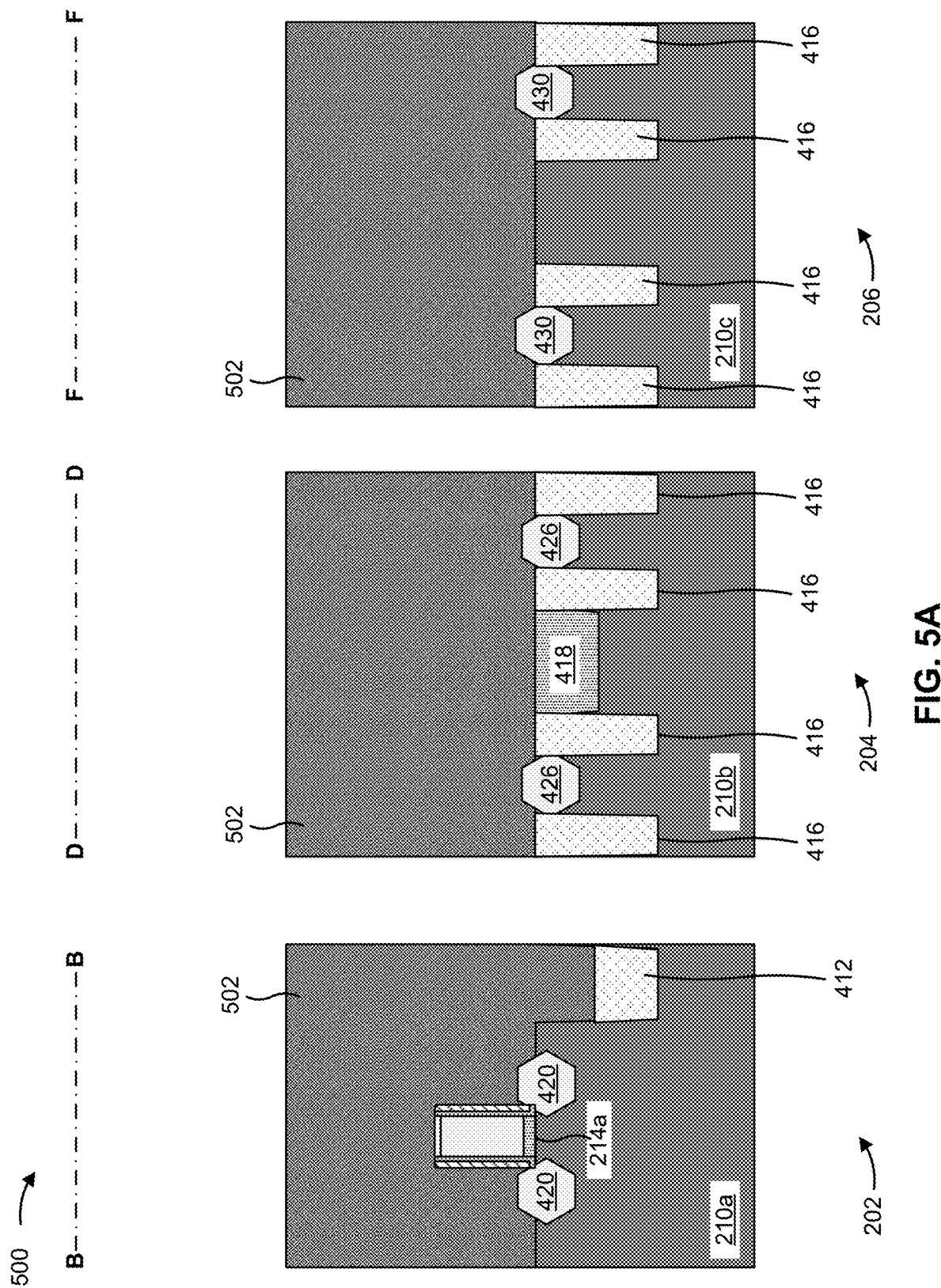

As shown in FIG. 5A, an ILD layer 502 may be formed over the semiconductor device. The ILD layer 502 may be referred to as an ILD0 layer or another type of ILD layer. In some implementations, the ILD layer 502 is formed over and/or on the structures and/or layers in the low-voltage region 202, such as the fin structure 210a, the gate structure 214a, the low-voltage STI region 412, and/or the source/drain regions 420, among other examples. In some implementations, the ILD layer 502 is formed over and/or on the structures and/or layers in the high-voltage PMOS region 204, such as the fin structure 210b, the high-voltage STI regions 416, the gate STI region 418, and/or the p-type source/drain regions 426, among other examples. In some implementations, the ILD layer 502 is formed over and/or on the structures and/or layers in the high-voltage NMOS region 206, such as the fin structure 210c, the high-voltage STI regions 416, and/or the n-type source/drain regions 430, among other examples.

The deposition tool 102 may deposit the ILD layer 502 using a CVD technique, a PVD technique, an ALD technique, a deposition technique described above in connection with FIG. 1, and/or another deposition technique. The ILD layer 502 may include an oxide-containing material, such as a lanthanum oxide ($La_xO_y$), an aluminum oxide ($Al_xO_y$) a yttrium oxide ($Y_xO_y$), a silicon oxycarbide (SiOC), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), an aluminum oxynitride (AlON), a silicon oxide ($Si_xO_y$), a zinc oxide ($Zn_xO_y$), a silicon oxycarbonitride (SiOCN), and/or another oxide-containing material. Additionally and/or alternatively, the ILD layer 502 may include a tantalum carbon nitride (TaCN), a zirconium silicide ($ZrSi_x$), a silicon carbon nitride (SiCN), a zirconium nitride (ZrN), a silicon nitride ($Si_xN_y$), a hafnium silicide ($HfSi_x$), a silicon carbide (SiC), and/or another dielectric material.

In some implementations, a contact etch stop layer (CESL) is deposited (e.g., by the deposition tool 102) prior to formation of the ILD layer 502. The CESL may provide a mechanism to stop an etch process when forming contacts or vias for low-voltage region 202, the high-voltage PMOS region 204, and/or for the high-voltage NMOS region 206, respectively. The CESL may be formed of a dielectric material having a different etch selectivity from adjacent layers or components, including the ILD layer 502. The CESL may include or may be a nitrogen containing material, a silicon containing material, and/or a carbon containing material. Furthermore the CESL may include or may be silicon nitride, silicon carbon nitride, carbon nitride, silicon oxynitride, silicon carbon oxide, or a combination thereof, among other examples. The deposition tool 102 may deposit the CESL using a CVD technique, a PVD technique, an ALD technique, a deposition technique described above in connection with FIG. 1, and/or another deposition technique.

Figure 5B:
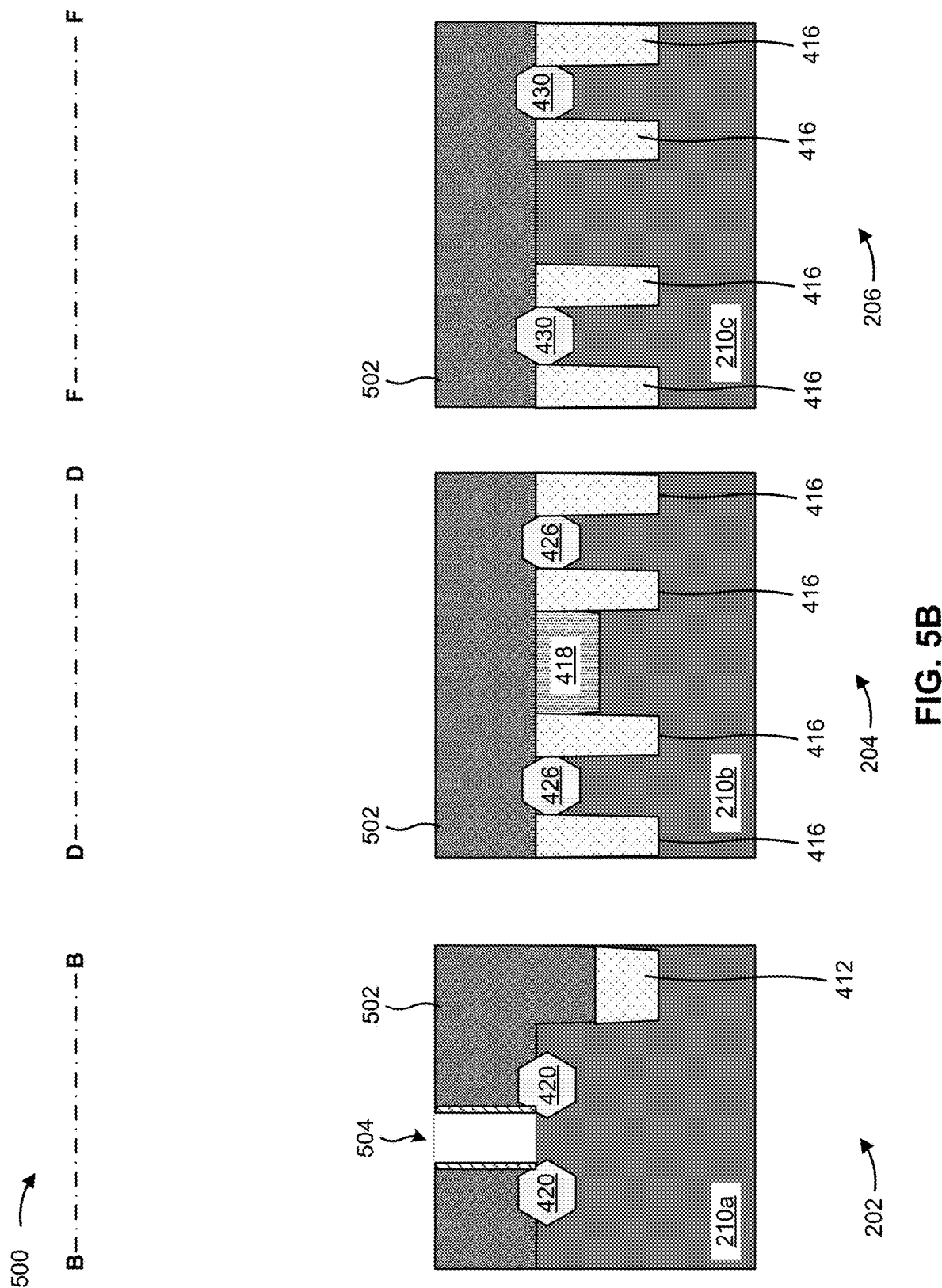

As shown in FIG. 5B, a planarization operation may be performed to planarize the ILD layer 502. In some implementations, the ILD layer 502 is formed to a height (or thickness) such that the ILD layer 502 completely covers the gate structure 214a and is taller than the gate structure 214a. In these implementations, the planarization tool 110 may perform the planarization operation to planarize the ILD layer 502 such that the top surface of the ILD layer 502 is approximately at a same height as the top surfaces of the gate structure 214a. This exposes the top surface of the gate structure 214a so that additional processing of the gate structure 214a may be performed. The planarization operation may include a CMP operation or another type of planarization operation.

As further shown in FIG. 5B, a replacement gate operation is performed (e.g., by one or more of the semiconductor processing tools 102-112) to remove the gate structure 214a from the low-voltage region 202. The removal of the gate structure 214a leaves behind an opening (or recess) 504 between the bulk spacer layers 410 and between the source/drain regions 420.

Figure 5C:
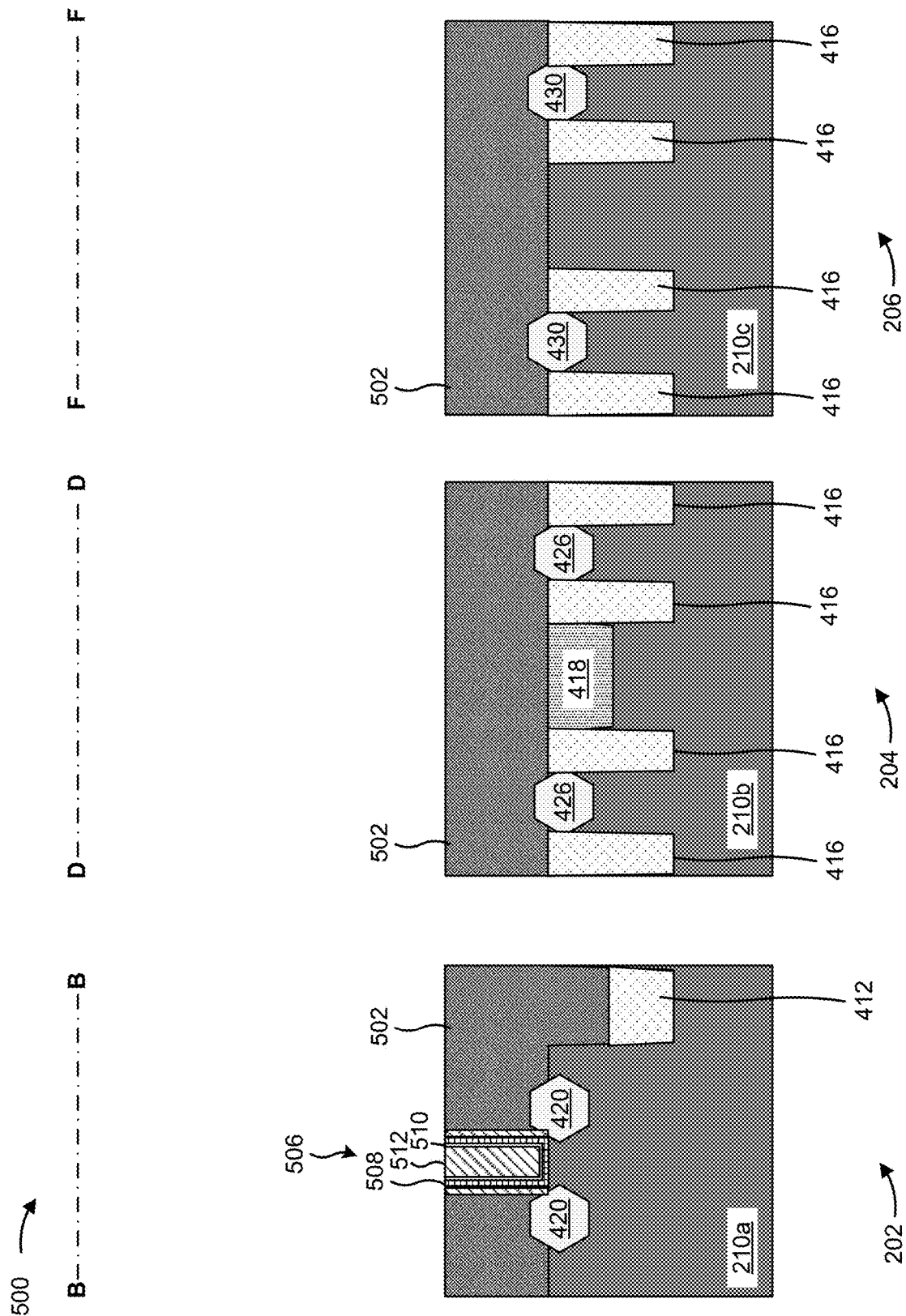

As shown in FIG. 5C, the replacement gate operation continues where deposition tool 102 and/or the plating tool 112 forms a gate structure (e.g., a replacement gate structure) 506 in the opening 504 between the bulk spacer layers 410 and between the source/drain regions 420. The gate structure 506 may include a metal gate structure that includes metal materials, high-k dielectric materials, and/or other types of materials. The gate structure 506 may include an interfacial layer (not shown), a high-k dielectric layer 508, a work function tuning layer 510, and a metal electrode structure 512 formed therein to form a gate structure 506. In some implementations, the gate structure 506 may include other compositions of materials and/or layers.

As shown in FIG. 5D, another ILD layer 514 may be formed over the semiconductor device. The ILD layer 514 may be referred to as an ILD1 layer or another type of ILD layer. In some implementations, the ILD layer 514 is formed over and/or on the ILD layer 502 in the low-voltage region 202, in the high-voltage PMOS region 204, and/or in the high-voltage NMOS region 206. In some implementations, an etch stop layer (ESL) is formed on the ILD layer 502, and the ILD layer 514 is formed on the ESL. In some implementations, the thickness T2 of the ILD layer 502 is included in a range of approximately 400 angstroms to approximately 500 angstroms. However, other values for the range are within the scope of the present disclosure. In some implementations, the thickness T3 of the ILD layer 514 is included in a range of approximately 400 angstroms to approximately 500 angstroms. However, other values for the range are within the scope of the present disclosure. In some implementations, the thickness T2 and the thickness T3 are approximately the same thickness. In some implementations, the thickness T2 and the thickness T3 are different thicknesses.

The deposition tool 102 may deposit the ILD layer 514 using a CVD technique, a PVD technique, an ALD technique, a deposition technique described above in connection with FIG. 1, and/or another deposition technique. The ILD layer 514 may include an oxide-containing material, such as a lanthanum oxide ($La_xO_y$), an aluminum oxide ($Al_xO_y$), a yttrium oxide ($Y_xO_y$), a silicon oxycarbide (SiOC), a zirconium aluminum oxide (ZrAlO), a titanium oxide ($Ti_xO_y$), a tantalum oxide ($Ta_xO_y$), a zirconium oxide ($Zr_xO_y$), a hafnium oxide ($Hf_xO_y$), an aluminum oxynitride (AlON), a silicon oxide ($Si_xO_y$), a zinc oxide ($Zn_xO_y$), a silicon oxycarbonitride (SiOCN), and/or another oxide-containing material. Additionally and/or alternatively, the ILD layer 514 may include a tantalum carbon nitride (TaCN), a zirconium silicide ($ZrSi_x$), a silicon carbon nitride (SiCN), a zirconium nitride (ZrN), a silicon nitride ($Si_xN_y$), a hafnium silicide ($HfSi_x$), a silicon carbide (SiC), and/or another dielectric material.

Figure 5E:
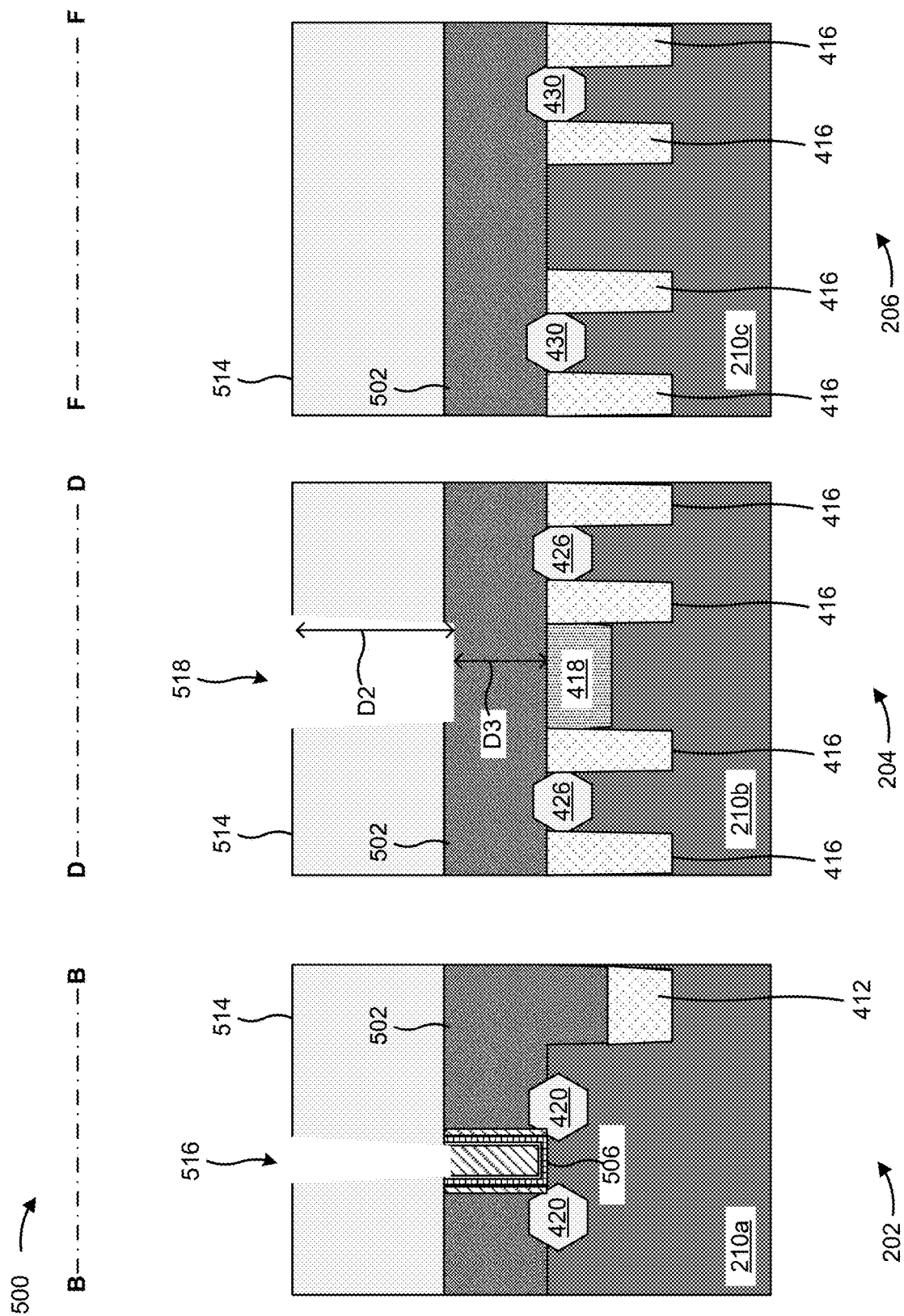
Figure 5F:
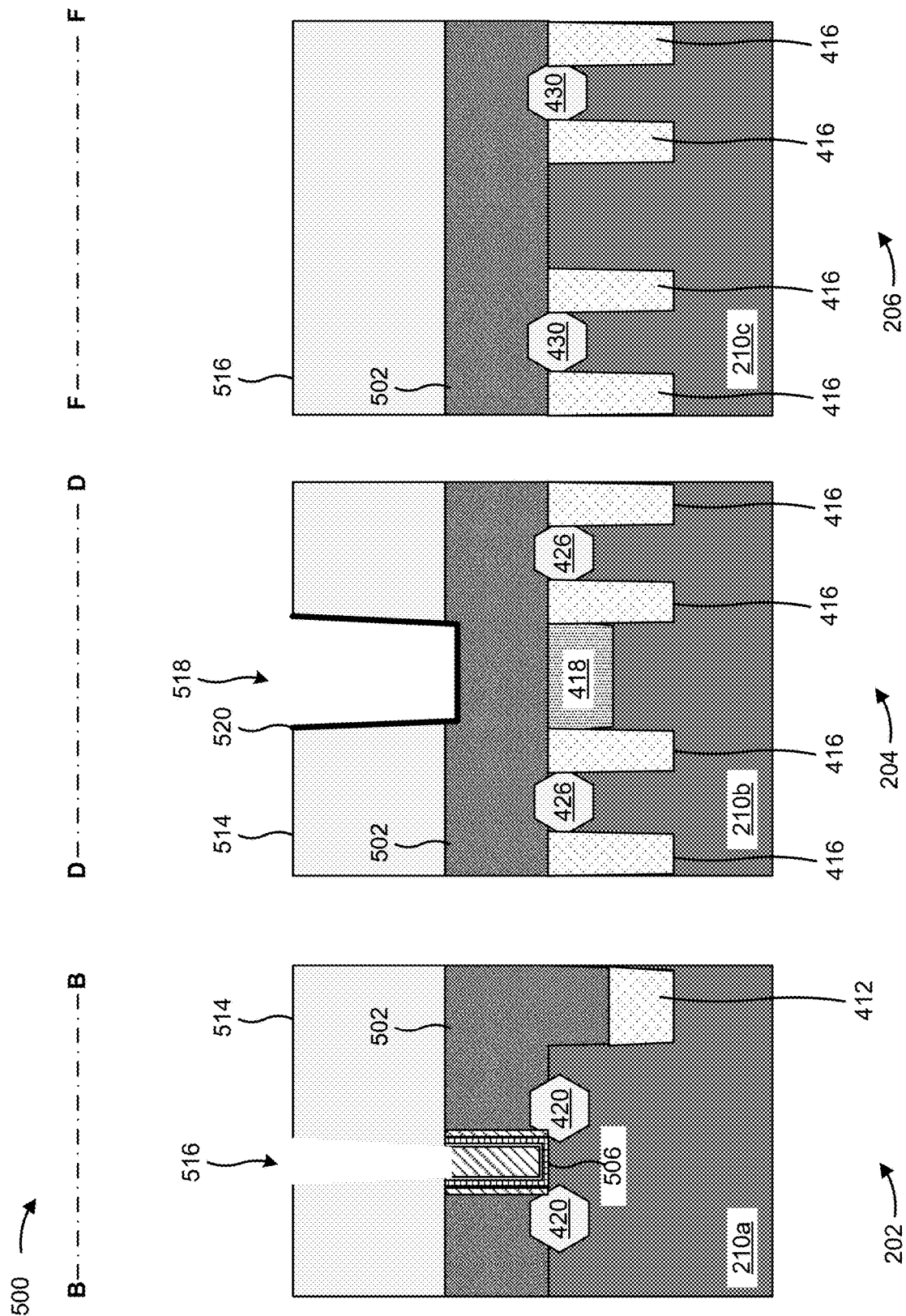

FIGS. 5E-5G illustrate an example process for forming a gate structure 214b for a high-voltage fin-based PMOS transistor in the high-voltage PMOS region 204. As shown in FIG. 5E, a recess 516 is formed in the ILD layer 514 above the gate structure 506 in the low-voltage region 202. A recess 518 may also be formed in the ILD layer 514 over the gate STI region 418 in the high-voltage PMOS region 204. In some implementations, the bottom surface of the recess 516 extends into a portion of the gate structure 506. In some implementations, the bottom surface of the recess 518 extends into a portion of the ILD layer 502.

In some implementations, a pattern in a photoresist layer is used to form the recesses 516 and/or 518 in the ILD layer 514. In these implementations, the deposition tool 102 forms the photoresist layer on the ILD layer 514. The exposure tool 104 exposes the photoresist layer to a radiation source to pattern the photoresist layer. The developer tool 106 develops and removes portions of the photoresist layer to expose the pattern. The etch tool 108 etches into the ILD layer 514 to form the recesses 516 and/or 518. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 516 and/or 518 in the ILD layer 514 based on a pattern.

In some implementations, the high-voltage NMOS region 206 is masked during formation of the recesses 516 and/or 518. In some implementations, the high-voltage PMOS region 204 is masked during formation of the recess 516, and the low-voltage region is masked during formation of the recess 518. In some implementations, the recesses 516 and 518 are formed in the same operation or same set of operations.

As further shown in FIG. 5E, the recess 518 may be formed to a depth D2. The depth D2 may be included in a range of approximately 500 angstroms to approximately 600 angstroms to provide sufficient area in which to fill the gate structure 214b of the high-voltage fin-based PMOS transistor and to provide sufficient distance D3 between the bottom surface of the gate structure 214b and the top surface of the fin structure 210b (which corresponds to the top surface of the gate STI region 418) for gate isolation. However, other values for the range are within the scope of the present disclosure. The distance D3 between the bottom surface of the gate structure 214b and the top surface of the fin structure 210b (which corresponds to the top surface of the gate STI region 418) may be included in a range of approximately 200 angstroms to approximately 300 angstroms to provide sufficient gate isolation and to provide sufficient gate breakdown voltage performance for the high-voltage fin-based PMOS transistor. However, other values for the range are within the scope of the present disclosure.

As shown in FIG. 5F, a barrier layer 520 may be formed in the recess 518 in the high-voltage PMOS region 204. The deposition tool 102 and/or the plating tool 112 may conformally deposit the barrier layer 520 to form a continuous layer of material on the sidewalls and on the bottom surface form the recess 518. The deposition tool 102 and/or the plating tool 112 deposits the barrier layer 520 using a CVD technique, a PVD technique, an ALD technique, an electroplating technique, another deposition technique described above in connection with FIG. 1, and/or a deposition technique other than as described above in connection with FIG. 1. The barrier layer 520 may be formed to a thickness that is included in a range of approximately 50 angstroms to approximately 150 angstroms to achieve continuity of the barrier layer 520 while still providing sufficient area in the recess 518 for gap filling of a conductive structure therein. However, other values for the range are within the scope of the present disclosure.

The barrier layer 520 is configured as a work function tuning layer of the gate structure 214b for the high-voltage fin-based PMOS transistor in the high-voltage PMOS region 204. The barrier layer 520 may include a p-type work function material, which may include a p-type work function metal, a p-type work function metal alloy, and/or another type of p-type work function material. The p-type work function materials that is used for the barrier layer 520 may include one or more materials having a work function that is included in a range of approximately 5 electron volts (eV) to approximately 5.2 eV to provide sufficient threshold voltage tuning for PMOS transistors. However, other values for the range are within the scope of the present disclosure. Examples of p-type work function materials include titanium nitride (TiN) (having a work function in a range of approximately 4.5 eV to approximately 5 eV), molybdenum (Mo) (having a working function in a range of approximately 4.5 eV to approximately 4.9 eV), ruthenium (Ru) (having a work function in a range of approximately 4.8 eV to approximately 5.1 eV), iridium (Ir) (having a work function in a range of approximately 4.6 eV to approximately 5.6 eV), platinum (Pt) (having a work function in a range of approximately 5.2 eV to approximately 5.6 eV), platinum silicide (PtSi) (having a work function in a range of approximately 4.9 eV to approximately 5 eV), and/or molybdenum nitride (MoN) (having a work function in a range of approximately 4.8 eV to approximately 5.2 eV), among other examples. However, other materials having a working function that is close to the valiance band of silicon may be used.

As shown in FIG. 5G, a conductive structure 522 may be formed in the recess 516 in the low-voltage region 202. The conductive structure 522 may include a gate contact (MP) for a low-voltage fin-based transistor in the low-voltage region 202. Moreover, a conductive structure 524 may be formed over and/or on the barrier layer 520 in the recess 518 in the high-voltage PMOS region 204.

The deposition tool 102 and/or the plating tool 112 may deposit the conductive structure 522 to fully fill the remaining area in the recess 516. The deposition tool 102 and/or the plating tool 112 may deposit the conductive structure 524 to fully fill the remaining area in the recess 518. The deposition tool 102 and/or the plating tool 112 deposits the conductive structures 522 and 524 using a CVD technique, a PVD technique, an ALD technique, an electroplating technique, another deposition technique described above in connection with FIG. 1, and/or a deposition technique other than as described above in connection with FIG. 1. In some implementations, an anneal operation is performed to reflow the material of the conductive structures 522 and 524 to remove voids and/or other imperfections in the conductive structures 522 and 524. In some implementations, the planarization tool 110 performs a planarization operation (e.g., a CMP operation or another type of planarization operation) to planarize the conductive structures 522 and 524. The conductive structures 522 and 524 may each include a conductive material such as ruthenium (Ru), cobalt (Co), tungsten (W), aluminum (Al), titanium (Ti), copper (Cu), another metal, a metal alloy, and/or another type of conductive material.

The conductive structure 524 may include a MEOL structure such as a gate contact (MP). The combination of the barrier layer 520 and the conductive structure 524 may be configured as (and may function) as a metal gate structure 526 of the high-voltage fin-based PMOS transistor. The metal gate structure 526 may correspond to the gate structure 214b. In this way, the combination of the conductive structure 524 and the barrier layer 520 functions as a combination of a gate structure (e.g., that controls the operation of the channel of the high-voltage fin-based PMOS transistor) and a gate contact (e.g., a conductive structure that electrically connects the gate structure to the BEOL region of the semiconductor device 200) without the need for a separate and/or dedicated structure (such as the gate structure 506 shown in the implementation in the low-voltage region 202) to function as the gate structure 214b of the high-voltage fin-based PMOS transistor. Thus, a dummy polysilicon gate structure and associated gate replacement process are not needed for the high-voltage fin-based PMOS transistor.

The combination of the gate STI region 418 and the portion of the between the bottom surface of the metal gate structure 526 and the top surface of the gate STI region 418 is configured to function as the gate oxide for the metal gate structure 526. This increases the overall height or thickness of the gate oxide, which provides increased gate isolation while providing sufficient ILD layer thickness for increased breakdown voltage performance for the high-voltage fin-based PMOS transistor without the need for extra processing steps to form a separate and dedicated structure for the gate oxide.

Figure 5H:
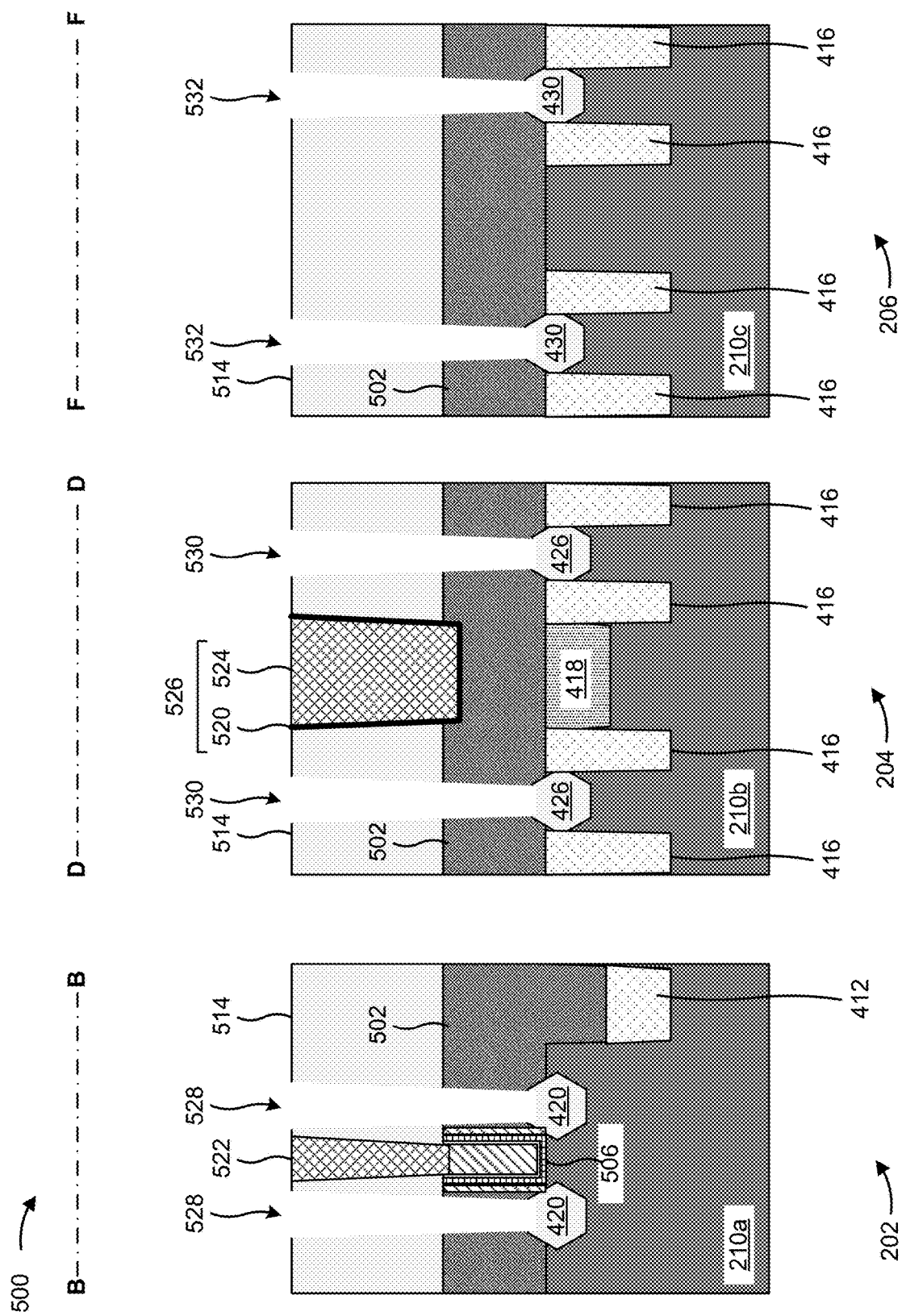
Figure 5I:
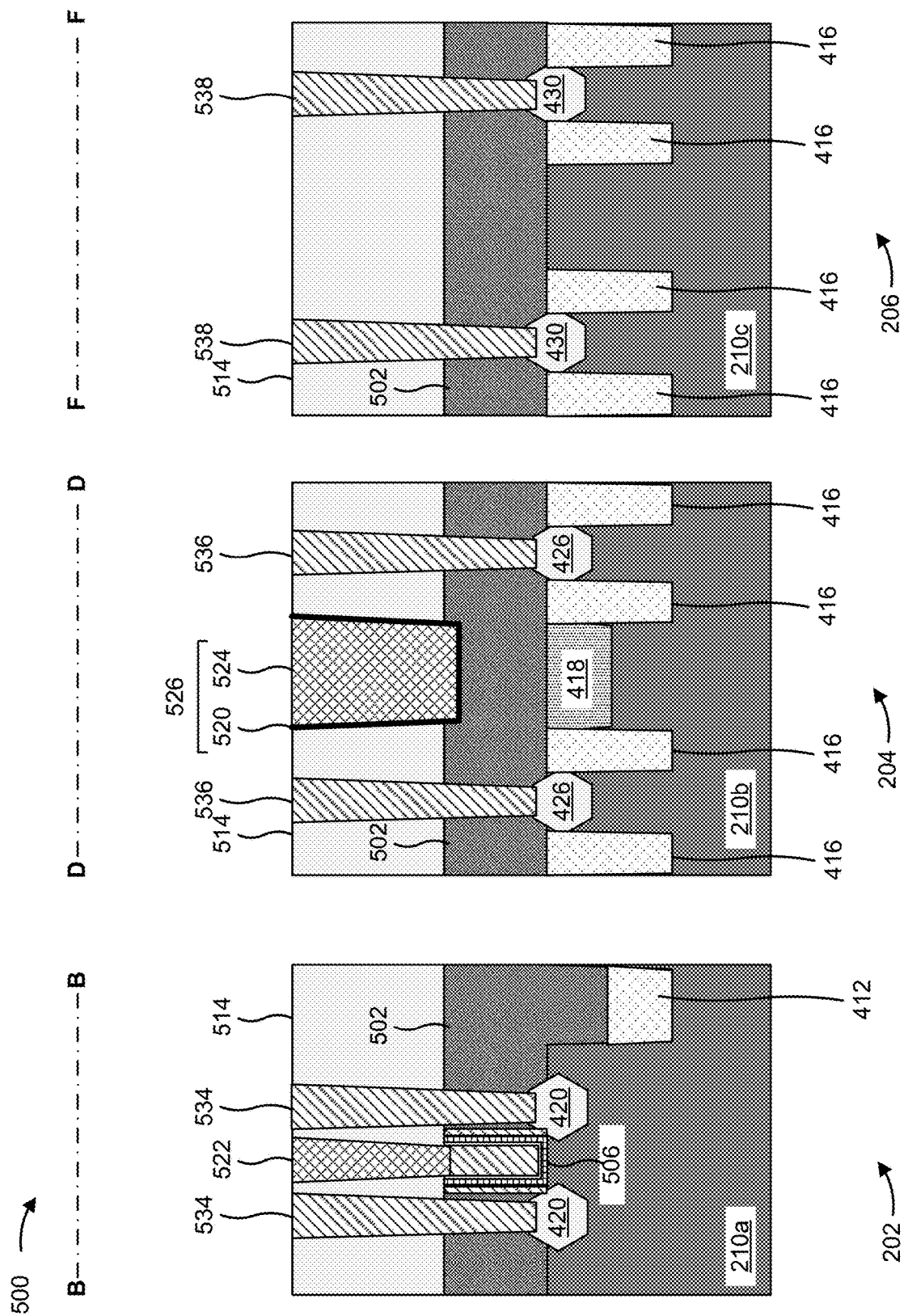

FIGS. 5H and 5I illustrate an example process for forming source/drain contacts in the semiconductor device 200. As shown in FIG. 5H, recesses 528 may be formed in the ILD layer 514 and in the ILD layer 502 to the tops of the source/drain regions 420 in the low-voltage region 202. Recesses 530 may be formed in the ILD layer 514 and in the ILD layer 502 to the tops of the source/drain regions 426 in the high-voltage PMOS region 204. Recesses 532 may be formed in the ILD layer 514 and in the ILD layer 502 to the tops of the source/drain regions 430 in the high-voltage NMOS region 206.

In some implementations, a pattern in a photoresist layer is used to form the recesses 528-532 in the ILD layer 514 and in the ILD layer 502. In these implementations, the deposition tool 102 forms the photoresist layer on the ILD layer 514. The exposure tool 104 exposes the photoresist layer to a radiation source to pattern the photoresist layer. The developer tool 106 develops and removes portions of the photoresist layer to expose the pattern. The etch tool 108 etches into the ILD layer 514 and into the ILD layer 502 to form the recesses 528-532. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 528-532 in the ILD layer 514 and in the ILD layer 502 based on a pattern.

In some implementations, the high-voltage PMOS region 204 and/or the high-voltage NMOS region 206 are masked during formation of the recesses 528 in the low-voltage region 202. In some implementations, the low-voltage region 202 and/or the high-voltage NMOS region 206 are masked during formation of the recesses 530 in the high-voltage PMOS region 204. In some implementations, the low-voltage region 202 and/or the high-voltage PMOS region 204 are masked during formation of the recesses 532 in the high-voltage NMOS region 206.

As shown in FIG. 5I, the recesses 528-532 are filled with a conductive material to form conductive structures in the recess 528-532. The conductive structures may correspond to source/drain contacts 534 for the source/drain regions 420 in the low-voltage region 202, source/drain contacts 536 for the source/drain regions 426 in the high-voltage PMOS region 204, and source/drain contacts 538 for the source/drain regions 430 in the high-voltage NMOS region 206.

The deposition tool 102 and/or the plating tool 112 may deposit the source/drain contacts 534-538. The deposition tool 102 and/or the plating tool 112 deposits the source/drain contacts 534-538 using a CVD technique, a PVD technique, an ALD technique, an electroplating technique, another deposition technique described above in connection with FIG. 1, and/or a deposition technique other than as described above in connection with FIG. 1. In some implementations, an anneal operation is performed to reflow the material of the source/drain contacts 534-538 to remove voids and/or other imperfections in the source/drain contacts 534-538. In some implementations, the planarization tool 110 performs a planarization operation (e.g., a CMP operation or another type of planarization operation) to planarize the source/drain contacts 534-538. The source/drain contacts 534-538 may each include a conductive material such as ruthenium (Ru), cobalt (Co), tungsten (W), aluminum (Al), titanium (Ti), copper (Cu), another metal, a metal alloy, and/or another type of conductive material.

As indicated above, FIGS. 5A-5I are provided as one or more examples. Other examples may differ from what is described with regard to FIGS. 5A-5I.

FIGS. 6A-6E are diagrams of an example implementation 600 described herein. The example implementation 600 includes an example of forming BEOL conductive structures (e.g., vias metallization layers) in the low-voltage region 202, in the high-voltage PMOS region 204, and in the high-voltage NMOS region 206.

Moreover, the example implementation 600 includes an example of forming one or more BEOL structures and an associated metal liner that are configured to function as the gate structure for a high-voltage fin-based NMOS transistor in the high-voltage NMOS region 206. In this way, the functions of a gate contact and one or more BEOL structures are performed by the same structure(s), and a dedicated gate structure does not need to be formed for the high-voltage fin-based NMOS transistor. This reduces the complexity of the high-voltage fin-based NMOS transistor and reduces the complexity of the process for forming the high-voltage fin-based NMOS transistor. The use of the BEOL structure (s) as the gate structure for the high-voltage fin-based NMOS transistor enables ILD layers in the high-voltage NMOS region 206 to function as the gate oxide for the high-voltage fin-based NMOS transistor, which enables the gate oxide for the high-voltage fin-based NMOS transistor to be formed sufficiently tall or thick while providing sufficient ILD layer thickness to provide sufficient breakdown voltage performance for the high-voltage fin-based NMOS transistor.

FIGS. 6A-6E are illustrated from the perspective of the cross-sectional plane B-B in FIG. 2 for the low-voltage region 202, from the perspective of the cross-sectional plane D-D in FIG. 2 for the high-voltage PMOS region 204, and from the perspective of the cross-sectional plane F-F in FIG. 2 for the high-voltage NMOS region 206. In some implementations, the operations described in connection with the example implementation 600 are performed after the fin formation process described in connection with FIGS. 3A-3E, FIGS. 4A-4E, and/or FIGS. 5A-5I.

Figure 6A:
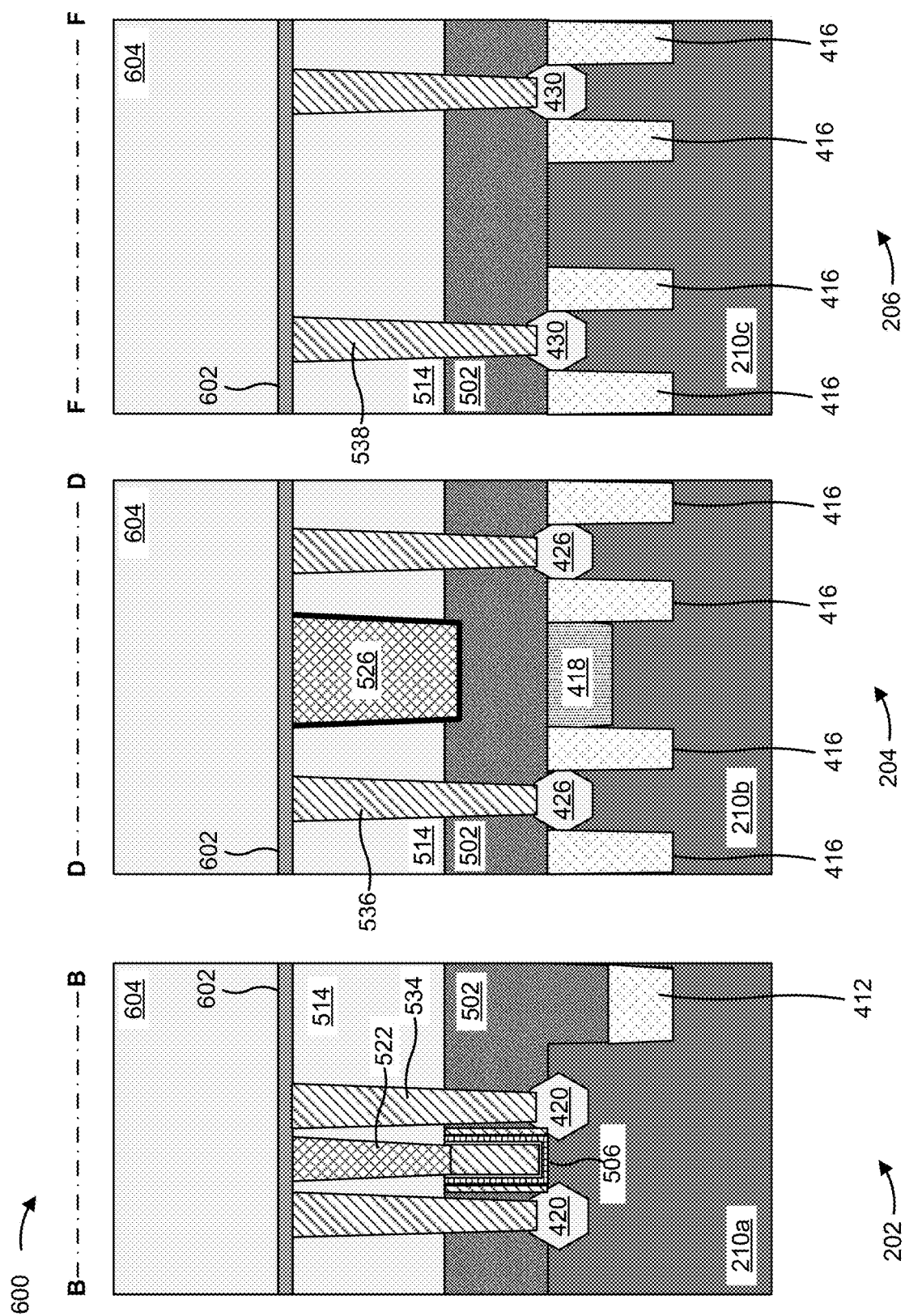

As shown in FIG. 6A, an ESL 602 is formed in the low-voltage region 202, in the high-voltage PMOS region 204, and in the high-voltage NMOS region 206. The deposition tool 102 may deposit the ESL 602 over and/or on the ILD layer 514, over and/or on the top surface of the conductive structure 522, over and/or on the top surface of the metal gate structure 526, over and/or on the top surfaces of the source/drain contacts 534, over and/or on the top surfaces of the source/drain contacts 536, and/or over and/or on the top surfaces of the source/drain contacts 538. The deposition tool 102 may deposit the ESL 602 using a CVD technique, a PVD technique, an ALD technique, a deposition technique described above in connection with FIG. 1, and/or another deposition technique. The ESL 602 may include aluminum oxide ($Al_xO_y$), an aluminum nitride ($Al_xN_y$), silicon nitride ($Si_xN_y$), a silicon oxynitride ($Si_xO_yN_y$), aluminum oxynitride (AlON), a silicon oxide ($SiO_x$), and/or another low dielectric constant (low-k) dielectric material.

As further shown in FIG. 6A, a dielectric layer 604 may be formed over and/or on the ESL 602 in the low-voltage region 202, in the high-voltage PMOS region 204, and in the high-voltage NMOS region 206. The deposition tool 102 may deposit the dielectric layer 604 using a CVD technique, a PVD technique, an ALD technique, a deposition technique described above in connection with FIG. 1, and/or another deposition technique. The dielectric layer 604 may include a silicon oxide ($SiO_x$), a phospholipase glass (PSG, silicon nitride ($Si_xN_y$), and/or another low-k dielectric material.

Figure 6B:
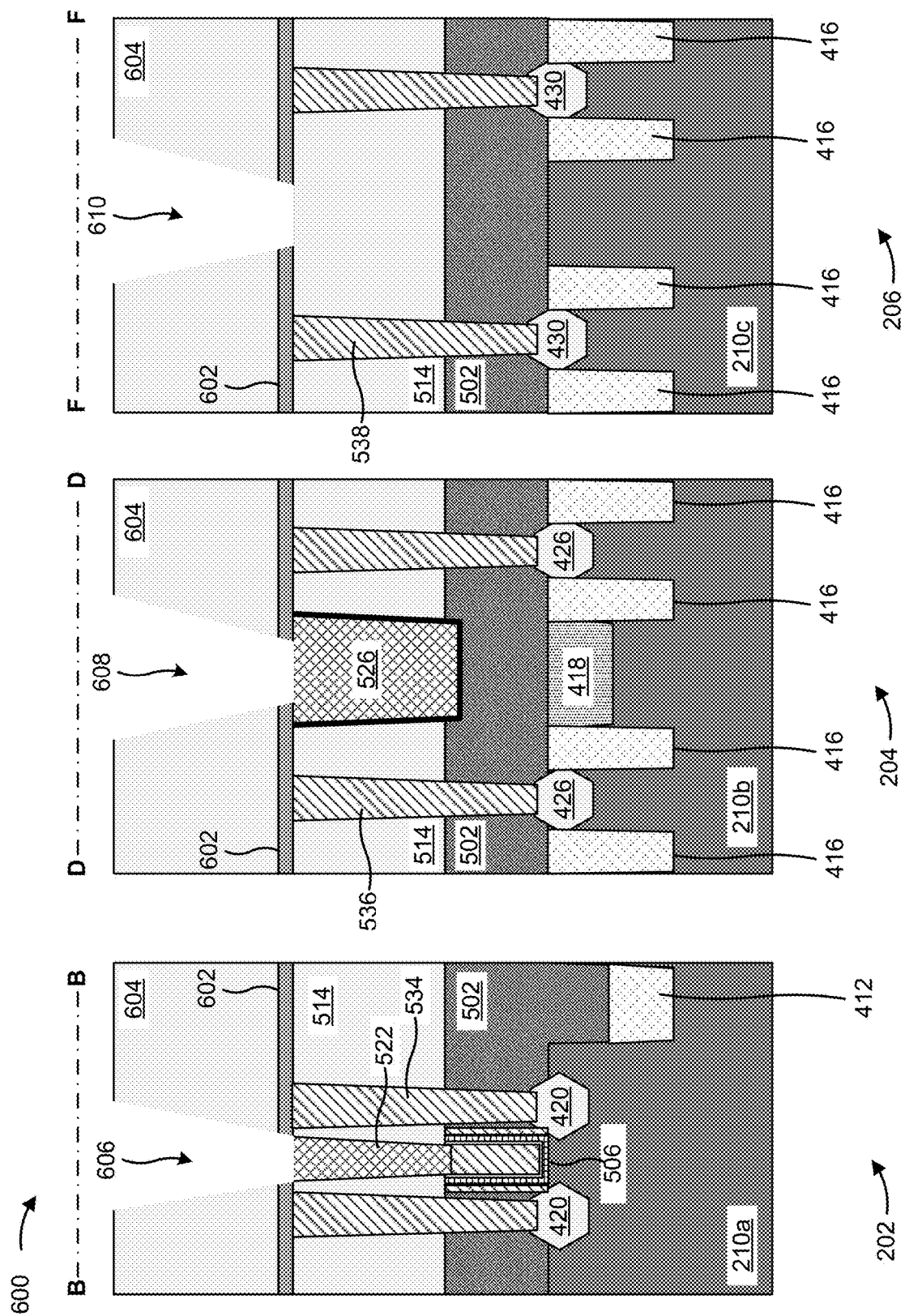

As shown in FIG. 6B, recesses (or openings) may be formed in and through the dielectric layer 604, and in and through the ESL 602. In particular, a recess 606 may be formed in and through the dielectric layer 604, and in and through the ESL 602 to the top surface of the conductive structure 522 in the low-voltage region 202. A recess 608 may be formed in and through the dielectric layer 604, and in and through the ESL 602 to the top surface of the metal gate structure 526 in the high-voltage PMOS region 204. A recess 610 may be formed in and through the dielectric layer 604, and in and through the ESL 602 between the source/drain contacts 538 in the high-voltage NMOS region 206.

In some implementations, a pattern in a photoresist layer is used to form the recesses 606-610 in the dielectric layer 604 and in the ESL 602. In these implementations, the deposition tool 102 forms the photoresist layer on the dielectric layer 604. The exposure tool 104 exposes the photoresist layer to a radiation source to pattern the photoresist layer. The developer tool 106 develops and removes portions of the photoresist layer to expose the pattern. The etch tool 108 etches into the dielectric layer 604 and into the ESL 602 to form the recesses 606-610. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the recesses 606-610 in the dielectric layer 604 and in the ESL 602 based on a pattern.

Figure 6C:
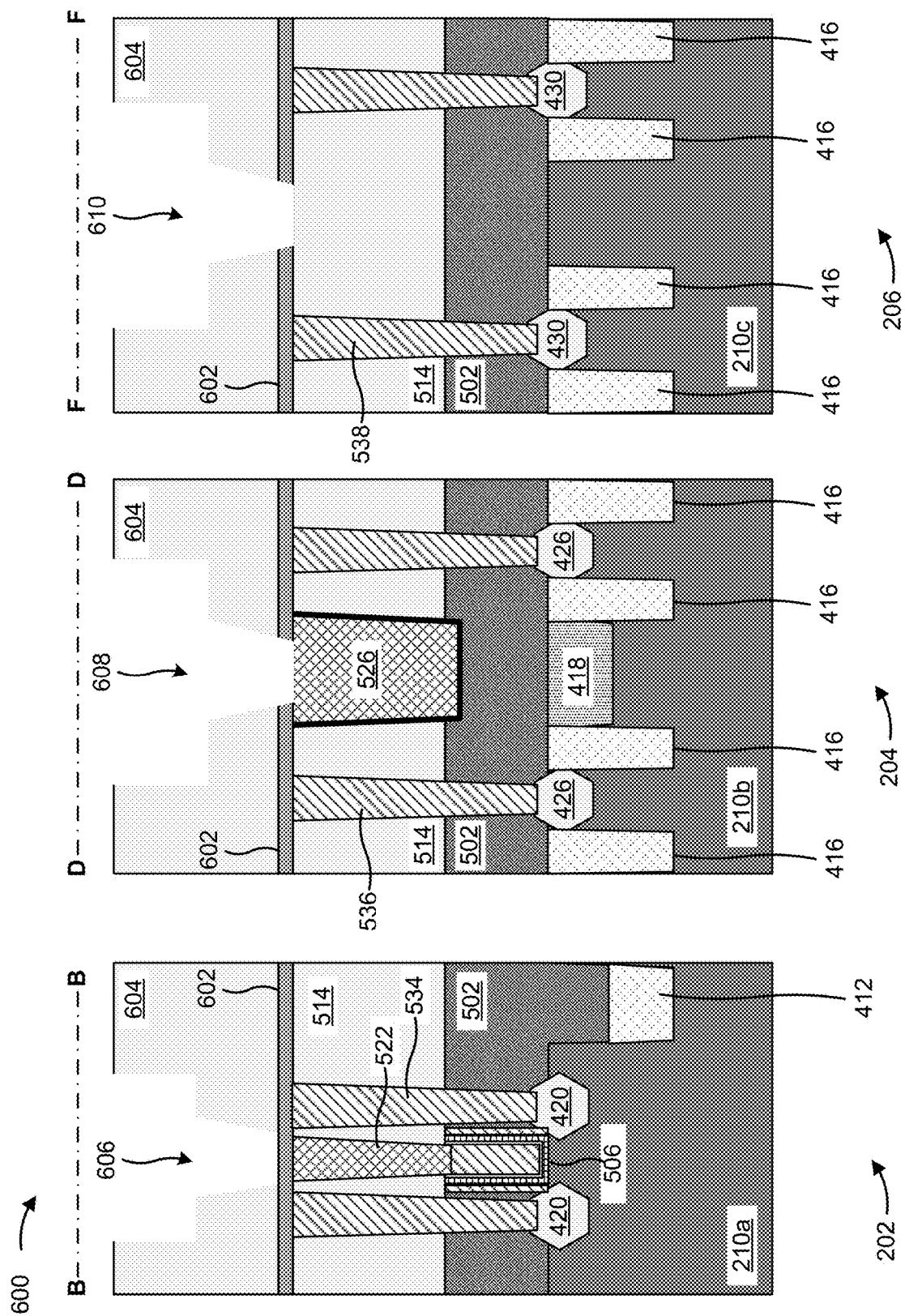

As shown in FIG. 6C, the recesses may be enlarged at the top portions of the recesses in the dielectric layer 604. In particular, the recess 606 may be enlarged at the top portion of the recess 606 in the dielectric layer 604, the recess 608 may be enlarged at the top portion of the recess 608 in the dielectric layer 604, and the recess 610 may be enlarged at the top portion of the recess 610 in the dielectric layer 604. The resulting recesses 606-610 may be shaped such that dual damascene BEOL structures may be formed in the recesses 606-610. Each of the recesses 606-610 may include a via at the bottom of the recesses 606-610 and a trench at the top of the recesses 606-610. While FIGS. 6B and 6C illustrate a "via-first" dual damascene process (e.g., the via part of the recesses 606-610 is formed first), a "trench-first" dual damascene process (e.g., the trench part of the recesses 606-610 is formed first) may be used to form the recesses 606-610.

Figure 6D:
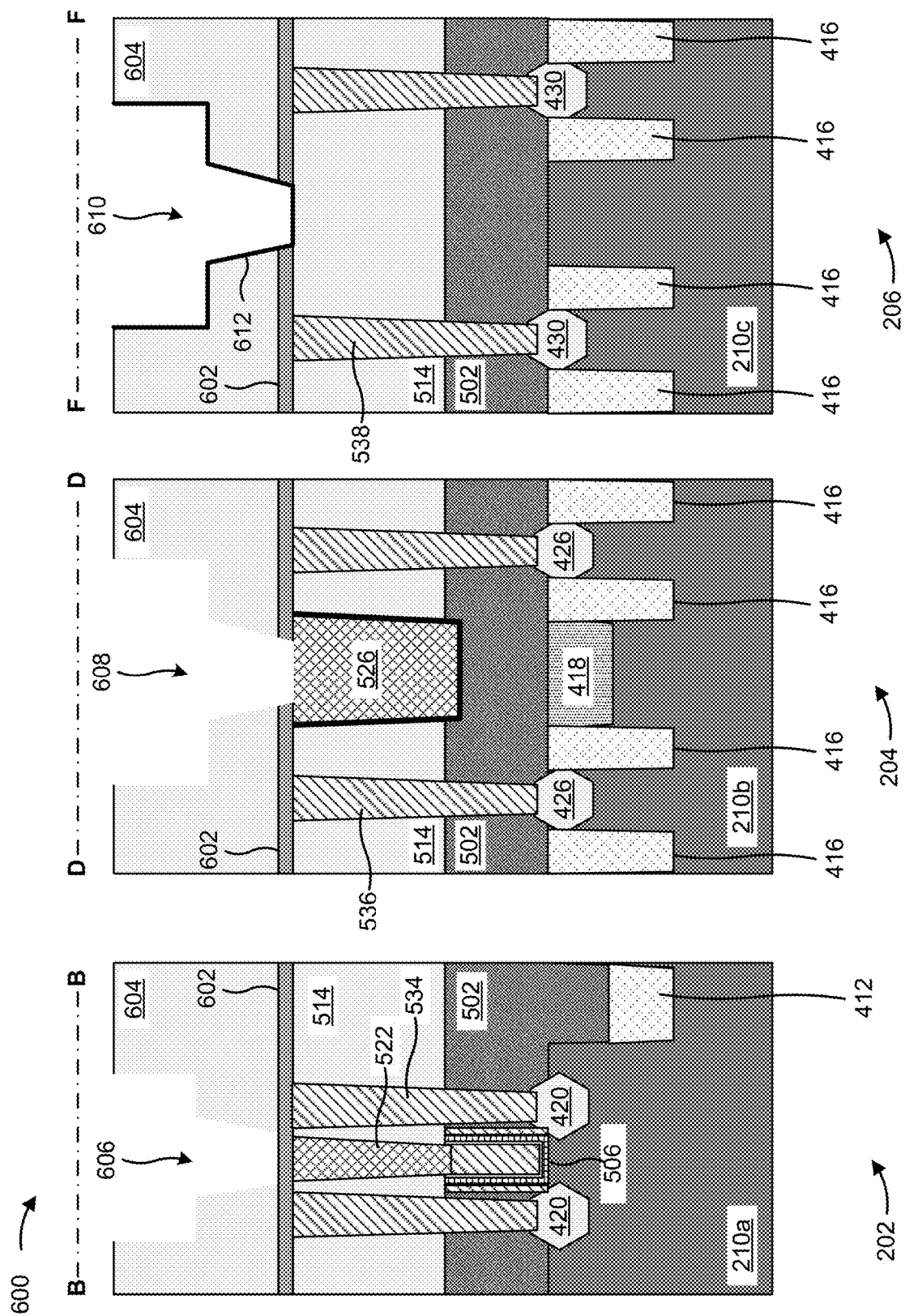

As shown in FIG. 6D, a barrier layer 612 may be formed in the recess 610 in the high-voltage NMOS region 206. The deposition tool 102 and/or the plating tool 112 may conformally deposit the barrier layer 612 to form a continuous layer of material on the sidewalls and on the bottom surface form the recess 610. The deposition tool 102 and/or the plating tool 112 deposits the barrier layer 612 using a CVD technique, a PVD technique, an ALD technique, an electroplating technique, another deposition technique described above in connection with FIG. 1, and/or a deposition technique other than as described above in connection with FIG. 1. The barrier layer 612 may be formed to a thickness that is included in a range of approximately 30 angstroms to approximately 100 angstroms to achieve continuity of the barrier layer 612 while still providing sufficient area in the recess 610 for gap filling of a conductive structure therein. However, other values for the range are within the scope of the present disclosure.

The barrier layer 612 is configured as a work function tuning layer of the gate structure 214c for the high-voltage fin-based NMOS transistor in the high-voltage NMOS region 206. The barrier layer 612 may include an n-type work function material, which may include an n-type work function metal, an n-type work function metal alloy, and/or another type of n-type work function material. The n-type work function materials that is used for the barrier layer 612 may include one or more materials having a work function that is included in a range of approximately 4.1 electron volts (eV) to approximately 4.3 eV to provide sufficient threshold voltage tuning for NMOS transistors. However, other values for the range are within the scope of the present disclosure. Examples of n-type work function materials include tantalum nitride (TaN) (having a work function in a range of approximately 4.2 eV to approximately 4.5 eV), titanium (Ti) (having a working function in a range of approximately 3.95 eV to approximately 4.33 eV), aluminum (Al) (having a work function in a range of approximately 4.06 eV to approximately 4.2 eV), tantalum (Ta) (having a work function in a range of approximately 4.0 eV to approximately 4.3 eV), and/or zirconium silicide ($ZrSi_x$ such as $ZrSi_2$) (having a work function in a range of approximately 4.0 eV to approximately 4.4 eV), among other examples. However, other materials having a working function that is close to the conduction band of silicon may be used.

Figure 6E:
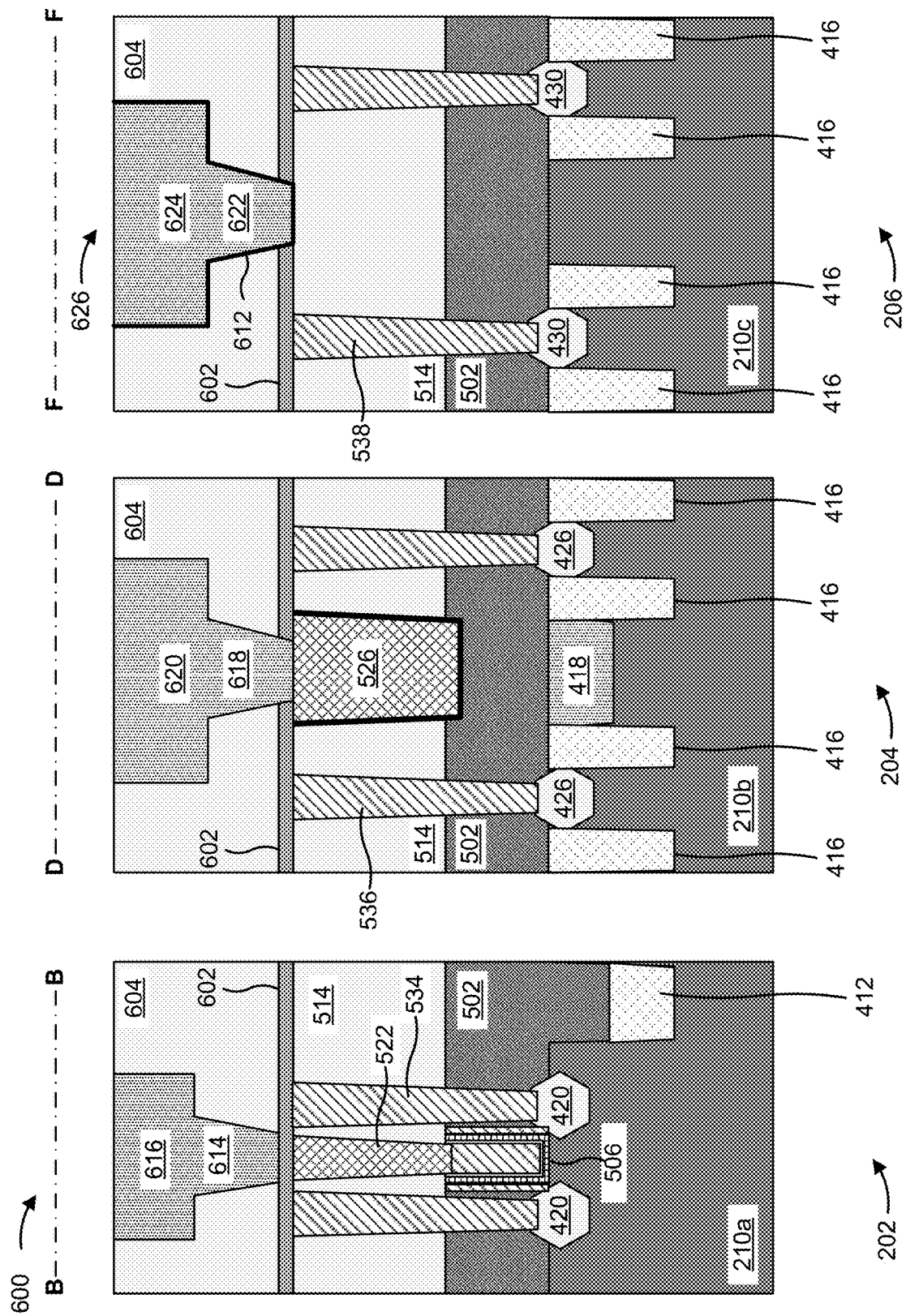

As shown in FIG. 6E, a conductive structure may be formed in the recesses 606-610. For example conductive structures including a via 614 and a metallization layer 616 may be formed in the recess 606 in the low-voltage region 202. As another example, conductive structures including a via 618 and a metallization layer 620 may be formed in the recess 608 in the high-voltage PMOS region 204. As another example, conductive structures including a via 622 and a metallization layer 624 may be formed over and/or on the barrier layer 612 in the recess 610 in the high-voltage NMOS region 206. The vias 614, 618, and 622 may be referred to as V0 vias or gate vias (VGs). The metallization layers 616, 620, and 624 may be referred to as M1 layers.

The deposition tool 102 and/or the plating tool 112 may deposit the via 614 and the metallization layer 616 to fully fill the recess 606. The deposition tool 102 and/or the plating tool 112 may deposit the via 618 and the metallization layer 620 to fully fill the recess 608. The deposition tool 102 and/or the plating tool 112 may deposit the via 622 and the metallization layer 624 to fully fill the recess 610. The deposition tool 102 and/or the plating tool 112 deposits the vias 614, 618, and 622 and the metallization layers 616, 620, and 624 using a CVD technique, a PVD technique, an ALD technique, an electroplating technique, another deposition technique described above in connection with FIG. 1, and/or a deposition technique other than as described above in connection with FIG. 1. In some implementations, one or more anneal operation is performed to reflow the material of the vias 614, 618, and 622 and/or the metallization layers 616, 620, and 624 to remove voids and/or other imperfections in the vias 614, 618, and 622 and/or the metallization layers 616, 620, and 624. In some implementations, the planarization tool 110 performs a planarization operation (e.g., a CMP operation or another type of planarization operation) to planarize the metallization layers 616, 620, and 624. The vias 614, 618, and 622 and the metallization layers 616, 620, and 624 may each include a conductive material such as ruthenium (Ru), cobalt (Co), tungsten (W), aluminum (Al), titanium (Ti), copper (Cu), another metal, a metal alloy, and/or another type of conductive material.

The via 622 and/or the metallization layer 624, in combination with the barrier layer 612, may be configured as (and may function) as a metal gate structure 626 of the high-voltage fin-based NMOS transistor. The metal gate structure 626 may correspond to the gate structure 214c. In this way, the combination of the barrier layer 612 and the via 622 and/or the metallization layer 624 function as a combination of a gate structure (e.g., that controls the operation of the channel of the high-voltage fin-based NMOS transistor) and one or more BEOL structures (e.g., a conductive structure that electrically connects the gate structure to other BEOL structures and/or I/O pins of the semiconductor device 200) without the need for a separate and/or dedicated structure (such as the gate structure 506 shown in the implementation in the low-voltage region 202) to function as the gate structure 214c of the high-voltage fin-based NMOS transistor. Thus, a dummy polysilicon gate structure and associated gate replacement process are not needed for the high-voltage fin-based NMOS transistor.

The combination of a portion of the ILD layer 502 and a portion of the ILD layer 514 under the metal gate structure 626 and between the metal gate structure 626 and the top of the fin structure 210c is configured to function as the gate oxide for the metal gate structure 626. This increases the overall height or thickness of the gate oxide for the high-voltage fin-based NMOS transistor, which provides increased gate isolation while providing sufficient ILD layer thickness for increased breakdown voltage performance for the high-voltage fin-based PMOS transistor without the need for extra processing steps to form a separate and dedicated structure for the gate oxide.

As indicated above, FIGS. 6A-6E are provided as an example. Other examples may differ from what is described with regard to FIGS. 6A-6E. The operations described in connection may be performed in a different order than illustrated in FIGS. 6A-6E. For example, the BEOL structures in the low-voltage region 202 may be formed in a set of operations that is separate from a set of operations in which the BEOL structures in the high-voltage PMOS region 204 are formed and/or from a set of operations in which the BEOL structures in the high-voltage NMOS region 206 are formed. As another example, the BEOL structures in the high-voltage PMOS region 204 may be formed in a set of operations that is separate from a set of operations in which the BEOL structures in the low-voltage region 202 are formed and/or from a set of operations in which the BEOL structures in the high-voltage NMOS region 206 are formed. As another example, the BEOL structures in the high-voltage NMOS region 206 may be formed in a set of operations that is separate from a set of operations in which the BEOL structures in the low-voltage region 202 are formed and/or from a set of operations in which the BEOL structures in the high-voltage PMOS region 204 are formed.

Figure 7:
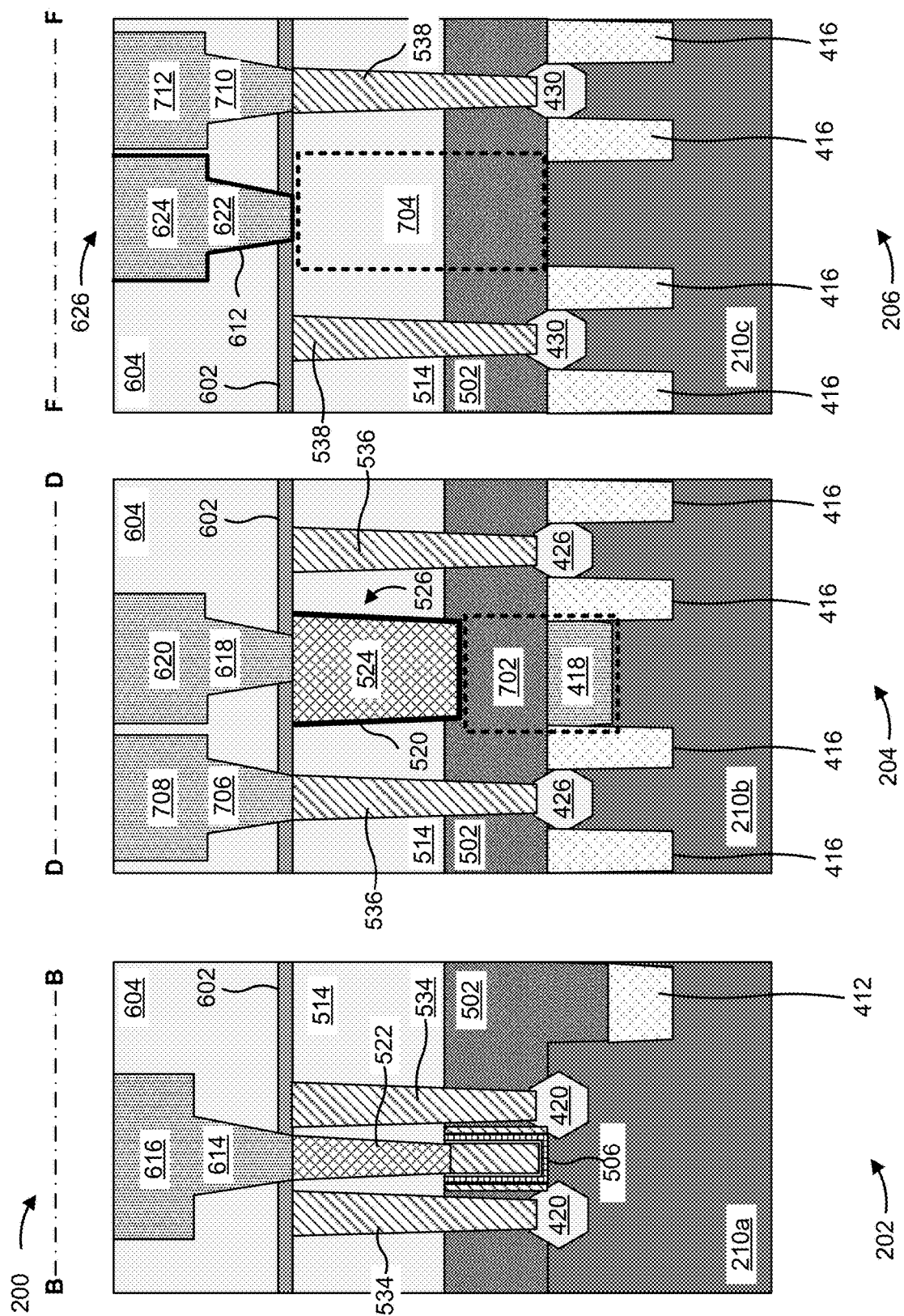
FIG. 7 is a diagram of example regions of a semiconductor device described herein.

FIG. 7 is a diagram of example regions of the semiconductor device 200 described herein. FIG. 7 may illustrate the low-voltage region 202, the high-voltage PMOS region 204, and the high-voltage NMOS region 206 after one or more operations described above in connection with FIGS. 3A-3E, 4A-4E, 5A-5I, and/or 6A-6E.

As shown in the low-voltage region 202, a low-voltage fin-based transistor may include a fin structure 210a, a low-voltage STI region 412 in the fin structure 210a, source/drain regions 420 on the fin structure 210a and on opposing sides of a gate structure 506 that wraps around the fin structure 210a on at least three sides of the fin structure 210a, and an ILD layer 502. Moreover, an MEOL region of the semiconductor device 200 in the low-voltage region 202 may include a conductive structure 522 electrically connected with the gate structure 506 and source/drain contacts 534 that are electrically connected with the source/drain regions 420. The MEOL region may also include an ILD layer 514. The BEOL region of the semiconductor device 200 in the low-voltage region 202 may include a via 614 and a metallization layer 616 electrically connected with the conductive structure 522. The via 614 and the metallization layer 616 may be included in an ESL 602 and a dielectric layer 604.

As shown in the high-voltage PMOS region 204, a high-voltage fin-based PMOS transistor may include a fin structure 210b, a plurality of high-voltage STI regions 416 in the fin structure 210b, source/drain regions 426 on the fin structure 210b and between two or more high-voltage STI region 416, a gate STI region 418 in the fin structure 210b between the source/drain regions 426 and between adjacent high-voltage STI region 416, and an ILD layer 502.

Moreover, an MEOL region of the semiconductor device 200 in the high-voltage PMOS region 204 may include a metal gate structure 526. The metal gate structure 526 is included in another ILD layer 514 (and, in some cases, in a portion of the ILD layer 502). The metal gate structure 526 includes a conductive structure 524 and a barrier layer 520 between the conductive structure 524 and the ILD layer 514. A top surface of the metal gate structure 526 is located at a height in the semiconductor device 200 that is approximately equal to or greater relative to a height of a top surface of a source/drain contact 536.

Moreover, the MEOL region may include a gate oxide region 702 between the metal gate structure 526 and the fin structure 210b. The gate oxide region 702 includes the gate STI region 418 and a portion of the ILD layer 502 between the metal gate structure 526 and the gate STI region 418. The MEOL region may also include source/drain contacts 536 that are electrically connected with the source/drain regions 426.

The BEOL region of the semiconductor device 200 in the high-voltage PMOS region 204 may include a via 618 and a metallization layer 616 electrically connected with, and in direct contact with, the metal gate structure 526. Another via 706 and another metallization layer 708 in the BEOL region may be electrically connected with one or more of the source/drain contacts 536. The vias 618 and 706, and the metallization layers 620 and 708 may be included in an ESL 602 and a dielectric layer 604.

As shown in the high-voltage NMOS region 206, a high-voltage fin-based NMOS transistor may include a fin structure 210c, a plurality of high-voltage STI regions 416 in the fin structure 210c, source/drain regions 430 on the fin structure 210c and between two or more high-voltage STI region 416, and an ILD layer 502.

The MEOL region of the semiconductor device 200 in the high-voltage NMOS region 206 may include an ILD layer 514 and source/drain contacts 538 that are electrically connected with the source/drain regions 430.

The BEOL region of the semiconductor device 200 in the high-voltage NMOS region 206 may include a metal gate structure 626 that is included in a dielectric layer 604 and in an ESL 602. The metal gate structure 626 includes a via 622 and a metallization layer 624 in the BEOL region. Moreover, the metal gate structure 626 includes a barrier layer 612 between the via 622 and the dielectric layer 604, between the via 622 and the ESL 602, and/or between the metallization layer 624 and the dielectric layer 604. A bottom surface of the metal gate structure 626 is located at a height in the semiconductor device 200 that is approximately equal to or greater relative to a height of a top surface of a source/drain contact 538. Another via 710 and another metallization layer 712 in the BEOL region may be electrically connected with one or more of the source/drain contacts 538. The vias 622 and 710, and the metallization layers 624 and 712 may be included in an ESL 602 and a dielectric layer 604.

The MEOL region may further include a gate oxide region 704 between the metal gate structure 626 in the BEOL region and the fin structure 210c. The gate oxide region 704 includes a portion of the ILD layer 502 and a portion of the ILD layer 514 between the metal gate structure 626 and the top of the fin structure 210c. A portion of the gate oxide region 704 corresponding to the portion of the ILD layer 502 is directly on a portion of the fin structure 210c that is between the source/drain regions 430. The gate oxide region 704 may fully extend between the top and bottom surfaces of a source/drain contact 538.

As indicated above, FIG. 7 is provided as an example. Other examples may differ from what is described with regard to FIG. 7.

Figure 8A:
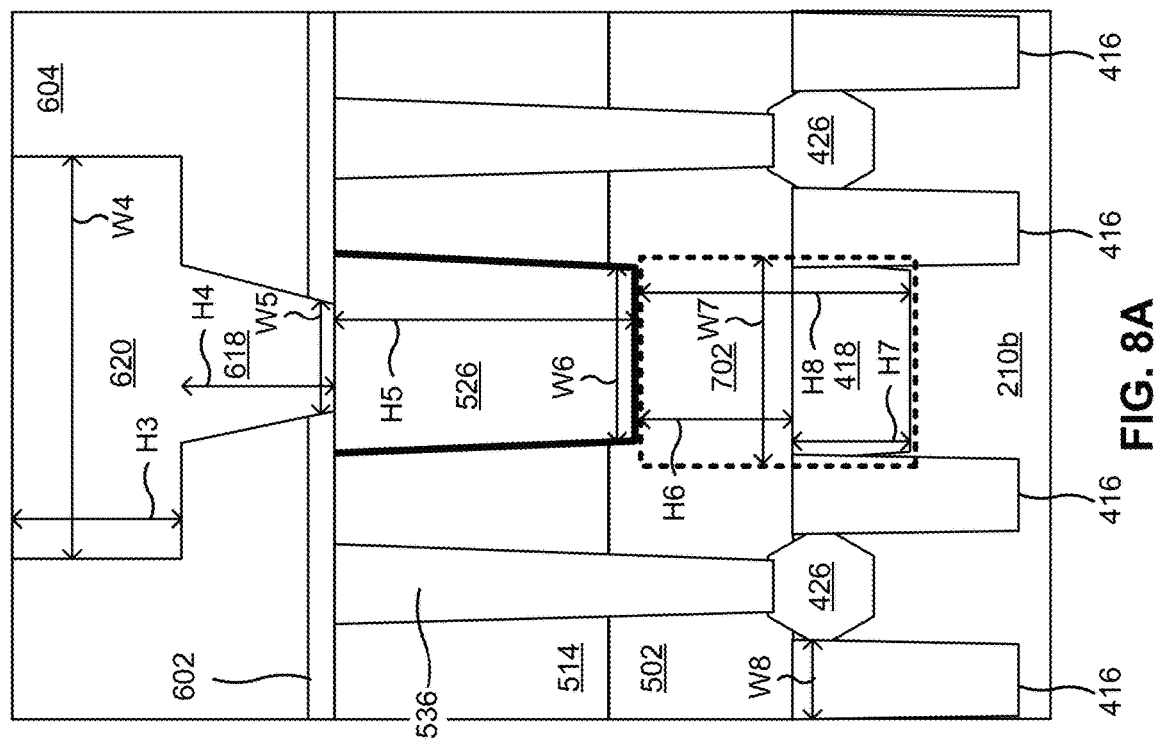
FIGS. 8A and 8B are diagrams of example dimensions of a semiconductor device described herein.
Figure 8B:
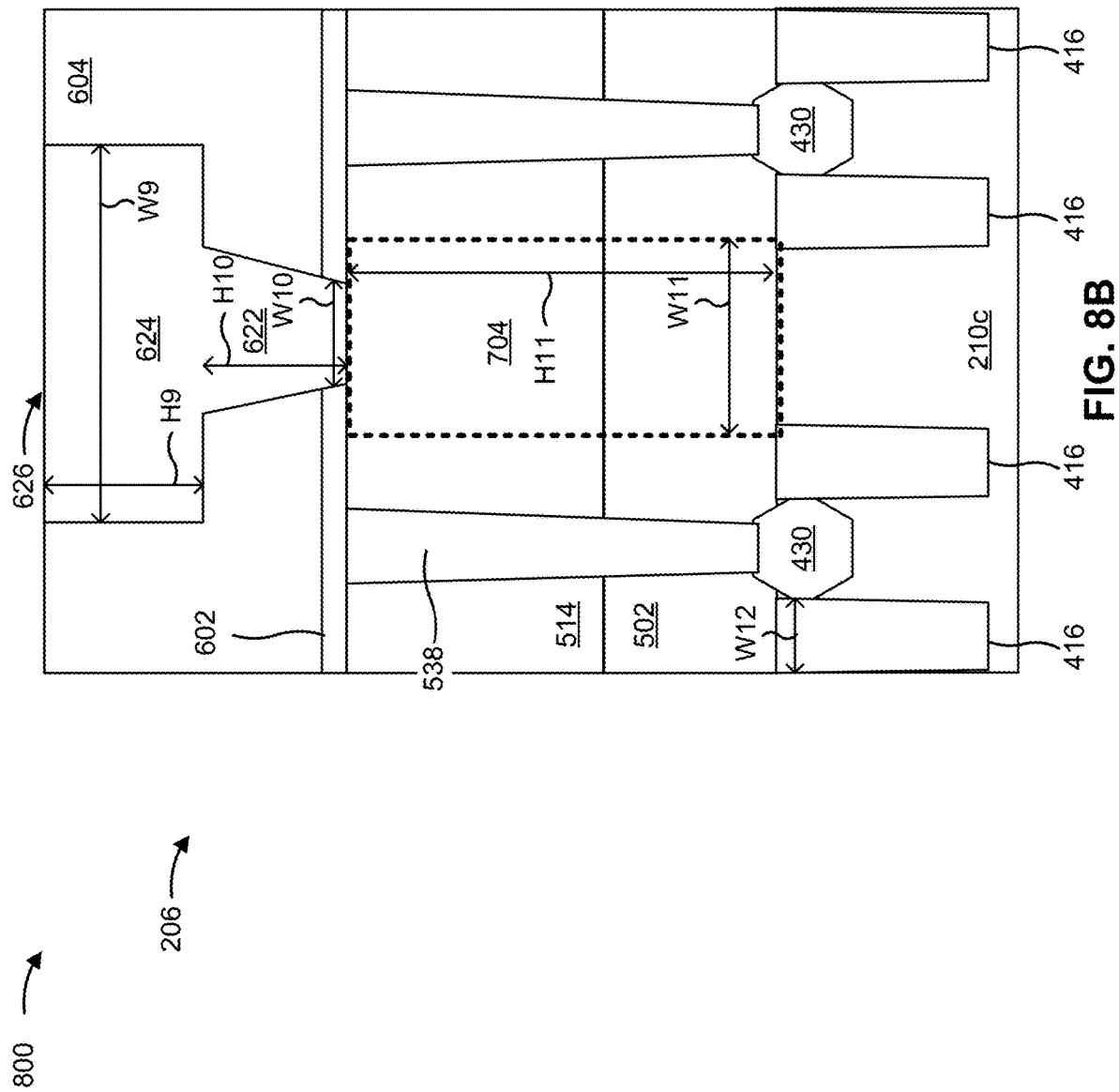

FIGS. 8A and 8B are diagrams of an example 800 of dimensions of the semiconductor device 200 described herein. FIG. 8A illustrates various dimensions of structures and/or layers in the high-voltage PMOS region 204. FIG. 8B illustrates various dimensions of structures and/or layers in the high-voltage NMOS region 206.

As shown in FIG. 8A, an example dimension in the high-voltage PMOS region 204 may include a width W4 of a metallization layer 620. In some implementations, the width W4 of the metallization layer 620 may be included in a range of approximately 40 nanometers to approximately 100 nanometers to provide sufficient contact area for higher BEOL structures and sufficiently low contact resistance while maintaining sufficiently high device density in the semiconductor device 200. However, other values for the range are within the scope of the present disclosure. Another example dimension in the high-voltage PMOS region 204 may include a width W5 of a bottom surface of a via 618. In some implementations, the width W5 of the bottom surface of the via 618 may be included in a range of approximately 30 nanometers to approximately 40 nanometers to provide sufficient contact area for higher BEOL structures and sufficiently low contact resistance while maintaining sufficiently high device density in the semiconductor device 200. However, other values for the range are within the scope of the present disclosure.

Another example dimension in the high-voltage PMOS region 204 may include a height H3 of a metallization layer 620. In some implementations, the height H3 of the metallization layer 620 may be included in a range of approximately 550 angstroms to approximately 700 angstroms to provide sufficiently low contact resistance while maintaining sufficiently high device density in the semiconductor device 200. However, other values for the range are within the scope of the present disclosure. Another example dimension in the high-voltage PMOS region 204 may include a height H4 of a via 618. In some implementations, the height H4 of the via 618 may be included in a range of approximately 350 angstroms to approximately 500 angstroms to provide sufficiently low contact resistance while maintaining sufficiently high device density in the semiconductor device 200. However, other values for the range are within the scope of the present disclosure.

Another example dimension in the high-voltage PMOS region 204 may include a width W6 of a bottom surface of a metal gate structure 526. In some implementations, the width W6 of the bottom surface of the metal gate structure 526 may be included in a range of approximately 40 nanometers to approximately 80 nanometers to enable the metal gate structure 526 to operate at a sufficiently high gate voltage while providing a sufficient isolation between the metal gate structure 526 and the adjacent source/drain contacts 536. However, other values for the range are within the scope of the present disclosure. Another example dimension in the high-voltage PMOS region 204 may include a height H5 of a metal gate structure 526. In some implementations, the height H5 of the metal gate structure 526 may be included in a range of approximately 500 angstroms to approximately 600 angstroms to enable the metal gate structure 526 to operate at a sufficiently high gate voltage while providing a sufficient distance between the metal gate structure 526 and the fin structure 210*b*. However, other values for the range are within the scope of the present disclosure.

Another example dimension in the high-voltage PMOS region 204 may include a width W7 of a gate oxide region 702. In some implementations, the width W7 of the gate oxide region 702 may be included in a range of approximately 0.5 microns to approximately 3 microns to provide sufficient gate isolation while providing a sufficient isolation between the gate oxide region 702 and the adjacent source/drain contacts 536. However, other values for the range are within the scope of the present disclosure. Another example dimension in the high-voltage PMOS region 204 may include a height H6 of a portion of the gate oxide region 702 corresponding to the ILD layer 502. In some implementations, the height H6 may be included in a range of approximately 200 angstroms to approximately 300 angstroms to enable the metal gate structure 526 to operate at a sufficiently high gate voltage while providing a sufficient distance between the metal gate structure 526 and the fin structure 210*b*. However, other values for the range are within the scope of the present disclosure.

Another example dimension in the high-voltage PMOS region 204 may include a height H7 of a portion of the gate oxide region 702 corresponding to the gate STI region 418. In some implementations, the height H7 may be included in a range of approximately 500 angstroms to approximately 700 angstroms to enable the metal gate structure 526 to operate at a sufficiently high gate voltage while providing a sufficient distance between the metal gate structure 526 and the fin structure 210*b*. However, other values for the range are within the scope of the present disclosure. Another example dimension in the high-voltage PMOS region 204 may include a height H8 of the gate oxide region 702. In some implementations, the height H8 of the gate oxide region 702 may be included in a range of approximately 700 angstroms to approximately 1,000 angstroms to enable the metal gate structure 526 to operate at a sufficiently high gate voltage while providing a sufficient distance between the metal gate structure 526 and the fin structure 210*b*. However, other values for the range are within the scope of the present disclosure.

Another example dimension in the high-voltage PMOS region 204 may include a ratio between the width W7 of the gate oxide region 702 to the height H8 of the gate oxide region 702. In some implementations, the ratio is included in a range of approximately 43:1 to approximately 5:1 to enable the metal gate structure 526 to operate at a sufficiently high gate voltage while providing a sufficient distance between the metal gate structure 526 and the fin structure 210*b*. However, other values for the range are within the scope of the present disclosure. Another example dimension in the high-voltage PMOS region 204 may include a ratio between the height H8 of the gate oxide region 702 to a height H5 of the metal gate structure 526. In some implementations, the ratio is included in a range of approximately 1.17:1 to approximately 2:1 to enable the metal gate structure 526 to operate at a sufficiently high breakdown voltage while providing a sufficient distance between the metal gate structure 526 and the fin structure 210*b*. However, other values for the range are within the scope of the present disclosure.

Another example dimension in the high-voltage PMOS region 204 may include a width W8 of a high-voltage STI region 416. In some implementations, the width W8 of the high-voltage STI region 416 may be included in a range of approximately 40 nanometers to approximately 60 nanometers to provide sufficient electrical isolation between the source/drain regions 426 and between the source/drain regions 426 and the metal gate structure 526. However, other values for the range are within the scope of the present disclosure.

As shown in FIG. 8B, an example dimension in the high-voltage NMOS region 206 may include a width W9 of a metallization layer 624. In some implementations, the width W9 of the metallization layer 624 may be included in a range of approximately 40 nanometers to approximately 100 nanometers to provide sufficient contact area for higher BEOL structures and to enable a high-voltage fin-based NMOS transistor to operate at a sufficiently high gate voltage while maintaining sufficiently high device density in the semiconductor device 200. However, other values for the range are within the scope of the present disclosure. Another example dimension in the high-voltage PMOS region 204 may include a width W10 of a bottom surface of a via 622. In some implementations, the width W10 of the bottom surface of the via 622 may be included in a range of approximately 30 nanometers to approximately 40 nanometers to provide sufficient contact area for higher BEOL structures and to enable a high-voltage fin-based NMOS transistor to operate at a sufficiently high gate voltage while maintaining sufficiently high device density in the semiconductor device 200. However, other values for the range are within the scope of the present disclosure.

Another example dimension in the high-voltage NMOS region 206 may include a height H9 of a metallization layer 624. In some implementations, the height H9 of the metallization layer 624 may be included in a range of approximately 550 angstroms to approximately 700 angstroms to enable a high-voltage fin-based NMOS transistor to operate at a sufficiently high gate voltage while maintaining sufficiently high device density in the semiconductor device 200. However, other values for the range are within the scope of the present disclosure. Another example dimension in the high-voltage NMOS region 206 may include a height H10 of a via 622. In some implementations, the height H10 of the via 622 may be included in a range of approximately 350 angstroms to approximately 500 angstroms to enable a high-voltage fin-based NMOS transistor to operate at a sufficiently high gate voltage while maintaining sufficiently high device density in the semiconductor device 200. However, other values for the range are within the scope of the present disclosure.

Another example dimension in the high-voltage NMOS region 206 may include a width W10 of a gate oxide region 704. In some implementations, the width W10 of the gate oxide region 704 may be included in a range of approximately 0.5 microns to approximately 3 microns to provide sufficient gate isolation while providing a sufficient isolation between the gate oxide region 704 and the adjacent source/drain contacts 538. However, other values for the range are within the scope of the present disclosure. Another example dimension in the high-voltage NMOS region 206 may include a height H11 of the gate oxide region 704. In some implementations, the height H11 of the gate oxide region 704 may be included in a range of approximately 800 angstroms to approximately 1,000 angstroms to enable the metal gate structure 626 to operate at a sufficiently high gate voltage while providing a sufficient distance between the metal gate structure 626 and the fin structure 210c. However, other values for the range are within the scope of the present disclosure.

Another example dimension in the high-voltage PMOS region 204 may include a ratio between the width W11 of the gate oxide region 704 to the height H11 of the gate oxide region 704. In some implementations, the ratio is included in a range of approximately 37:1 to approximately 5:1 to enable the metal gate structure 526 to operate at a sufficiently high gate voltage and breakdown voltage while providing a sufficient distance between the metal gate structure 626 and the fin structure 210c.

Another example dimension in the high-voltage NMOS region 206 may include a width W12 of a high-voltage STI region 416. In some implementations, the width W12 of the high-voltage STI region 416 may be included in a range of approximately 40 nanometers to approximately 60 nanometers to provide sufficient electrical isolation between the source/drain regions 430 and between the source/drain regions 430 and the metal gate structure 626. However, other values for the range are within the scope of the present disclosure.

As indicated above, FIGS. 8A and 8B are provided as examples. Other examples may differ from what is described with regard to FIGS. 8A and 8B.

Figure 9:
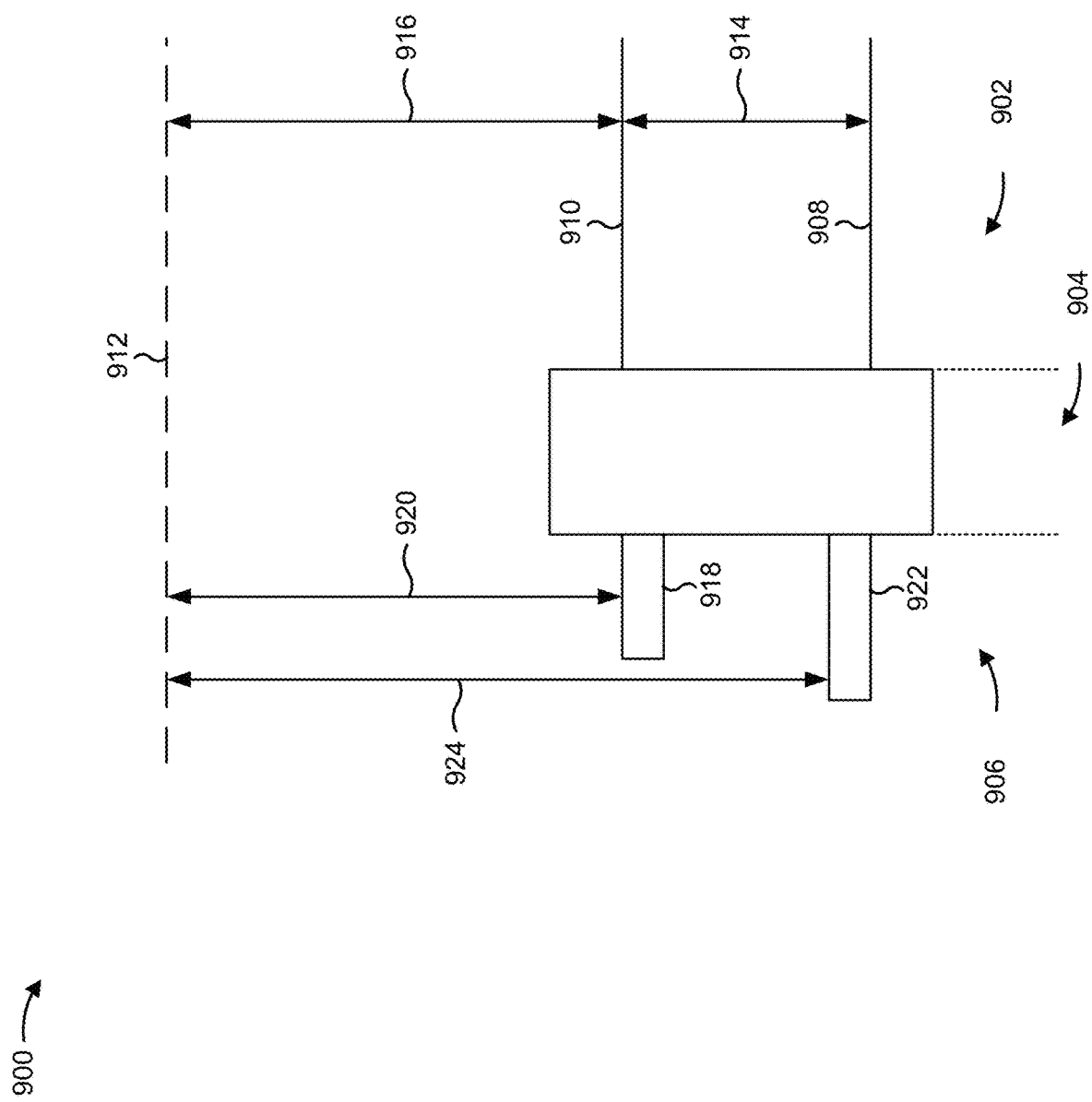
FIG. 9 is a diagram of an example of band gap properties of work function materials described herein.

FIG. 9 is a diagram of an example 900 of band gap properties of work function materials described herein. The band gap properties may be illustrated in connection with a junction between a fin structure region 902 (e.g., a fin structure 210a-210c) and an ILD layer region 904 (e.g., the ILD layer 502, the ILD layer 514), and between the ILD layer, and a junction between the ILD layer region 904 and a gate structure region 906 (e.g., a gate structure 214a-214c, a gate structure 506, a metal gate structure 526, a metal gate structure 626).

As shown in FIG. 9, a fin structure region 902 illustrates various band gap properties of a silicon-containing fin structure. The band gap properties may include a valence band 908 ($E_V$), a conduction band 910 ($E_C$), and a vacuum level ($E_{VAC}$) 912. The difference between the valence band 908 and the conduction band 910 is referred to as the energy gap ($E_g$) 914. The difference between the conduction band 910 and the vacuum level 912 is referred to as the electron affinity (EA) 916. In some implementations, silicon may have an energy gap 914 of approximately 1.12 eV and an electron affinity 916 of approximately 4.1 eV.

N-type work function materials 918 that are selected for the barrier layer 612 of the metal gate structures 626 for the high-voltage fin-based NMOS transistors described herein may have a work function 920 at or near the conduction band 910 of silicon. In other words, the N-type work function materials 918 that are selected for the barrier layer 612 of the metal gate structures 626 for the high-voltage fin-based NMOS transistors described herein may have a work function 920 that is similar to the electron affinity 916 of silicon.

P-type work function materials 922 that are selected for the barrier layer 520 of the metal gate structures 526 for the high-voltage fin-based PMOS transistors described herein may have a work function 924 at or near the valence band 908 of silicon. In other words, the P-type work function materials 922 that are selected for the barrier layer 520 of the metal gate structures 526 for the high-voltage fin-based PMOS transistors described herein may have a work function 924 that is similar to a combination of the electron affinity 916 of silicon and the energy gap 914 of silicon.

As indicated above, FIG. 9 is provided as an example. Other examples may differ from what is described with regard to FIG. 9.

Figure 10:
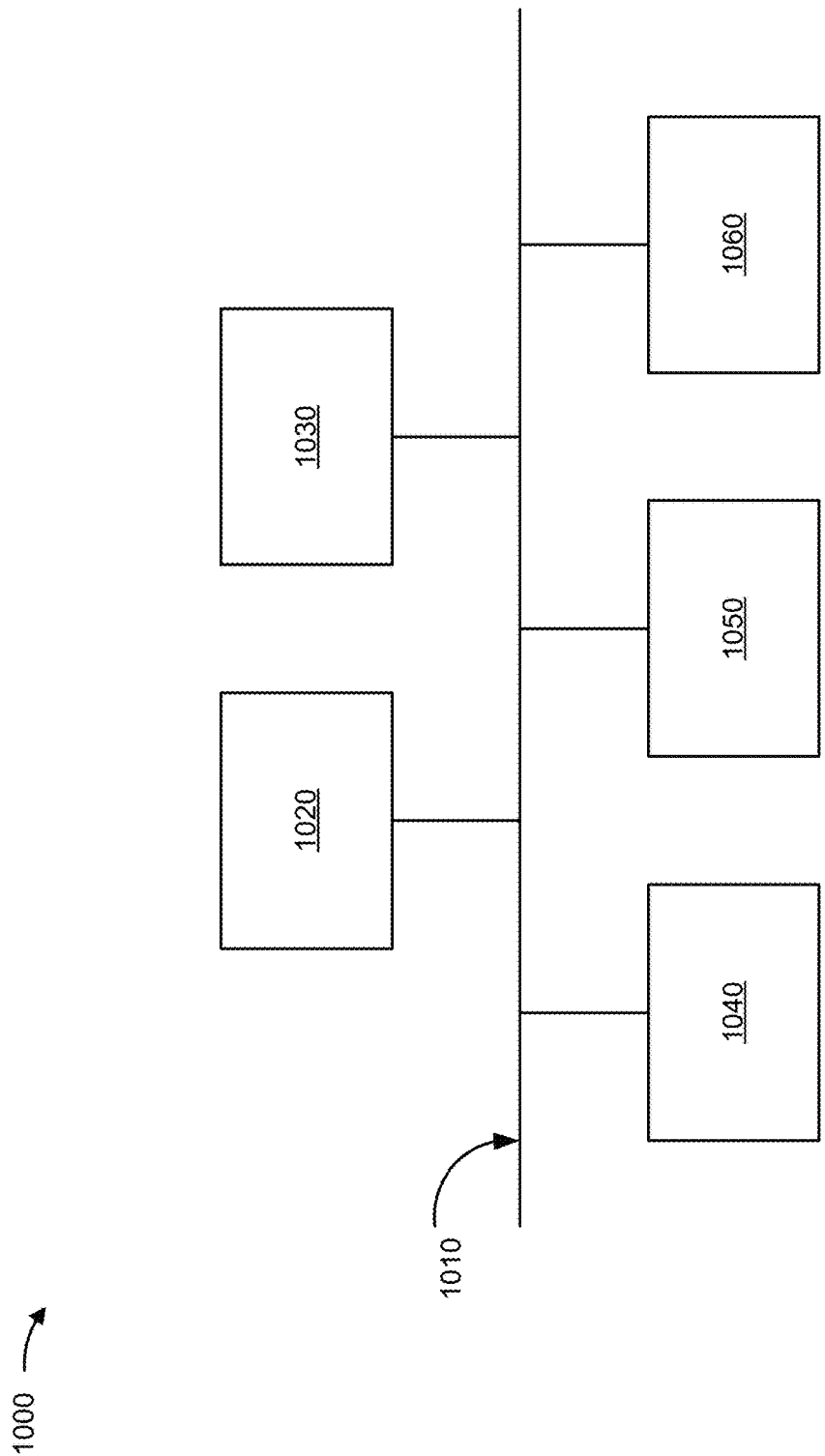
FIG. 10 is a diagram of example components of one or more devices of FIG. 1 described herein.

FIG. 10 is a diagram of example components of a device 1000. In some implementations, one or more of the semiconductor processing tools 102-112 and/or the wafer/die transport tool 114 may include one or more devices 1000 and/or one or more components of device 1000. As shown in FIG. 10, device 1000 may include a bus 1010, a processor 1020, a memory 1030, an input component 1040, an output component 1050, and a communication component 1060.

Bus 1010 includes one or more components that enable wired and/or wireless communication among the components of device 1000. Bus 1010 may couple together two or more components of FIG. 10, such as via operative coupling, communicative coupling, electronic coupling, and/or electric coupling. Processor 1020 includes a central processing unit, a graphics processing unit, a microprocessor, a controller, a microcontroller, a digital signal processor, a field-programmable gate array, an application-specific integrated circuit, and/or another type of processing component. Processor 1020 is implemented in hardware, firmware, or a combination of hardware and software. In some implementations, processor 1020 includes one or more processors capable of being programmed to perform one or more operations or processes described elsewhere herein.

Memory 1030 includes volatile and/or nonvolatile memory. For example, memory 1030 may include random access memory (RAM), read only memory (ROM), a hard disk drive, and/or another type of memory (e.g., a flash memory, a magnetic memory, and/or an optical memory). Memory 1030 may include internal memory (e.g., RAM, ROM, or a hard disk drive) and/or removable memory (e.g., removable via a universal serial bus connection). Memory 1030 may be a non-transitory computer-readable medium. Memory 1030 stores information, instructions, and/or software (e.g., one or more software applications) related to the operation of device 1000. In some implementations, memory 1030 includes one or more memories that are coupled to one or more processors (e.g., processor 1020), such as via bus 1010.

Input component 1040 enables device 1000 to receive input, such as user input and/or sensed input. For example, input component 1040 may include a touch screen, a keyboard, a keypad, a mouse, a button, a microphone, a switch, a sensor, a global positioning system sensor, an accelerometer, a gyroscope, and/or an actuator. Output component 1050 enables device 1000 to provide output, such as via a display, a speaker, and/or a light-emitting diode. Communication component 1060 enables device 1000 to communicate with other devices via a wired connection and/or a wireless connection. For example, communication component 1060 may include a receiver, a transmitter, a transceiver, a modem, a network interface card, and/or an antenna.

Device 1000 may perform one or more operations or processes described herein. For example, a non-transitory computer-readable medium (e.g., memory 1030) may store a set of instructions (e.g., one or more instructions or code) for execution by processor 1020. Processor 1020 may execute the set of instructions to perform one or more operations or processes described herein. In some implementations, execution of the set of instructions, by one or more processors 1020, causes the one or more processors 1020 and/or the device 1000 to perform one or more operations or processes described herein. In some implementations, hardwired circuitry is used instead of or in combination with the instructions to perform one or more operations or processes described herein. Additionally, or alternatively, processor 1020 may be configured to perform one or more operations or processes described herein. Thus, implementations described herein are not limited to any specific combination of hardware circuitry and software.

The number and arrangement of components shown in FIG. 10 are provided as an example. Device 1000 may include additional components, fewer components, different components, or differently arranged components than those shown in FIG. 10. Additionally, or alternatively, a set of components (e.g., one or more components) of device 1000 may perform one or more functions described as being performed by another set of components of device 1000.

Figure 11:
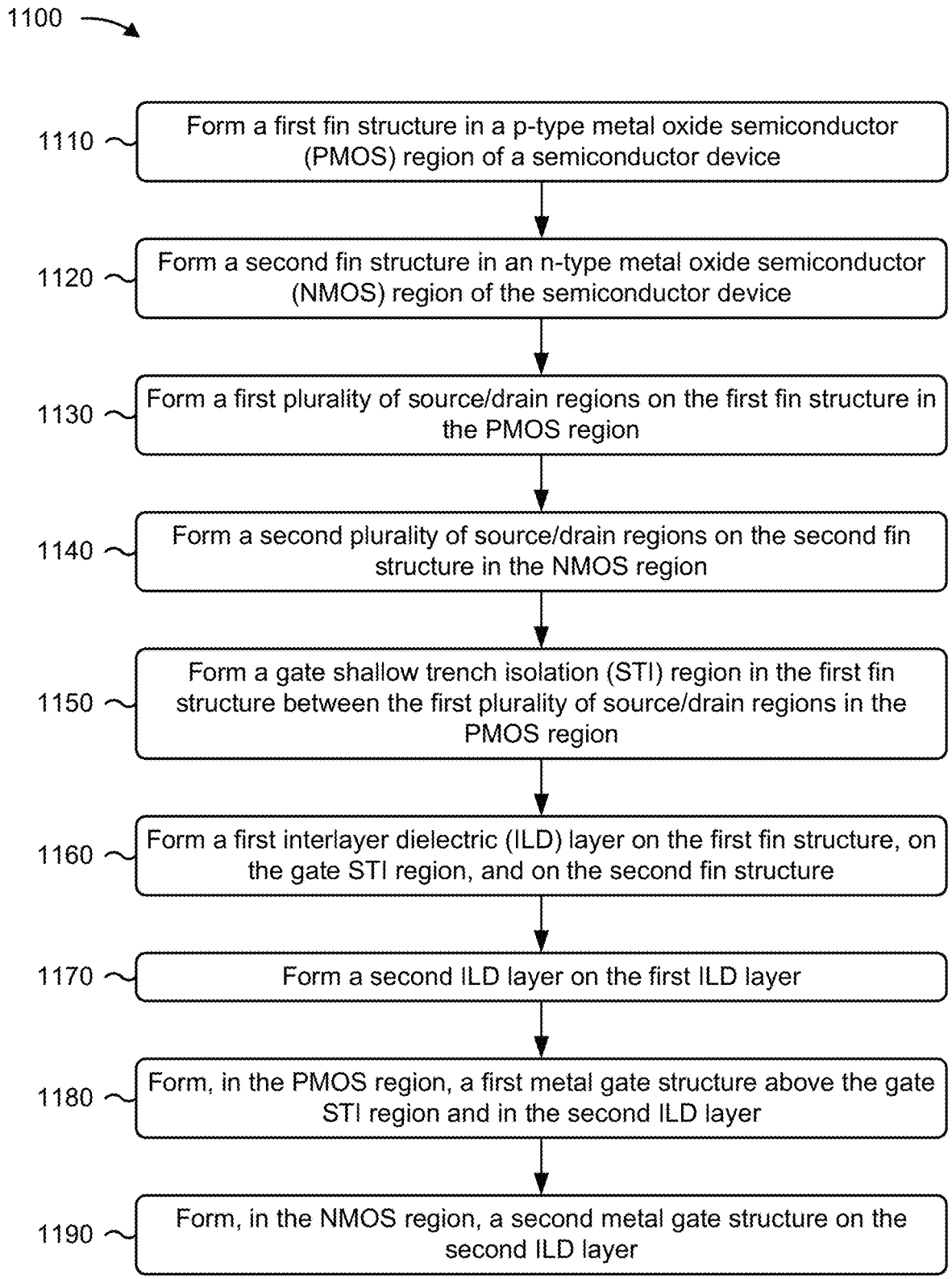
FIG. 11 is a flowchart of an example process associated with forming a semiconductor device described herein.

FIG. 11 is a flowchart of an example process 1100 associated with forming a semiconductor device described herein. In some implementations, one or more process blocks of FIG. 11 are performed by one or more semiconductor processing tools (e.g., one or more of the semiconductor processing tools 102-112). Additionally, or alternatively, one or more process blocks of FIG. 11 may be performed by one or more components of device 1000, such as processor 1020, memory 1030, input component 1040, output component 1050, and/or communication component 1060.

As shown in FIG. 11, process 1100 may include forming a first fin structure in a PMOS region of a semiconductor device (block 1110). For example, one or more of the semiconductor processing tools 102-112 may form a first fin structure 210*b* in a PMOS region (e.g., a high-voltage PMOS region 204) of a semiconductor device 200, as described above.

As further shown in FIG. 11, process 1100 may include forming a second fin structure in an NMOS region of the semiconductor device (block 1120). For example, one or more of the semiconductor processing tools 102-112 may form a second fin structure 210*c* in an NMOS region (e.g., a high-voltage NMOS region 206) of the semiconductor device 200, as described above.

As further shown in FIG. 11, process 1100 may include forming a first plurality of source/drain regions on the first fin structure in the PMOS region (block 1130). For example, one or more of the semiconductor processing tools 102-112 may form a first plurality of source/drain regions 426 on the first fin structure 210*b* in the PMOS region, as described above.

As further shown in FIG. 11, process 1100 may include forming a second plurality of source/drain regions on the second fin structure in the NMOS region (block 1140). For example, one or more of the semiconductor processing tools 102-112 may form a second plurality of source/drain regions 430 on the second fin structure 210*c* in the NMOS region, as described above.

As further shown in FIG. 11, process 1100 may include forming a gate STI region in the first fin structure between the first plurality of source/drain regions in the PMOS region (block 1150). For example, one or more of the semiconductor processing tools 102-112 may form a gate STI region 418 in the first fin structure 210*b* between the first plurality of source/drain regions 426 in the PMOS region, as described above.

As further shown in FIG. 11, process 1100 may include forming a first ILD layer on the first fin structure, on the gate STI region, and on the second fin structure (block 1160). For example, one or more of the semiconductor processing tools 102-112 may form a first ILD layer 502 on the first fin structure 210*b*, on the gate STI region 418, and on the second fin structure 210*c*, as described above.

As further shown in FIG. 11, process 1100 may include forming a second ILD layer on the first ILD layer (block 1170). For example, one or more of the semiconductor processing tools 102-112 may form a second ILD layer 514 on the first ILD layer 502, as described above.

As further shown in FIG. 11, process 1100 may include forming, in the PMOS region, a first metal gate structure above the gate STI region and in the second ILD layer (block 1180). For example, one or more of semiconductor processing tools 102-112 may form, in the PMOS region, a first metal gate structure 526 above the gate STI region 418 and in the second ILD layer 514, as described above.

As further shown in FIG. 11, process 1100 may include forming, in the NMOS region, a second metal gate structure on the second ILD layer (block 1190). For example, one or more of the semiconductor processing tools 102-112 may form, in the NMOS region, a second metal gate structure 626 on the second ILD layer 514, as described above.

Process 1100 may include additional implementations, such as any single implementation or any combination of implementations described below and/or in connection with one or more other processes described elsewhere herein.

In a first implementation, forming the first ILD layer 502 includes forming a first portion of the first ILD layer 502 directly on a second portion of the second fin structure 210*c* that is between the second plurality of source/drain regions 430, and forming the second ILD layer 514 includes forming a third portion of the second ILD layer 514 directly on the first portion of the first ILD layer 502. In a second implementation, alone or in combination with the first implementation, forming the first ILD layer 502 forming the first ILD layer 502 without forming another gate STI region between the second plurality of source/drain regions 430 in the NMOS region. In a third implementation, alone or in combination with one or more of the first and second implementations, forming the second metal gate structure 626 includes forming the second metal gate structure 626 as a dual damascene structure in a back end of line region in the NMOS region.

In a fourth implementation, alone or in combination with one or more of the first through third implementations, forming the first metal gate structure 526 includes forming the first metal gate structure 526 directly without first forming a dummy polysilicon gate structure for the first metal gate structure 526, and forming the second metal gate structure 626 includes forming the second metal gate structure 626 directly without first forming a dummy polysilicon gate structure for the first metal gate structure 626. In a fifth implementation, alone or in combination with one or more of the first through fourth implementations, a bottom surface of the second metal gate structure 626 is positioned at a height in the semiconductor device 200 that is approximately equal to or greater relative to a height of a position of a top surface of the first metal gate structure 526 in the semiconductor device.

Although FIG. 11 shows example blocks of process 1100, in some implementations, process 1100 includes additional blocks, fewer blocks, different blocks, or differently arranged blocks than those depicted in FIG. 11. Additionally, or alternatively, two or more of the blocks of process 1100 may be performed in parallel.

In this way, ILD layer(s) of a semiconductor device are configured as the gate oxide for high-voltage fin-based PMOS transistors and high-voltage fin-based NMOS transistors, and therefore additional process operations to deposit dedicated gate oxide layers are not needed. Moreover, additional processing operations to form the gate structures of the high-voltage fin-based PMOS transistors and high-voltage fin-based NMOS transistors are not needed in that the gate contact (MP) process and BEOL processes can be used as the gate formation process of the high-voltage fin-based PMOS transistors and high-voltage fin-based NMOS transistors. These process optimizations reduce semiconductor device processing complexity and cost in that fewer processing steps are needed to form the high-voltage fin-based PMOS transistors and high-voltage fin-based NMOS transistors of the semiconductor device. Moreover, using the ILD layer(s) as the gate oxide enables the gate oxide to be formed to a greater thickness without thinning the ILD layer(s). This provides ILD layer(s) of sufficient thickness, which provides sufficient gate isolation with minimal impact to breakdown voltage. This may reduce gate leakage and/or may increase yield for high-voltage fin-based PMOS transistors and high-voltage fin-based NMOS transistors, among other examples.

As described in greater detail above, some implementations described herein provide a semiconductor device. The semiconductor device includes a first fin structure and a second fin structure extending above a substrate. The semiconductor device includes a first source/drain region and a second source/drain region, respectively disposed on the first and second fin structures. The semiconductor device includes a gate STI region in the fin structure between the first source/drain region and the second source/drain region. The semiconductor device includes a metal gate structure disposed over the portion of the STI region. The semiconductor device an ILD layer over the first and second fin structures, and sandwiched by the metal gate structure and the gate STI region.

As described in greater detail above, some implementations described herein provide a semiconductor device. The semiconductor device includes a fin structure extending above a substrate. The semiconductor device includes a first fin structure, a second fin structure and a third fin structure extending above a substrate. The semiconductor device includes a first source/drain region and a second source/drain region, respectively disposed on the first and second fin structures. The semiconductor device includes a first ILD layer over the first and second fin structures. The semiconductor device includes a second portion of a second ILD layer, where a first portion of the first ILD layer is between a second portion of the second ILD layer and the third fin structure that is between the first source/drain region and the second source/drain region, and where the first portion is directly on the third fin structure. The semiconductor device includes a metal gate structure on the second portion of the second ILD layer.

As described in greater detail above, some implementations described herein provide a method. The method includes forming a first fin structure in a PMOS region of a semiconductor device. The method includes forming a second fin structure in an NMOS region of the semiconductor device. The method includes forming a first plurality of source/drain regions on the first fin structure in the PMOS region. The method includes forming a second plurality of source/drain regions on the second fin structure in the NMOS region. The method includes forming a gate STI region in the first fin structure between the first plurality of source/drain regions in the PMOS region. The method includes forming a first ILD layer on the first fin structure, on the gate STI region, and on the second fin structure. The method includes forming a second ILD layer on the first ILD layer. The method includes forming, in the PMOS region, a first metal gate structure above the gate STI region and in the second ILD layer. The method includes forming, in the NMOS region, a second metal gate structure on the second ILD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a first fin structure and a second fin structure extending above a substrate;
a first source/drain region and a second source/drain region, respectively disposed on the first and second fin structures;
a gate shallow trench isolation (STI) region between the first source/drain region and the second source/drain region;
a metal gate structure disposed over the STI region; and an interlayer dielectric (ILD) layer over the first and second fin structures, and in contact with the metal gate structure and the gate STI region.

2. The semiconductor device of claim 1, wherein the metal gate structure is in direct contact with a gate via of the semiconductor device.

3. The semiconductor device of claim 1, wherein the ILD layer is a first ILD layer of the semiconductor device; and
wherein the metal gate structure is included in a second ILD layer, of the semiconductor device, that is above the first ILD layer.

4. The semiconductor device of claim 3, wherein the metal gate structure comprises:
a gate contact; and
a barrier layer between the second ILD layer and the gate contact.

5. The semiconductor device of claim 4, wherein the barrier layer comprises:
a p-type work function metal.

6. The semiconductor device of claim 1, wherein the gate STI region and a portion of the ILD layer on the gate STI region are configured as a gate oxide region for the semiconductor device.

7. The semiconductor device of claim 6, wherein a ratio between a width of the gate oxide region to a height of the gate oxide region is included in a range of approximately 43:1 to approximately 5:1.

8. The semiconductor device of claim 6, wherein a ratio of a height of the gate oxide region to a height of the metal gate structure is included in a range of approximately 1.17:1 to approximately 2:1.

9. A semiconductor device, comprising:
a first fin structure, a second fin structure and a third fin structure extending above a substrate,
wherein the third fin structure includes a gate shallow trench isolation (STI) region;
a first source/drain region and a second source/drain region, respectively disposed on the first and second fin structures;
a first interlayer dielectric (ILD) layer over the first and second fin structures;
a second ILD layer; and
a metal gate structure in the second ILD layer,
wherein the first ILD layer is in contact with the metal gate structure and the gate STI region.

10. The semiconductor device of claim 9, wherein the metal gate structure is included in a middle end of line region of the semiconductor device.

11. The semiconductor device of claim 9, wherein the metal gate structure comprises:
a gate contact; and
a barrier layer between the second ILD layer and the gate contact.

12. The semiconductor device of claim 9, wherein a portion of the first ILD layer is configured as a gate oxide region for a high-voltage fin field effect transistor (finFET).

13. The semiconductor device of claim 12, wherein a ratio between a width of the gate oxide region to a height of the gate oxide region is included in a range of approximately 43:1 to approximately 5:1.

14. The semiconductor device of claim 9, further comprising:
a source/drain contact in contact with the first source/drain region,
wherein the source/drain contact extends between the first source/drain region and a top surface of the second ILD layer.

15. A semiconductor device, comprising:
a first fin structure and a second fin structure extending above a substrate;
a first source/drain region and a second source/drain region, respectively disposed on the first and second fin structures;
a shallow trench isolation (STI) region between the first source/drain region and the second source/drain region;
a metal gate structure over the STI region;
an interlayer dielectric (ILD) layer over the first and second fin structures, and between the metal gate structure and the STI region;
an additional ILD layer above the ILD layer; and
an etch stop layer above the additional ILD layer and adjacent to the metal gate structure.

16. The semiconductor device of claim 15, wherein the STI region comprises a high-voltage STI region.

17. The semiconductor device of claim 16, further comprising:
a plurality of high-voltage STI regions, comprising the high-voltage STI region, between the first source/drain region and the second source/drain region.

18. The semiconductor device of claim 15, further comprising:
a gate oxide region, comprising at least a portion of the ILD layer, below the metal gate structure.

19. The semiconductor device of claim 15, further comprising:
a first source/drain contact above the first source/drain region and coupled with the first source/drain region; and
a second source/drain contact above the second source/drain region and coupled with the second source/drain region.

* * * * *